US009711610B2

(12) United States Patent
Yamazaki et al.

(10) Patent No.: US 9,711,610 B2
(45) Date of Patent: Jul. 18, 2017

(54) SEMICONDUCTOR DEVICE HAVING OXIDE SEMICONDUCTOR LAYER

(71) Applicant: Semiconductor Energy Laboratory Co., Ltd., Atsugi-shi, Kanagawa-ken (JP)

(72) Inventors: Shunpei Yamazaki, Tokyo (JP); Hideomi Suzawa, Kanagawa (JP); Hiroshi Fujiki, Kanagawa (JP); Hiromichi Godo, Kanagawa (JP); Yasumasa Yamane, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/066,018

(22) Filed: Mar. 10, 2016

(65) Prior Publication Data

US 2016/0190273 A1 Jun. 30, 2016

Related U.S. Application Data

(63) Continuation of application No. 14/141,831, filed on Dec. 27, 2013, now Pat. No. 9,293,598.

(30) Foreign Application Priority Data

Dec. 28, 2012 (JP) .................................. 2012-288947

(51) Int. Cl.
*H01L 29/49* (2006.01)
*H01L 29/786* (2006.01)
(Continued)

(52) U.S. Cl.
CPC ...... *H01L 29/4908* (2013.01); *H01L 27/1225* (2013.01); *H01L 29/24* (2013.01); *H01L 29/45* (2013.01); *H01L 29/7869* (2013.01)

(58) Field of Classification Search
CPC ................................................... H01L 29/4908
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Thanh V Pham
(74) *Attorney, Agent, or Firm* — Fish & Richardson P.C.

(57) ABSTRACT

The reliability of a semiconductor device is increased by suppression of a variation in electric characteristics of a transistor as much as possible. As a cause of a variation in electric characteristics of a transistor including an oxide semiconductor, the concentration of hydrogen in the oxide semiconductor, the density of oxygen vacancies in the oxide semiconductor, or the like can be given. A source electrode and a drain electrode are formed using a conductive material which is easily bonded to oxygen. A channel formation region is formed using an oxide layer formed by a sputtering method or the like under an atmosphere containing oxygen. Thus, the concentration of hydrogen in a stack, in particular, the concentration of hydrogen in a channel formation region can be reduced.

9 Claims, 45 Drawing Sheets

(51) Int. Cl.
*H01L 29/45* (2006.01)
*H01L 27/12* (2006.01)
*H01L 29/24* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,441,010 B2 | 5/2013 | Ichijo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140648 A1* | 6/2009 | Tohyama .......... H01L 27/3246 313/505 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224878 A1 | 9/2010 | Kimura |
| 2011/0079777 A1 | 4/2011 | Akimoto |
| 2012/0001168 A1 | 1/2012 | Ichijo et al. |
| 2012/0058598 A1 | 3/2012 | Yamazaki |
| 2013/0140554 A1 | 6/2013 | Yamazaki et al. |
| 2013/0161605 A1 | 6/2013 | Sasagawa et al. |
| 2013/0161621 A1 | 6/2013 | Isobe et al. |
| 2013/0187151 A1 | 7/2013 | Yamazaki |
| 2013/0187161 A1 | 7/2013 | Yamazaki |
| 2014/0084287 A1 | 3/2014 | Yamazaki |
| 2014/0103346 A1 | 4/2014 | Yamazaki |
| 2014/0106504 A1 | 4/2014 | Yamazaki et al. |
| 2014/0121787 A1 | 5/2014 | Yamazaki et al. |
| 2014/0138675 A1 | 5/2014 | Yamazaki |
| 2014/0339538 A1 | 11/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-097032 A | 5/2011 |
| JP | 2012-146946 A | 8/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-cryst. Solids (Journal of Non-crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nanostructured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-optical Switching in Polymer-Stabilized Liquid Cryatallin Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", NIRIM Newsletter, Mar. 1, 1995, vol. 150, pp. 1-4.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

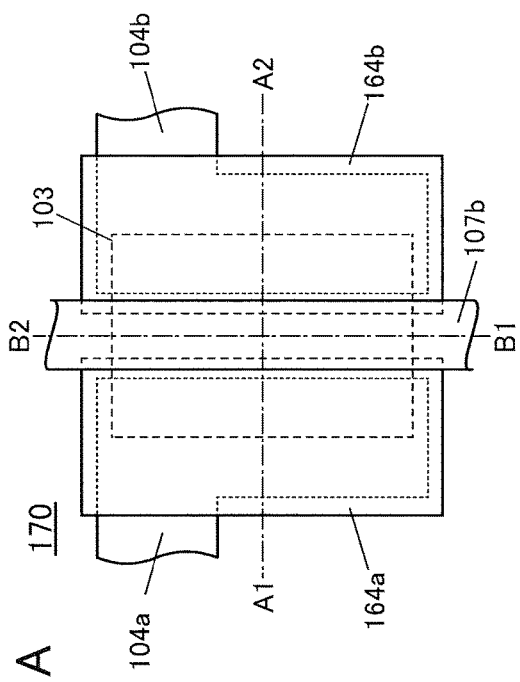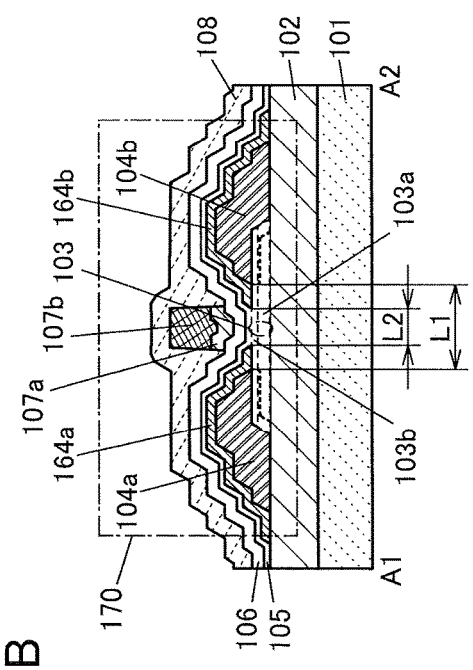

Initial Id-Vg characteristics
Vds=0.1, 1V point① the surface side of the film point② the center of the film point③ the base side of the film point④ the whole film

SEMICONDUCTOR DEVICE HAVING OXIDE SEMICONDUCTOR LAYER

CROSS-REFERENCE TO RELATED APPLICATIONS

This application is a divisional of U.S. application Ser. No. 14/141,831, filed Dec. 27, 2013, now allowed, which claims the benefit of a foreign priority application filed in Japan as Serial No. 2012-288947 on Dec. 28, 2012, both of which are incorporated by reference.

BACKGROUND OF THE INVENTION

1. Field of the Invention

The present invention relates to a product (including a machine, a manufacture, and a composition of matter) and a process (including a simple process and a production process). In particular, one embodiment of the present invention relates to a semiconductor device, a display device, a light-emitting device, a power storage device, a driving method thereof, or a manufacturing method thereof. In particular, one embodiment of the present invention relates to a semiconductor device, a display device, or a light-emitting device, which includes an oxide semiconductor.

2. Description of the Related Art

Oxide semiconductors have recently attracted attention as materials for next-generation thin film transistors. Examples of oxide semiconductors include tungsten oxide, tin oxide, indium oxide, zinc oxide, and the like, and there are known thin film transistors in which such oxide semiconductors are used in channel formation regions.

As oxide semiconductors, not only single-component oxides but also multi-component oxides are known. In particular, an In—Ga—Zn—O-based oxide material (hereinafter also referred to as IGZO) has been actively studied.

Patent Document 1 discloses a technique by which a conductive film including a metal, a metal compound, or an alloy that can absorb or adsorb moisture, a hydroxy group, or hydrogen is formed to overlap with an oxide semiconductor film with an insulating film provided therebetween.

Patent Document 2 discloses a technique by which hydrogen in a film and at an interface between films is removed in a transistor using an oxide semiconductor.

REFERENCE

Patent Document

[Patent Document 1] Japanese Published Patent Application No. 2011-097032
[Patent Document 2] Japanese Published Patent Application No. 2012-146946

SUMMARY OF THE INVENTION

An object of one embodiment of the present invention is to provide a novel semiconductor device or the like.

A variation in electric characteristics of a transistor using an oxide semiconductor might occur due to heat, a stress of a bias or the like, irradiation with light, or the like. In the case where a variation in the electric characteristics of a transistor is large, malfunctions of a semiconductor device including the transistor might occur. Further, in the case where there is a variation in the electric characteristics among transistors each including an oxide semiconductor, the yield in manufacturing might be reduced.

In view of the foregoing, another object is to increase the reliability of a semiconductor device or the like by suppression of a variation in electric characteristics among transistors as much as possible.

Further, another object is to reduce a variation in electric characteristics among transistors or the like each including an oxide semiconductor.

In addition, another object is to provide a transistor or the like which includes an oxide semiconductor and has excellent electric characteristics.

Another object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like using a transparent semiconductor layer.

Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

As a cause of a variation in electric characteristics among transistors each including an oxide semiconductor, the concentration of hydrogen in the oxide semiconductor, the density of oxygen vacancies in the oxide semiconductor, or the like can be given.

In order to prevent a variation in electric characteristics among transistors, in particular, it is important to control the concentration of hydrogen in an oxide semiconductor layer and the number of oxygen vacancies per unit volume in the oxide semiconductor layer in the case of using an oxide semiconductor as a thin film.

An embodiment of the present invention is a semiconductor device which includes an oxide semiconductor layer including a channel formation region, a source electrode and a drain electrode over and in contact with the oxide semiconductor layer, an insulating layer over the oxide semiconductor layer, and a gate electrode which is provided over the insulating layer and reduces the concentration of hydrogen in the channel formation region. A region of the oxide semiconductor layer, which is in contact with the source electrode or the drain electrode, has lower resistance than the channel formation region. The source electrode and the drain electrode are each stacked layers, and one of the stacked layers is a material layer (a layer containing a hydrogen absorbing alloy) which reduces the concentration of hydrogen in the channel formation region. With such a structure, the concentration of hydrogen in the channel formation region is made smaller than that in a region of the oxide semiconductor layer which overlaps with the source electrode or the drain electrode.

Further, the number of oxygen vacancies in the channel formation region is made smaller than that in the region of the oxide semiconductor layer which overlaps with the source electrode or the drain electrode.

In addition, as another cause of a variation in the electric characteristics, the state of an interface between the oxide semiconductor layer and a material layer adjacent to the oxide semiconductor layer can be given. In order to reduce a variation in the electric characteristics due to change over time, it is preferable that an insulating layer for blocking hydrogen which might diffuse from the outside of the oxide semiconductor layer be provided around the oxide semiconductor layer. Further, it is preferable that an insulating layer for preventing release of oxygen from the oxide semiconductor layer be provided around the oxide semiconductor layer so as to prevent an increase in the number of oxygen vacancies due to release of oxygen from the oxide semiconductor layer.

One embodiment of a structure of the invention disclosed in this specification is a semiconductor device including an oxide semiconductor layer; a source electrode and a drain electrode over and in contact with the oxide semiconductor layer; an insulating layer over the oxide semiconductor layer; and a gate electrode over the insulating layer. The oxide semiconductor layer includes a first region overlapping with the gate electrode, a second region overlapping with the source electrode, and a third region overlapping with the drain electrode. Part of the second region and part of the third region have more oxygen vacancies than part of the first region.

One feature of the above structure is that the part of the first region has a lower concentration of hydrogen than the part of the second region and the part of the third region.

Another embodiment of a structure of the invention is a semiconductor device including an oxide semiconductor layer; a source electrode and a drain electrode over and in contact with the oxide semiconductor layer; an insulating layer over the oxide semiconductor layer; and a gate electrode over the insulating layer. The oxide semiconductor layer includes a first region overlapping with the gate electrode, a second region overlapping with the source electrode, and a third region overlapping with the drain electrode. Part of the first region has a lower concentration of hydrogen than part of the second region and part of the third region.

One feature of the above structure is that the first region includes a channel formation region.

Another embodiment of a structure of the invention is a semiconductor device including an oxide semiconductor layer; a source electrode and a drain electrode over and in contact with the oxide semiconductor layer; an insulating layer over the oxide semiconductor layer; and a gate electrode over the insulating layer. The oxide semiconductor layer includes a first region overlapping with the gate electrode, a second region overlapping with the source electrode, and a third region overlapping with the drain electrode. The concentration of hydrogen in the first region is lower than $5 \times 10^{17}$ atoms/cm$^3$. Part of the second region and part of the third region have a higher concentration of hydrogen than part of the first region.

One feature of each of the above structures is that the gate electrode is stacked layers, and one of the stacked layers includes one or more alloys selected from an alloy of titanium and indium, an alloy of titanium and gallium, an alloy of titanium and zinc, and an alloy of titanium and cobalt.

Another feature of each of the above structures is that the source electrode and the drain electrode are each stacked layers, and one of the stacked layers includes one or more alloys selected from an alloy of titanium and indium, an alloy of titanium and gallium, an alloy of titanium and zinc, and an alloy of titanium and cobalt.

An oxide semiconductor that can be used for the oxide semiconductor layer preferably includes a layer represented by an In-M-Zn-based oxide containing at least indium (In), zinc (Zn), and M (M is a metal such as Al, Ga, Ge, Y, Zr, Sn, La, Ce, or Hf). Alternatively, the oxide semiconductor preferably contains both In and Zn. In order to reduce a variation in electric characteristics among the transistors each including the oxide semiconductor, the oxide semiconductor preferably contains a stabilizer in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide. Note that an In—Ga—Zn oxide refers to, for example, an oxide containing In, Ga, and Zn as its main components and there is no particular limitation on the ratio of In to Ga and Zn. The In—Ga—Zn oxide may contain a metal element other than the In, Ga, and Zn. Further, in this specification and the like, a film formed using an In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used. A structure of an oxide semiconductor film is described below.

An oxide semiconductor film is roughly classified into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown. For example, spots are shown by performing nanobeam electron diffraction with an electron beam having a probe diameter larger than or equal to 1 nm and smaller than or equal to 30 nm on a top surface of the CAAC-OS film.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electric characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electric characteristics in some cases.

With use of the CAAC-OS film in a transistor, a variation in the electric characteristics of the transistor due to irradiation with visible light or ultraviolet light is small.

An oxide semiconductor may include a single crystal, for example. Note that an oxide semiconductor including a single crystal is referred to as a single-crystal oxide semiconductor. The single-crystal oxide semiconductor, for example, has a low impurity concentration and a low density of defect states (few oxygen vacancies), and thus can have a low carrier density. Accordingly, in some cases, a transistor including a single-crystal oxide semiconductor in a channel formation region is rarely normally-on. Further, a single-crystal oxide semiconductor has a low density of defect states and thus has low density of trap states in some cases. Accordingly, a transistor including a single-crystal oxide semiconductor in a channel formation region has a small variation in the electric characteristics, and thus the transistor can have high reliability.

By controlling the concentration of hydrogen and the number of oxygen vacancies per unit volume in part of the oxide semiconductor layer, the reliability of the semiconductor device can be improved.

BRIEF DESCRIPTION OF THE DRAWINGS

In the accompanying drawings:

FIGS. 1A to 1C are a top view and cross-sectional views illustrating a semiconductor device of one embodiment of the present invention;

DETAILED DESCRIPTION OF THE INVENTION

Figure 2:
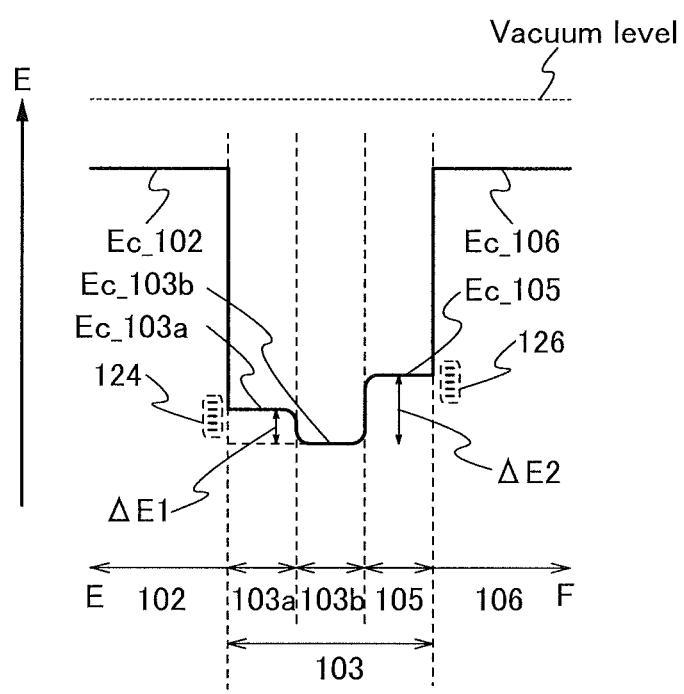
FIG. 2 shows the band structure of a transistor.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

The ordinal numbers such as "first" and "second" in this specification and the like are used for convenience in order to avoid confusion of the components, and do not indicate the order of something, such as the order of steps or the stacking order of layers.

A voltage usually refers to a potential difference between a given potential and a reference potential (e.g., a source potential or a ground potential (GND)). A voltage can be referred to as a potential and vice versa.

Note that in this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used in this specification, there is a case in which no physical connection is made and a wiring is just extended in an actual circuit.

Further, functions of the source and the drain might be switched depending on operation conditions, e.g., when a transistor having a different polarity is employed or a direction of current flow is changed in circuit operation. Therefore, it is difficult to define which is the source (or the drain). Thus, the terms "source" and "drain" can be switched in this specification.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Embodiment 1

In this embodiment, a transistor 170 which is an example of one embodiment of a semiconductor device is described.

FIGS. 1A to 1C illustrate the transistor 170 which is one embodiment of a semiconductor device. The transistor 170 is a top-gate transistor. FIG. 1A is a top view of the transistor 170. FIG. 1B is a cross-sectional view of a portion denoted by a dashed dotted line A1-A2 in FIG. 1A and FIG. 1C is a cross-sectional view of a portion denoted by a dashed dotted line B1-B2 in FIG. 1A. Note that in FIG. 1A, some components are omitted.

The transistor 170 is formed over an insulating layer 102. The insulating layer 102 is formed over a substrate 101. The transistor 170 includes a stack 103 which is formed over the insulating layer 102 and includes a source electrode 104a and a drain electrode 104b which are formed over the stack 103. A source electrode 164a is formed over the source electrode 104a, and a drain electrode 164b is formed over the drain electrode 104b.

An oxide layer 105 is formed over the source electrode 104a, the drain electrode 104b, the source electrode 164a, the drain electrode 164b, and the stack 103 by a sputtering method. An insulating layer 106 is formed over the oxide layer 105.

The oxide layer 105 can be formed using an In—Ga—Zn oxide whose atomic ratio of In to Ga and Zn is 1:3:2, an In—Ga—Zn oxide whose atomic ratio of In to Ga and Zn is 1:3:4, an In—Ga—Zn oxide whose atomic ratio of In to Ga and Zn is 1:6:2, an In—Ga—Zn oxide whose atomic ratio of In to Ga and Zn is 1:6:4, an In—Ga—Zn oxide whose atomic ratio of In to Ga and Zn is 1:6:10, an In—Ga—Zn oxide whose atomic ratio of In to Ga and Zn is 1:9:6, or an oxide having a composition which is in the neighborhood of any of the above atomic ratios. In order to reduce the concentration of hydrogen in the stack 103, in particular, the concentration of hydrogen in a channel formation region, it is preferable to form the oxide layer 105 by a sputtering method or the like under an atmosphere containing oxygen.

For the insulating layer 106, silicon oxide, gallium oxide, aluminum oxide, silicon nitride, silicon oxynitride, silicon nitride oxide, hafnium oxide, tantalum oxide, or the like can be used. There is no particular limitation on a formation method of the insulating layer 106, and a PCVD method or a sputtering method can be used. Note that hafnium oxide is deposited with an MOCVD apparatus. A silicon oxide film formed by a sputtering method is preferably used because it contains much oxygen. A stacked structure of the above film may also be employed.

A gate electrode 107a and a gate electrode 107b are formed over the insulating layer 106. The gate electrode 107a and the gate electrode 107b overlap with the stack 103 with the insulating layer 106 and the oxide layer 105 provided therebetween.

The gate electrode 107a can be formed using an alloy containing one metal element among elements included in the stack 103, such as an alloy of indium and titanium, an alloy of zinc and titanium, or an alloy of gallium and titanium. Further, the gate electrode 107a can be formed using a conductive material (e.g. a hydrogen absorbing alloy) which extracts hydrogen from the stack 103. For example, titanium, titanium nitride, an alloy of cobalt and titanium, an alloy of manganese and titanium, an alloy of iron and titanium, or the like is used. When a conductive material which extracts hydrogen from the stack 103 is used for the gate electrode 107a, the concentration of hydrogen in a region of the stack 103 which overlaps with the gate electrode 107a, that is, a channel formation region, can be reduced.

The gate electrode 107b is formed using a conductive material different from that for the gate electrode 107a. Further, although a stacked-layer structure including the gate electrode 107a and the gate electrode 107b is described as an example in this embodiment, there is no limitation on a structure of the gate electrode, and the gate electrode may have a single-layer structure or a stacked-layer structure including three or more layers.

An insulating layer 108 is formed over the gate electrode 107a and the gate electrode 107b. As the insulating layer 108, an insulating layer formed of a silicon nitride, silicon oxynitride, silicon nitride oxide, or the like can be used. In particular, a silicon nitride film or an aluminum oxide film formed by a sputtering method is preferably used because it contains a material which prevents diffusion of an impurity from the outside, such as water, an alkali metal, or an alkaline earth metal, into the stack 103. For the insulating layer 108, silicon oxide, gallium oxide, aluminum oxide, silicon oxynitride, silicon nitride oxide, hafnium oxide, tantalum oxide, or the like can be used. A stacked structure of the above film may also be employed. The insulating layer 108 covers the gate electrode 107a, the gate electrode 107b, the insulating layer 106, the oxide layer 105, the source electrode 104a, the drain electrode 104b, the source electrode 164a, the drain electrode 164b, and the stack 103.

For the source electrode 104a and the drain electrode 104b, a conductive material which is easily bonded to oxygen can be used. For example, tungsten, titanium, aluminum, copper, molybdenum, chromium, or tantalum, an alloy thereof, or the like can be used. When such a conductive material is in contact with the stack 103, the concentration of oxygen is reduced in part of the stack 103, and thus an n-type region (a low-resistance region) is formed. Thus, the n-type region can function as a source or a drain of the transistor 170. Further, bonding to hydrogen occurs easily in the n-type region with the reduced concentration of oxygen, and hydrogen in the other region (the channel formation region or the like) moves to the n-type region; thus, the concentration of hydrogen in the n-type region becomes higher than that in the other region (the channel formation region or the like). In other words, a region having a gradient hydrogen concentration is formed in the stack 103, which leads to reduction in the concentration of hydrogen in the other region (the channel formation region or the like).

The materials used for the source electrode 164a and the drain electrode 164b are different from those used for the source electrode 104a and the drain electrode 104b in the easiness of being bonded to oxygen. For example, when a tungsten film is used as the source electrode 104a and the drain electrode 104b and a titanium film is used as the source electrode 164a and the drain electrode 164b, the thickness of the n-type region can differ between the region which is in contact with the source electrode 104a and the drain electrode 104b and the region which is in contact with the source electrode 164a and the drain electrode 164b. The source electrode 164a and the drain electrode 164b can be formed using an alloy containing one metal element among elements included in the stack 103, such as an alloy of indium and titanium, an alloy of zinc and titanium, or an alloy of gallium and titanium. Further, the source electrode 164a and the drain electrode 164b can be formed using a conductive material which extracts hydrogen from the stack 103. For example, titanium, titanium nitride, an alloy of cobalt and titanium, an alloy of manganese and titanium, an alloy of iron and titanium, or the like is used.

Note that the concentration of hydrogen or the number of oxygen vacancies in the stack 103 may be fixed or increased as long as the transistor 170 functions as a switching element, and the concentration of hydrogen or the number of oxygen vacancies in the stack 103 may be fixed or increased as long as fluctuations of electric characteristics of the transistor due to change over time can be reduced.

Although the variety of films such as the metal film, the semiconductor film, and the inorganic insulating film which are described above can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ gas may be used. Furthermore, a $Zn(CH_3)_2$ gas may be used.

Here, an experimental result showing transfer of oxygen from an oxide semiconductor film to a metal film by heating in Sample 1 in which the oxide semiconductor film is in contact with the metal film is described below.

First, a structure of Sample 1 and a fabrication method thereof are described below.

In the structure of Sample 1, a 100-nm-thick silicon oxide film including chlorine is provided over a silicon wafer, a 100-nm-thick In—Ga—Zn-based oxide film is provided as an oxide semiconductor film over the silicon oxide film, and a 100-nm-thick tungsten film is provided as a metal film over the oxide semiconductor film.

Next, a fabrication method of Sample 1 is described.

The silicon wafer was heated at 950° C. in an oxygen atmosphere containing hydrogen chloride, so that a 100-nm-thick silicon oxide film including chlorine was formed over a surface of the substrate.

Next, an In—Ga—Zn-based oxide film was formed as an oxide semiconductor film by a sputtering method. Here, an In—Ga—Zn-based oxide film (represented by In—Ga—Zn—O (111)) was formed under the following conditions: a sputtering target whose atomic ratio of In to Ga and Zn was 1:1:1 was used; an $^{18}O_2$ gas at a flow rate of 15 sccm and argon at a flow rate of 30 sccm were introduced as a sputtering gas into a chamber having a pressure of 0.4 Pa; the substrate temperature was 300° C.; and the supplied electric power was 0.5 kW.

Next, a tungsten film was formed as a metal film by a sputtering method. Here, a tungsten film was formed under the following conditions: a tungsten target was used; argon at a flow rate of 80 sccm was introduced as a sputtering gas into a chamber having a pressure of 0.8 Pa; the substrate temperature was 130° C.; and the supplied electric power was 1 kW.

Next, heat treatment was performed for an hour under a nitrogen atmosphere. The heating temperature was set at 300° C., 350° C., 400° C., and 450° C. for the respective samples. Through the above process, Samples 1 were fabricated.

Figure 7:
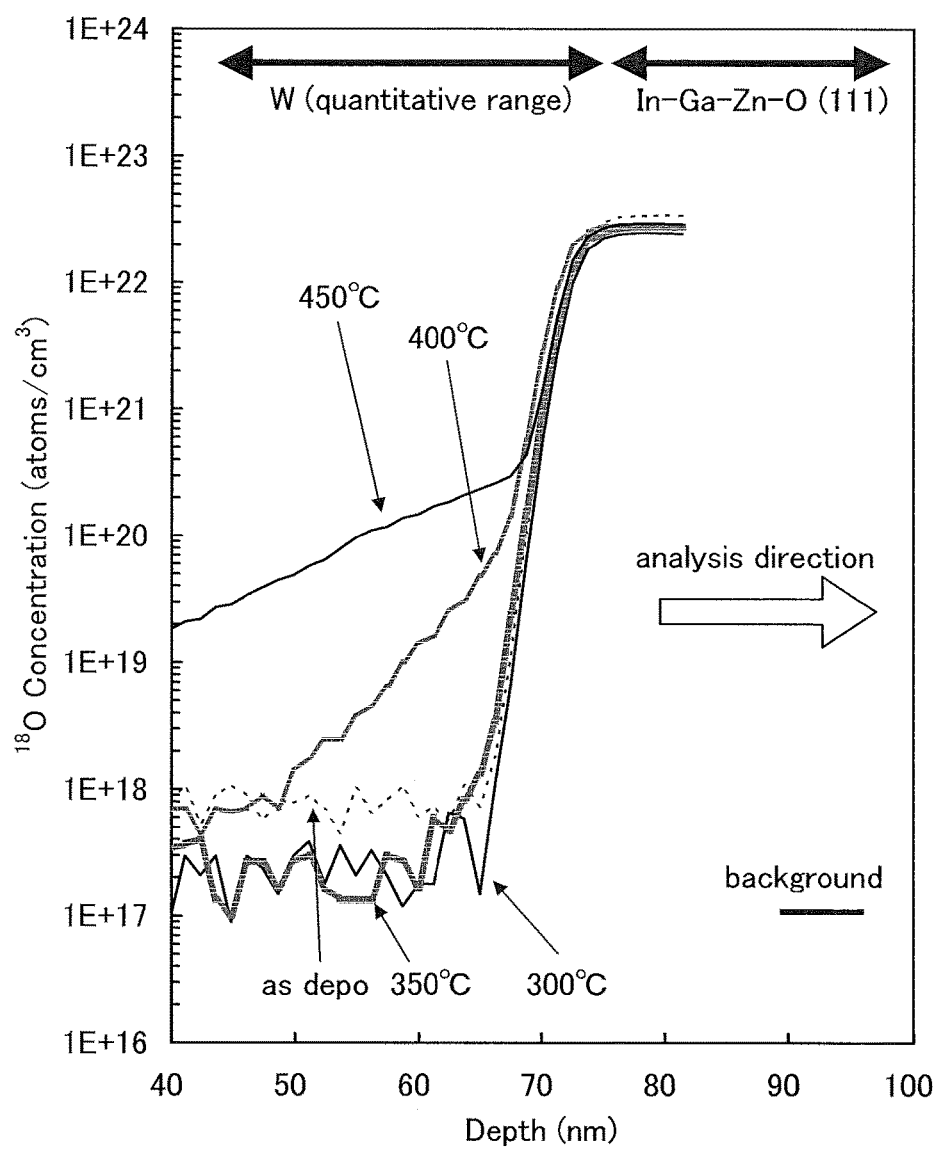
FIG. 7 shows the concentration distribution of $^{18}O$ in Sample 1.

Next, SIMS (Secondary Ion Mass Spectrometry) analysis was performed on each of Samples 1, and the concentration distribution of $^{18}O$ in the tungsten film was measured. Note that the SIMS analysis was performed from a surface of the tungsten film to the In—Ga—Zn-based oxide film. The concentration distributions of $^{18}O$ in Samples 1 which were heated at 300° C., 350° C., 400° C., and 450° C. are shown in FIG. 7. Note that for comparison, the concentration distribution of $^{18}O$ in a sample which was not subjected to heat treatment (represented by as-depo) is also shown in FIG. 7. The horizontal axis indicates the depth from the surface of Sample 1 and the vertical axis indicates the concentration of $^{18}O$.

From FIG. 7, it is found that when Sample 1 was heated at higher than or equal to 400° C., $^{18}O$ was transferred to the metal film.

Next, Sample 2 and Sample 3 were fabricated by changing the composition of the metal elements contained in the oxide semiconductor film of Sample 1. The concentration distributions of $^{18}O$ in Sample 1, Sample 2, and Sample 3 are shown in FIG. 8.

The oxide semiconductor film in Sample 2 was an In—Ga—Zn-based oxide film (represented by Ln-Ga—Zn—O (132)) formed using a sputtering target whose atomic ratio of In to Ga and Zn was 1:3:2, unlike In—Ga—Zn—O (111). The oxide semiconductor film in Sample 3 was an In—Ga—Zn-based oxide film (represented by In—Ga—Zn—O (312)) formed using a sputtering target whose atomic ratio of In to Ga and Zn was 3:1:2, unlike In—Ga—Zn—O (111). In each of Samples 1 to 3, the deposition temperature was set at 200° C.

Each of Samples 1 to 3 was heated at 450° C. under a nitrogen atmosphere in the same manner as that of Sample 1, and then subjected to SIMS analysis, and the concentration distribution of $^{18}O$ in the tungsten film was measured. The concentration distributions of $^{18}O$ of Samples 1 to 3 are shown in FIG. 8.

Figure 8:
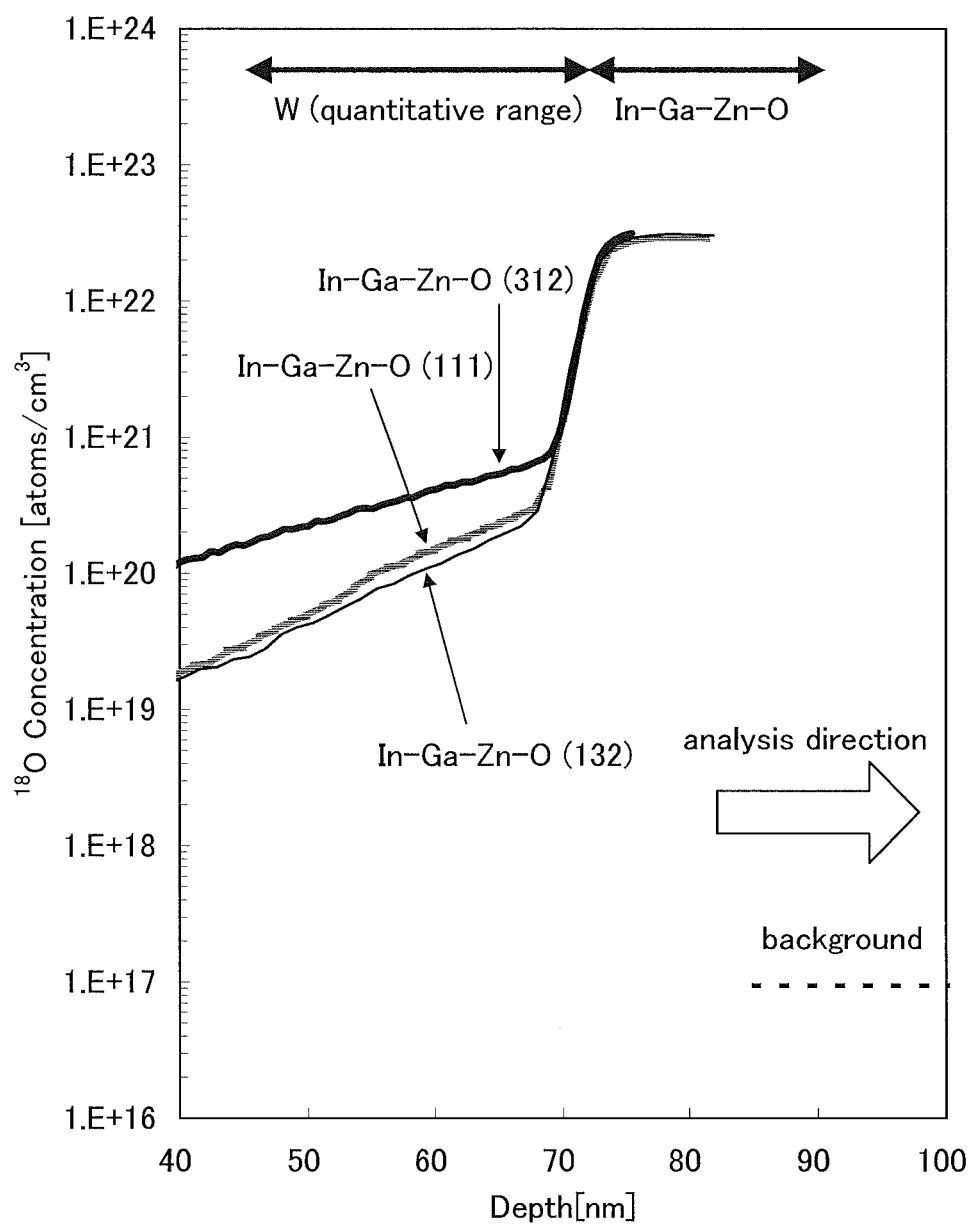
FIG. 8 shows the concentration distributions of $^{18}O$ in Samples 1, 2, and 3.

As shown in FIG. 8, more $^{18}O$ is transferred to the tungsten film in the In—Ga—Zn—O (312) than in the In—Ga—Zn—O (111) and the In—Ga—Zn—O (132). This shows that oxygen in the oxide semiconductor film is more easily transferred to the tungsten film as the concentration of In in the oxide semiconductor film is higher.

Further, an experiment was performed as follows: a metal film provided over an oxide semiconductor film was subjected to heat treatment, the metal film was removed, and the etching depth from the surface of the oxide semiconductor film and the sheet resistance of the oxide semiconductor film were measured. Description is made of the experiment and a result thereof below.

First, fabrication methods of Sample 4 and Sample 5 are described.

In each of the structures of Samples 4 and 5, a 50-nm-thick In—Ga—Zn-based oxide film was formed as an oxide semiconductor film over a glass substrate, and a 100-nm-thick metal film was formed over the In—Ga—Zn-based oxide film.

Here, an In—Ga—Zn-based oxide film (represented by In—Ga—Zn—O (111)) was formed under the following conditions: a sputtering target whose atomic ratio of In to Ga and Zn was 1:1:1 was used; an oxygen gas at a flow rate of 15 sccm and argon at a flow rate of 30 sccm were introduced as a sputtering gas into a chamber having a pressure of 0.4 Pa; the substrate temperature was 300° C.; and the supplied electric power was 0.5 kW. Next, heat treatment was performed at 450° C. under a nitrogen atmosphere for an hour, and then another heat treatment was performed at 450° C. under an oxygen atmosphere for an hour.

As the metal film, a tungsten film was formed (Sample 4). Further, as the metal film, a titanium nitride film was formed (Sample 5).

Here, in Sample 4 in which a tungsten film was formed as a metal film, the tungsten film was formed under the following conditions: a tungsten target was used; argon at a flow rate of 80 sccm and heated argon at a flow rate of 10 sccm were introduced as a sputtering gas into a chamber having a pressure of 0.8 Pa; the substrate temperature was 130° C.; and the supplied electric power was 1 kW.

In Sample 5 in which a titanium nitride film was formed as a metal film, the titanium nitride film was formed using a titanium target under the following conditions: nitrogen at a flow rate of 50 sccm was introduced as a sputtering gas into a chamber having a pressure of 0.2 Pa; the substrate temperature was 25° C.; and the supplied electric power was 12 kW.

Note that for comparison, a sample (none) in which a metal film was not provided over the oxide semiconductor film was formed.

Next, each sample was subjected to heat treatment at 400° C. under a nitrogen atmosphere for an hour. Through the above process, Samples 4 and 5 were fabricated.

Next, the metal film in each of Samples 4 and 5 in which the metal film is formed over the oxide semiconductor film was removed by a dry etching method, and the thickness of the oxide semiconductor film and the sheet resistance thereof in each of Samples 4 and 5 were measured. Note that the thickness was measured with a spectroscopic ellipsometry. The sheet resistance was measured by a four-probe method.

Next, the oxide semiconductor film is partly removed from a surface of the oxide semiconductor film by a wet etching method, and the thickness and the sheet resistance of the remaining oxide semiconductor film were measured. Further, the etching process and measurement of the thickness and the sheet resistance were repeated.

In addition, Sample 6 and Sample 7 in each of which a 300-nm-thick silicon oxide film was formed between the glass substrate and the oxide semiconductor film in Sample 4 and Sample 5 were fabricated.

In each of Samples 6 and 7, the silicon oxide film was formed using a silicon oxide target under the following conditions: oxygen at a flow rate of 50 sccm was introduced as a sputtering gas into a chamber having a pressure of 0.4 Pa; the substrate temperature was 100° C.; and the supplied electric power was 1.5 kW.

Further, the metal film in each of Samples 6 and 7 in which the metal film is formed over the oxide semiconductor film was removed by a dry etching method, and the thickness of the oxide semiconductor film and the sheet resistance thereof in each of Samples 6 and 7 were measured.

Next, the oxide semiconductor film is partly removed from a surface of the oxide semiconductor film by a wet etching method, and the thickness and the sheet resistance of the remaining oxide semiconductor film were measured. Further, the etching process and measurement of the thickness and the sheet resistance were repeated.

Figure 9A:
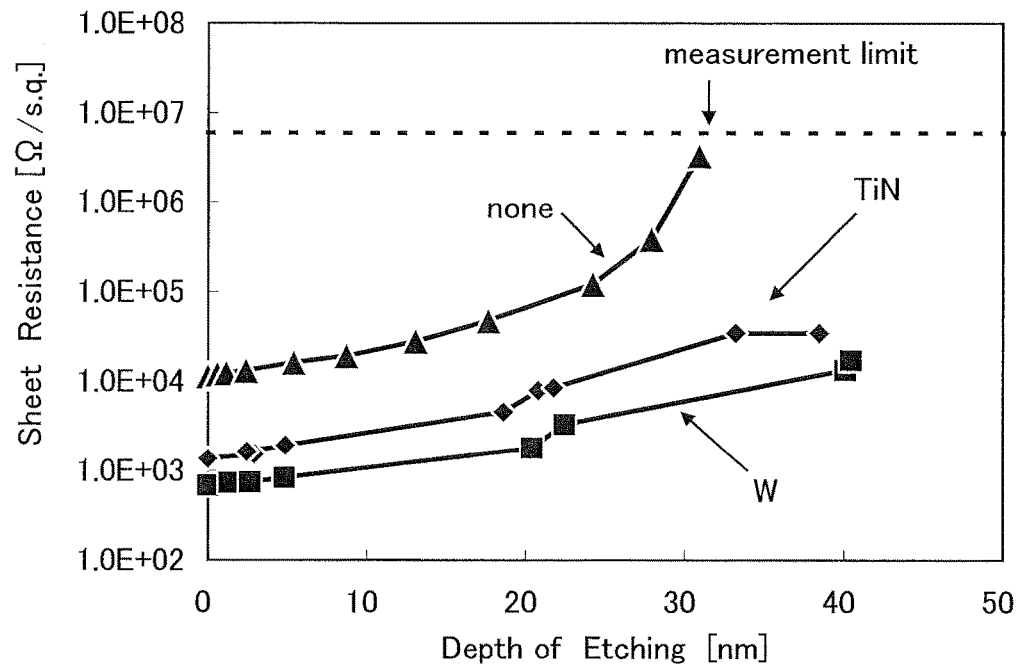
FIG. 9A shows a relation between the depth of etching and the sheet resistance of the oxide semiconductor film in each of Samples 4 and 5.
Figure 9B:
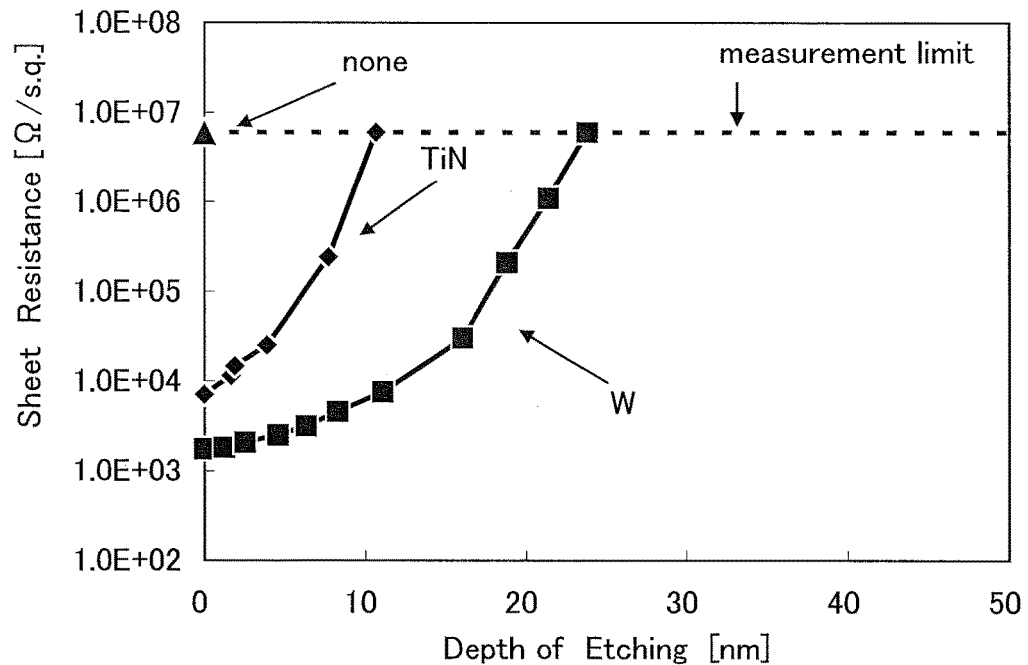
FIG. 9B shows a relation between the depth of etching and the sheet resistance of the oxide semiconductor film in each of Samples 6 and 7.

FIGS. 9A and 9B show relations between the depths of etching and the sheet resistances of the oxide semiconductor films in Samples 4 and 5 and Samples 6 and 7, respectively.

It is found that the sheet resistance of the oxide semiconductor film of Samples 4 and 5 is reduced by forming the metal film over the oxide semiconductor film and performing heat treatment. It is also found that formation of a tungsten film as a metal film can reduce the sheet resistance of the oxide semiconductor film more than formation of a titanium nitride film as a metal film.

It is found that although the sheet resistance of the sample with the silicon oxide film and without the metal film was at unmeasurable level even when heat treatment was performed (the sheet resistance was greater than or equal to 6 MΩ/sq.), the sheet resistances of Samples 6 and 7 in each of which a metal film was formed over the oxide semiconductor film and each of which was subjected to heat treatment are reduced. Further, Samples 6 and 7 have smaller regions with low sheet resistance than Samples 4 and 5 in a depth direction from the surface. This is probably because oxygen was transferred from the silicon oxide film in contact with the oxide semiconductor film to the oxide semiconductor film by heat treatment, and thus oxygen vacancies in the oxide semiconductor film were reduced.

Figure 10A:
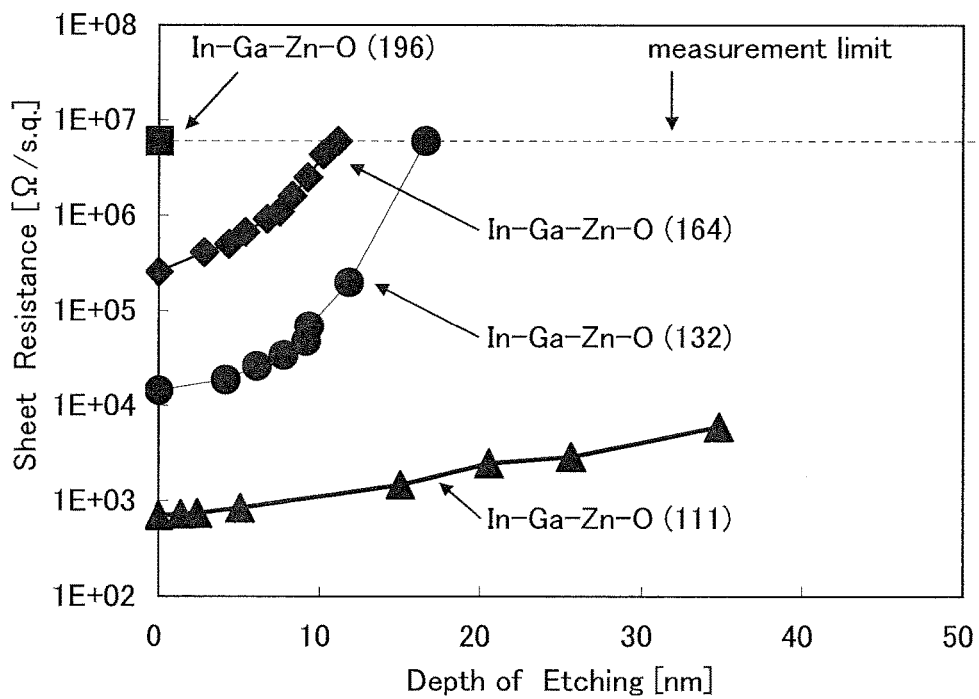
FIG. 10A shows a relation between the depth of etching and the sheet resistance of the oxide semiconductor film in each of Samples 8, 9, and 10.
Figure 10B:
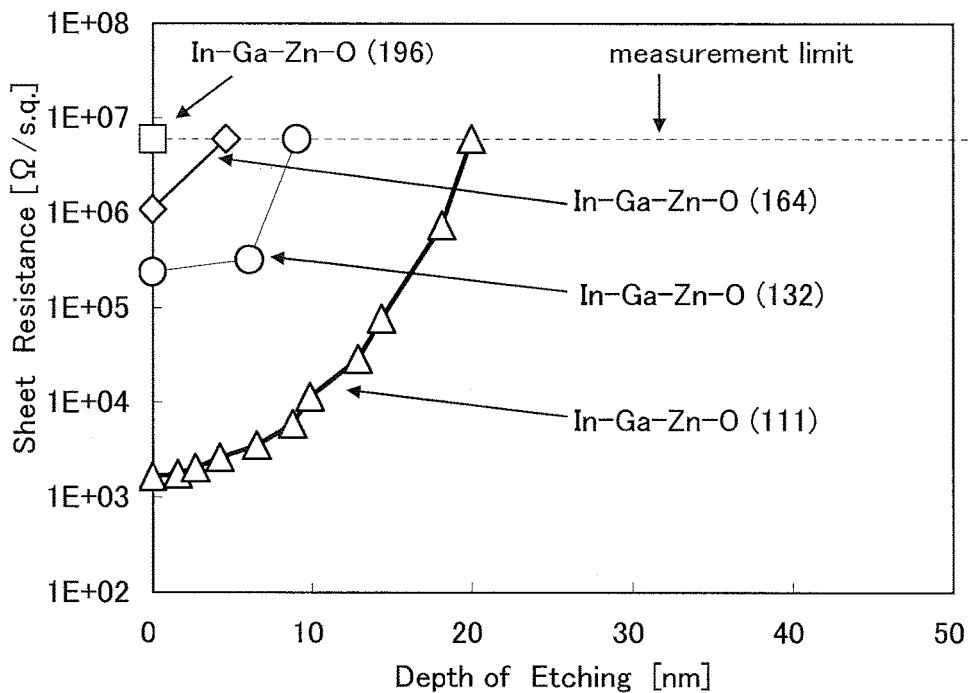
FIG. 10B shows a relation between the depth of etching and the sheet resistance of the oxide semiconductor film in each of Samples 11, 12, and 13.

Next, measurement results of the etching depth from the surface of the oxide semiconductor film and the sheet resistance of the oxide semiconductor film in each of Sample 8, Sample 9, Sample 10, Sample 11, Sample 12, and Sample 13, are shown in FIGS. 10A and 10B. Samples 8 to 13 were fabricated by changing the composition of the metal elements contained in the oxide semiconductor films in Samples 4 and 6.

Sample 8 was fabricated by forming In—Ga—Zn—O (132) instead of the In—Ga—Zn-based oxide film in Sample 4. Sample 9 was fabricated by forming In—Ga—Zn—O (164) instead of the In—Ga—Zn—O (111) in Sample 4. Sample 10 was fabricated by forming In—Ga—Zn—O (196) instead of the In—Ga—Zn—O (111) in Sample 4. In each of Samples 8 to 10, the deposition temperature was set at 200° C.

Sample 11 was fabricated by forming In—Ga—Zn—O (132) instead of the In—Ga—Zn-based oxide film in Sample 6. Sample 12 was fabricated by forming In—Ga—Zn—O (164) instead of the In—Ga—Zn—O (111) in Sample 6. Sample 13 was fabricated by forming In—Ga—Zn—O (196) instead of the In—Ga—Zn—O (111) in Sample 6. In each of Samples 11 to 13, the deposition temperature was set at 200° C.

Next, in each of Samples 8 to 13, the metal film over the oxide semiconductor film was removed by a dry etching method, and the thickness and the sheet resistance of the oxide semiconductor film were measured.

Next, the oxide semiconductor film is partly removed from a surface of the oxide semiconductor film by a wet etching method, and the thickness and the sheet resistance of the remaining oxide semiconductor film were measured. Further, the etching process and measurement of the thickness and the sheet resistance were repeated.

FIGS. 10A and 10B show relations between the depths of etching and the sheet resistances of the oxide semiconductor films in Samples 8, 9, and 10 and Samples 11, 12, and 13, respectively. FIGS. 10A and 10B also show a relation between the depth of etching and the sheet resistance of the oxide semiconductor film in the sample using the In—Ga—Zn—O (111) as a comparative example.

It is found that the sheet resistance is increased as the proportions of Ga and Zn with respect to In become higher in the oxide semiconductor film. It is also found that when In—Ga—Zn—O (196) is formed as an oxide semiconductor film, the sheet resistance is at unmeasurable level (the sheet resistance is greater than or equal to 6 MΩ/sq.) even when heat treatment is performed.

Further, Samples 11, 12, and 13 have smaller regions with low sheet resistance than Samples 8, 9, and 10 in a depth direction from the surface of the oxide semiconductor film.

From the above, it is found that the sheet resistance of the oxide semiconductor film is reduced by forming the metal film over the oxide semiconductor film and performing heat treatment. It is also found that the sheet resistance is increased as the proportions of Ga and Zn with respect to In becomes higher in the oxide semiconductor film.

In addition, another experiment described below was carried out.

In Sample 4 described above, the metal film was removed by a dry etching method, and then oxidation treatment was performed on the oxide semiconductor film. Measurement results of the etching depth from the surface of the oxide semiconductor film and the sheet resistance of the oxide semiconductor film are described with reference to FIGS. 11A to 11C.

Sample 14 was fabricated by removing the metal film over the oxide semiconductor film in Sample 4 by a dry etching method.

Sample 15 was fabricated by performing heat treatment on Sample 14 under an oxygen atmosphere. Here, the heat treatment was performed at 400° C. under an oxygen atmosphere for an hour.

In addition, Sample 16 was fabricated by exposing the oxide semiconductor film of Sample 14 to oxygen plasma. Here, the oxide semiconductor film was exposed to oxygen plasma generated in the following manner: in a chamber having a pressure of 200 Pa into which dinitrogen monoxide at a flow rate of 900 sccm was introduced, a high-frequency power of 150 W was supplied to an upper electrode with a 60 MHz high-frequency power supply. Note that the substrate temperature was set at 350° C.

Next, the oxide semiconductor film is partly removed from a surface of the oxide semiconductor film by a wet etching method, and the thickness and the sheet resistance of the remaining oxide semiconductor film were measured. Further, the etching process and measurement of the thickness and the sheet resistance were repeated.

Figure 11A:
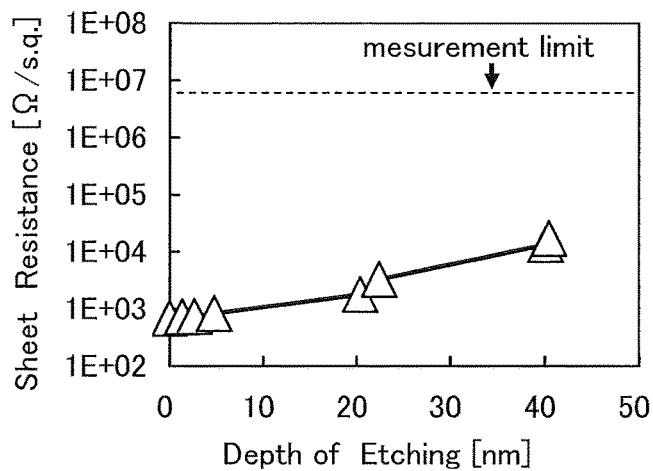
FIGS. 11A, 11B, and 11C show a relation between the depth of etching and the sheet resistance of the oxide semiconductor film in Samples 14, 15, and 16, respectively.
Figure 11B:
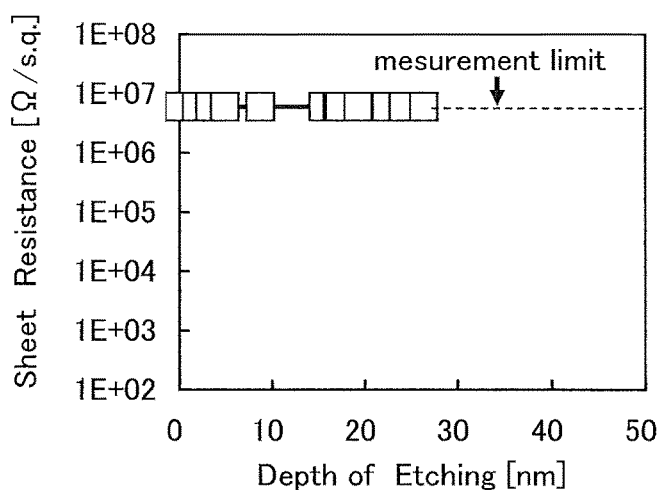
Figure 11C:
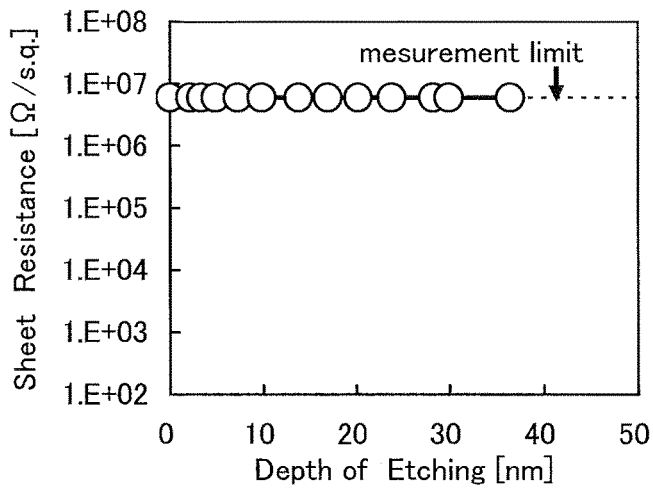

FIGS. 11A to 11C each show a relation between the depth of etching and the sheet resistance of the oxide semiconductor film in Samples 14 to 16.

Although the sheet resistance is low in Sample 14 as shown in FIG. 11A, the sheet resistances in Samples 15 and 16 are at unmeasurable level (the sheet resistances are greater than or equal to 6MΩ/sq.) as shown in FIGS. 11B and 11C. This shows that by heat treatment under an oxygen atmosphere and oxidation treatment with oxygen plasma, the oxide semiconductor film is oxidized and the resistance of the oxide semiconductor film is increased.

Here, the concentration of an impurity on a surface of the oxide semiconductor film which was exposed to oxygen plasma is described with reference to FIGS. 12A to 12D.

First, a fabrication method of Sample 17 is described.

A 100-nm-thick In—Ga—Zn-based oxide film was formed over a silicon wafer as an oxide semiconductor film by a sputtering method. Here, an In—Ga—Zn-based oxide film (represented by In—Ga—Zn—O (111)) was formed under the following conditions: a sputtering target whose atomic ratio of In to Ga and Zn was 1:1:1 was used; oxygen at a flow rate of 15 sccm and argon at a flow rate of 30 sccm were introduced as a sputtering gas into a chamber having a pressure of 0.4 Pa; the substrate temperature was 300° C.; and the supplied electric power was 0.5 kW.

Next, a 100-nm-thick tungsten film was formed as a metal film by a sputtering method. Here, the tungsten film was formed under the following conditions: a tungsten target was used; argon at a flow rate of 80 sccm was introduced as a sputtering gas into a chamber having a pressure of 0.8 Pa; the substrate temperature was 130° C.; and the supplied electric power was 1 kW. After that, the tungsten film was removed by a dry etching method.

Next, the oxide semiconductor film was exposed to oxygen plasma. Here, the In—Ga—Zn-based oxide film was exposed to oxygen plasma generated in the following manner: in a chamber having a pressure of 200 Pa into which dinitrogen monoxide at a flow rate of 900 sccm was introduced, a high-frequency power of 150 W was supplied to an upper electrode with a 60 MHz high-frequency power supply. Note that the substrate temperature was set at 350° C.

Next, a 100-nm-thick silicon oxynitride film was formed over the oxide semiconductor film by a CVD method. Here, the silicon oxynitride film was formed under the following conditions: silane with a flow rate of 1 sccm and dinitrogen monoxide with a flow rate of 800 sccm were used as a source gas; the pressure in the treatment chamber was 200 Pa; the substrate temperature was 350° C.; and the high-frequency power of 150 W was supplied to parallel plate electrodes with a 60 MHz high-frequency power supply.

Through the above process, Sample 17 was fabricated.

Next, Sample 17 was evaluated by SIMS measurement. FIGS. 12A to 12D show the results of evaluating Sample 17 by SIMS measurement. Note that in FIGS. 12A to 12D, the horizontal axis indicates the depth from the surface of Sample 17 and the vertical axis indicates the concentration of boron, carbon, chlorine, or hydrogen. Further, in FIGS. 12A to 12D, the oxide semiconductor film is indicated by reference numeral 111, and the silicon oxynitride film is indicated by SiON. A dashed line shows the concentration of an element before oxygen plasma treatment, and a solid line shows the concentration of an element after the oxygen plasma treatment.

FIG. 12A, FIG. 12B, FIG. 12C, and FIG. 12D show the concentrations of boron, carbon, chlorine, and hydrogen, respectively.

Figure 12A:
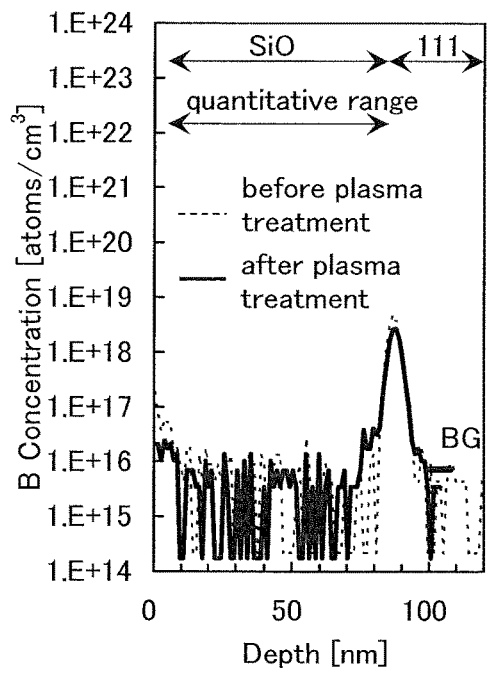
FIG. 12A to FIG. 12D each show the concentration of an impurity on a surface of an oxide semiconductor film in Sample 17.
Figure 12B:
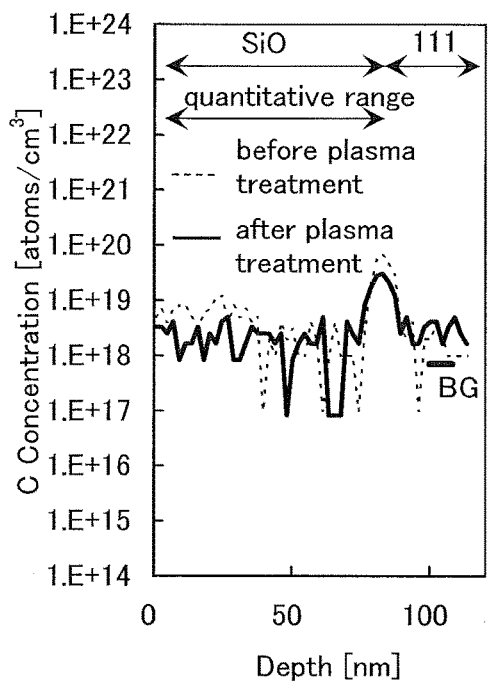
Figure 12C:
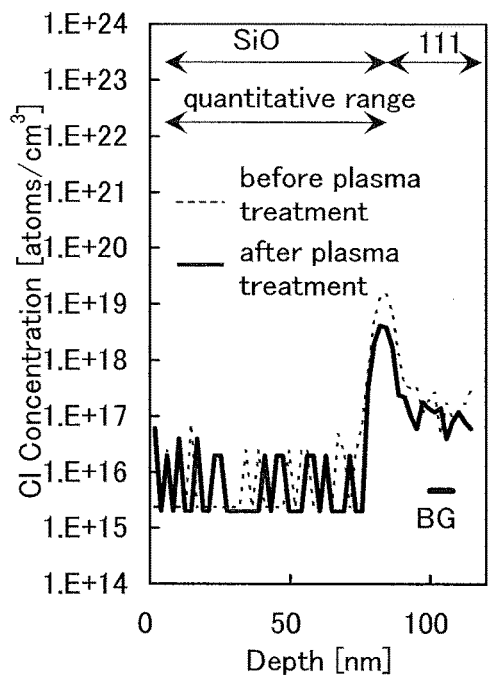

It is found from FIG. 12B and FIG. 12C that the concentrations of carbon and chlorine between the oxide semiconductor film 111 and the silicon oxynitride film (SiON) are reduced by the oxygen plasma treatment.

Figure 12D:
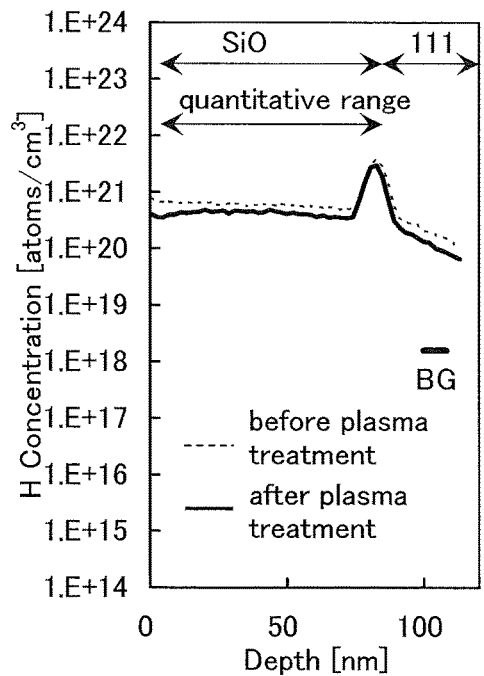

It is found from FIG. 12D that the concentration of hydrogen in the oxide semiconductor film 111 is reduced by the oxygen plasma treatment. In FIG. 12D, the range of the concentration of hydrogen in the oxide semiconductor film 111 after the oxygen plasma treatment is about $6.5 \times 10^{19}$ atoms/cm$^3$ or higher and $3 \times 10^{22}$ atoms/cm$^3$ or lower. From the above, it can be said that film formation over the oxide semiconductor film 111 by a sputtering method under an atmosphere containing oxygen is equivalent to oxygen plasma treatment. Accordingly, when the oxide layer 105 is formed by a sputtering method or the like under an atmosphere containing oxygen in the transistor 170 illustrated in FIGS. 1A to 1C, the concentration of hydrogen in the stack 103, in particular, the concentration of hydrogen in the channel formation region can be reduced. Although the concentration of hydrogen in Sample 17 in this experiment is shown in FIG. 12D, there is no particular limitation thereto, and it is preferable that the concentration of hydrogen in the channel formation region be less than $5 \times 10^{17}$ atoms/cm$^3$ depending on the fabrication process of the transistor.

Thus, when the surface of the oxide semiconductor film is exposed to oxygen plasma, the concentration of an impurity can be reduced.

In addition, another experiment described below was carried out.

The measurement results of the defect density of an oxide semiconductor film by ESR are described with reference to FIGS. 13A and 13B.

First, fabrication methods of Sample 18, Sample 19, Sample 20, and Sample 21 are described.

A 300-nm-thick oxide insulating film was formed over a quartz substrate by a sputtering method (Step 1).

Here, a silicon oxide film was formed as an oxide film under the following conditions: a silicon oxide target was used; oxygen at a flow rate of 50 sccm was introduced as a sputtering gas into a chamber having a pressure of 0.4 Pa; the substrate temperature was 100° C.; and the supplied electric power was 1.5 kW.

Next, a 100-nm-thick oxide semiconductor film was formed over the oxide insulating film (Step 2).

Here, an In—Ga—Zn-based oxide film (represented by In—Ga—Zn—O (111)) was formed as an oxide semiconductor film under the following conditions: a sputtering target whose atomic ratio of In to Ga and Zn is 1:1:1 was used; oxygen at a flow rate of 15 sccm and argon at a flow rate of 30 sccm were introduced as a sputtering gas into a chamber having a pressure of 0.4 Pa; the substrate temperature was 300° C.; and the supplied electric power was 0.5 kW.

Next, a 100-nm-thick metal film was formed over the oxide semiconductor film (Step 3).

Here, a tungsten film was formed as the metal film under the following conditions: a tungsten target was used; argon at a flow rate of 80 sccm and heated argon at a flow rate of 10 sccm were introduced as a sputtering gas into a chamber having a pressure of 0.8 Pa; the substrate temperature was 130° C.; and the supplied electric power was 1 kW.

Next, the metal film was removed by a dry etching method (Step 4).

After that, by oxygen plasma treatment, the oxide semiconductor film was exposed to oxygen plasma (Step 5).

Here, the oxide semiconductor film was exposed to oxygen plasma generated in the following manner: in a chamber having a pressure of 200 Pa into which dinitrogen monoxide at a flow rate of 900 sccm was introduced, a high-frequency power of 150 W was supplied to an upper electrode with a 60 MHz high-frequency power supply. Note that the substrate temperature was set at 350° C.

By combination of two or more steps in Steps 1 to 5, Samples 18 to 21 were fabricated.

Sample 18 was fabricated through Steps 1 and 2.
Sample 19 was fabricated through Steps 1, 2, and 3.
Sample 20 was fabricated through Steps 1, 2, 3, and 4.
Sample 21 was fabricated through all Steps 1 to 5.

Next, Samples 18 to 21 were measured by ESR. In the ESR measurement performed at a predetermined temperature, a value of a magnetic field (Ho) where a microwave is absorbed is used for an equation $g=hv/\beta H_0$, so that a parameter of a g-factor can be obtained. Note that the frequency of the microwave is denoted by v, and the Planck constant and the Bohr magneton are denoted by, respectively, h and $\beta$ which are both constants.

Here, the ESR measurement was performed under the following conditions. The ESR measurement was performed under the following conditions: the measurement temperature was room temperature (25° C.), the high-frequency power (power of microwaves) of 9.5 GHz was 20 mW, and the direction of a magnetic field was parallel to a surface of each sample.

Figure 13A:
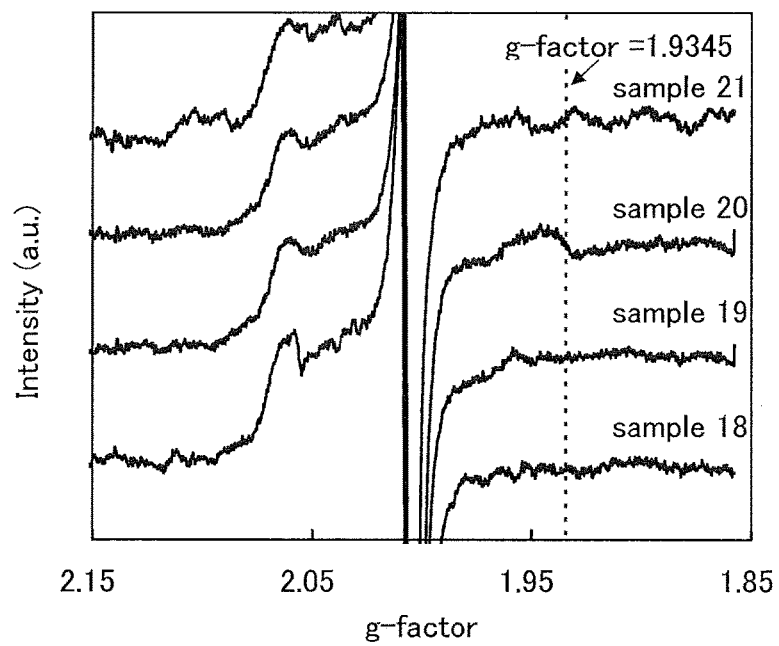
FIGS. 13A and 13B show results obtained by measuring the defect density of an oxide semiconductor film by ESR in each of Samples 18, 19, 20, and 21.
Figure 13B:
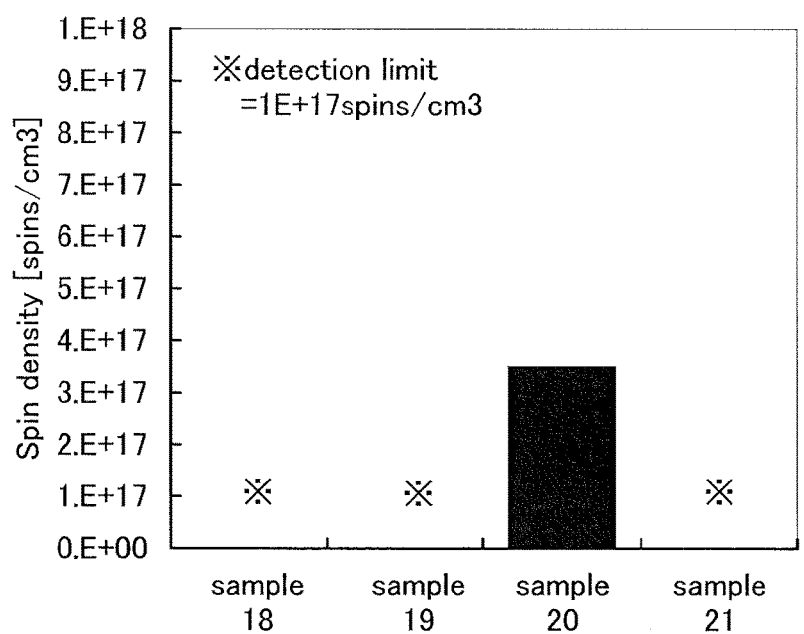

FIG. 13A shows first derivative curves obtained by the ESR measurement, and FIG. 13B shows spin densities of signals which appear at g (g-factor) of 1.93.

Samples 18, 19, and 20 are compared. In Sample 20, a signal having symmetry due to defects in the oxide semiconductor film, typically oxygen vacancies was detected at a g-factor of 1.93. This shows that when a tungsten film which is a metal film is formed over the oxide semiconductor film, defects are generated in the oxide semiconductor film.

Samples 20 and 21 are compared. In Sample 21, a signal having symmetry due to defects in the oxide semiconductor film, typically oxygen vacancies was not detected at a g-factor of 1.93. This shows that when the oxide semiconductor film is exposed to oxygen plasma, defects in the oxide semiconductor film are reduced.

Further, in FIGS. 1A to 1C, an example of the stacked structure of the stack 103 is illustrated, and the first oxide layer 103a and the second oxide layer 103b are included in the stack 103.

The band structure in the vicinity of the stack 103 is described with reference to FIG. 2.

In the band structure shown in FIG. 2, for example, In—Ga—Zn oxides with energy gaps of 3.5 eV, 3.2 eV, and 3.8 eV are used as the first oxide layer 103a, the second oxide layer 103b, and the oxide layer 105, respectively. Note that the energy gap can be measured using a spectroscopic ellipsometer.

The energy difference between the vacuum level and the valence band top (also referred to as ionization potential) of the first oxide layer 103a, the energy difference therebetween of the second oxide layer 103b, and the energy difference therebetween of the oxide layer 105 are 8.0 eV, 7.9 eV, and 8.0 eV, respectively. Note that the energy difference between the vacuum level and the valence band top can be measured using an ultraviolet photoelectron spectroscopy (UPS) device (VersaProbe manufactured by ULVAC-PHI, Inc.).

The bottom of the conduction band of the first oxide layer 103a is denoted by Ec_103a, the bottom of the conduction band of the second oxide layer 103b is denoted by Ec_103b, and the bottom of the conduction band of the oxide layer 105 is denoted by Ec_105. Further, the bottom of the conduction band of the insulating layer 102 is denoted by Ec_102, and the bottom of the conduction band of the insulating layer 106 is denoted by Ec_106.

The energy difference between the vacuum level and the bottom of the conduction band (also referred to as electron affinity) of the first oxide layer 103a, the energy difference therebetween of the second oxide layer 103b, and the energy difference therebetween of the oxide layer 105 are 4.5 eV, 4.7 eV, and 4.2 eV, respectively. Note that an energy difference between the vacuum level and the bottom of the conduction band (also referred to as electron affinity) corresponds to a value obtained by subtracting an energy gap from an energy difference between the vacuum level and the top of the valence band (also referred to as ionization potential).

As shown in FIG. 2, in the stack 103, the bottom of the conduction band in the vicinity of the interface between the first oxide layer 103a and the second oxide layer 103b and the bottom of the conduction band in the vicinity of the interface between the second oxide layer 103b and the oxide layer 105 vary continuously. That is, there is no barrier in the vicinity of the interface between the first oxide layer 103a and the second oxide layer 103b and in the vicinity of the interface between the second oxide layer 103b and the oxide layer 105, and the bottom of the conduction band smoothly varies. A structure having such a bottom of the conduction band can also be referred to as a U-shaped well (U-shape well) structure. Such a shape is caused by mutual transfer of oxygen between the first oxide layer 103a and the second oxide layer 103b and between the oxide layer 105 and the second oxide layer 103b. Further, in the stack 103, an energy of the bottom of the conduction band of the second oxide layer 103b is lowest, and this region functions as a channel region.

Since the first oxide layer 103a is an oxide film containing one or more kinds of metal elements forming the second oxide layer 103b, the stack 103 can also be referred to as a multilayer film in which films containing the same main components are stacked. The layers of the multilayer film, which contain the same main components and are stacked, are not simply stacked but formed to have continuous junction (here, particularly a U-shaped well structure where the energy of the bottom of the conduction band is continuously changed between the layers). This is because when impurities which form a defect state such as a trap center or a recombination center are mixed at each interface, the continuity of the energy band is lost, and thus carriers are trapped or disappear by recombination at the interface.

In order to form a continuous junction, the layers are preferably stacked successively without exposure to the air with use of a multi-chamber deposition apparatus (e.g., a sputtering apparatus) including a load lock chamber.

In the vicinity of the interface between the insulating layer 102 and the first oxide layer 103a, trap states 124 are formed by an impurity and defects. In addition, in the vicinity of the interface between the oxide layer 105 and the insulating layer 106, trap states 126 are formed by an impurity and defects. In the stack 103 in this embodiment, the first oxide layer 103a is provided between the second oxide layer 103b and the insulating layer 102; thus, there is a distance between the second oxide layer 103b and the trap states 124. In addition, the oxide layer 105 is provided between the second oxide layer 103b and the insulating layer 106; thus, there is a distance between the second oxide layer 103b and the trap states 126. As a result, electrons flowing in the second oxide layer 103b are less likely to be captured by the trap states 124 and 126. Accordingly, the amount of on-state current of the transistor can be increased, and the field-effect mobility can be increased. When the electrons are captured by the trap states 124 and 126, the electrons become negative fixed charges. As a result, a threshold voltage of the transistor fluctuates. However, by the distance between the second oxide layer 103b and the trap states 124 and 126, capture of the electrons by the trap states 124 and 126 can be reduced, and accordingly a fluctuation of the threshold voltage can be reduced.

Note that L1 in FIG. 1B can be regarded as the shortest distance between the edge of the source electrode 104a and the edge of the drain electrode 104b which are in contact with the stack 103 and face each other.

The source electrode 164a extends beyond the edge of the source electrode 104a in contact with the stack 103 in a direction of L1, and the drain electrode 164b extends beyond the edge of the drain electrode 104b in contact with the stack 103 in the direction of L1.

The extended portion of the source electrode 164a and the extended portion of the drain electrode 164b are in contact with the stack 103. In the transistor 170 illustrated in FIGS. 1A to 1C, a distance between an end portion of the extended portion of the source electrode 164a, the end portion being in contact with the stack 103, and an end portion of the extended portion of the drain electrode 164b, the end portion being in contact with the stack 103, corresponds to the channel length. The channel length is illustrated as L2 in FIG. 1B.

In the case where L2 is less than 50 nm, for example, about 30 nm, a developed mask which is obtained by exposing a resist with use of an electron beam exposure apparatus, a liquid immersion exposure apparatus using ArF excimer laser light as a light source, an extreme ultraviolet (EUV) exposure apparatus, or the like is preferably used as a mask for etching a conductive film. At a higher acceleration voltage, an electron beam can provide a more precise pattern. The use of multiple electron beams can shorten the process time per substrate. Here, in an electron beam writing apparatus capable of electron beam irradiation, the acceleration voltage is preferably higher than or equal to 5 kV and lower than or equal to 50 kV, for example. The current intensity is preferably greater than or equal to $5\times10^{-12}$ A and less than or equal to $1\times10^{-11}$ A. The minimum beam size is preferably 2 nm or less. The minimum possible pattern line width is preferably 8 nm or less. Under the above conditions, a pattern with a width of, for example, 30 nm or less, preferably 20 nm or less, more preferably 8 nm or less, can be obtained.

Figure 5A:
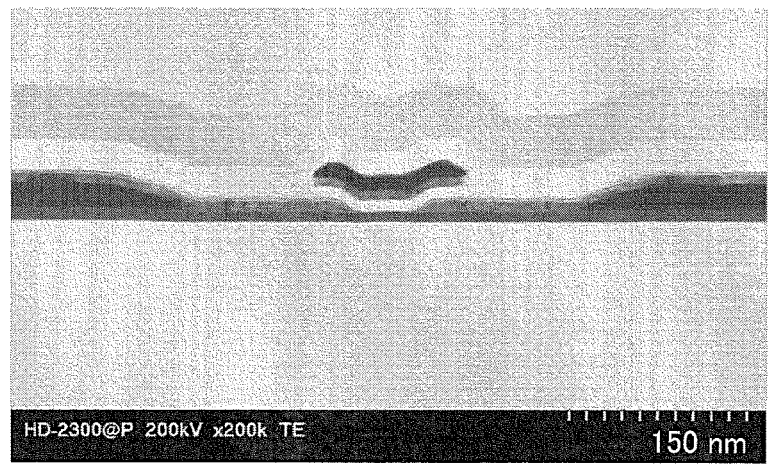
FIG. 5A is a cross-sectional TEM image of a semiconductor device of one embodiment of the present invention.
Figure 5B:
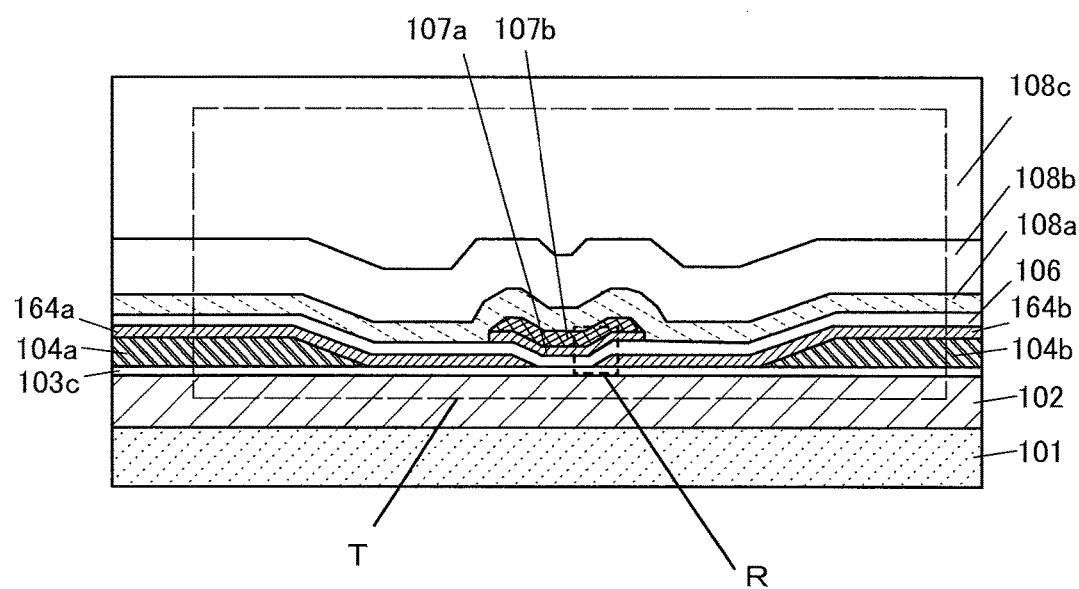
FIG. 5B is a schematic view thereof.

Here, FIG. 5A is a cross-sectional image of a transistor in which L2 is about 30 nm with use of an electron beam, and FIG. 5B is a schematic view thereof.

Note that the fabricated transistor is an example which uses not the stack 103 but a single layer of an oxide semiconductor material.

The insulating layer 102 is formed over the substrate 101. In order to reduce surface roughness of the insulating layer 102, planarization treatment is performed on the surface of the insulating layer 102. As the planarization treatment, etching treatment or the like can be employed instead of polishing treatment such as chemical mechanical polishing (hereinafter, also referred to as CMP treatment). CMP treatment and etching treatment may be performed in combination. Note that a single crystal silicon substrate is used as the substrate 101. Further, the insulating layer 102 is formed in such a manner that the substrate 101 is thermally oxidized by heat treatment at 950° C. using hydrochloric acid to form a 100-nm-thick thermal oxide film, and then a 300-nm-thick silicon oxynitride film is formed by a plasma CVD method. In this specification, the nitride oxide refers to a material containing a larger amount of nitrogen than oxygen, and the oxynitride refers to a material containing a larger amount of oxygen than nitrogen. The content of each element can be measured by Rutherford backscattering spectrometry (RBS), for example.

After the CMP treatment, treatment for highly purifying the insulating layer 102 by further reduction of impurities such as water or hydrogen in the insulating layer 102 (dehydration or dehydrogenation) is performed. For example, the insulating layer 102 is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere containing an oxidation gas such as oxygen, ozone, or nitrogen oxide at 10 ppm or higher. The inert gas atmosphere refers to an atmosphere which contains the oxidation gas at lower than 10 ppm and is filled with nitrogen or a rare gas.

The heat treatment may be performed at a temperature higher than or equal to 250° C. and lower than or equal to 650° C., preferably higher than or equal to 300° C. and lower than or equal to 500° C. The treatment time is longer than or equal to 3 minute and shorter than or equal to 24 hours.

Heat treatment for over 24 hours is not preferable because the productivity is reduced. In this embodiment, heat treatment is performed under a reduced-pressure atmosphere at 450° C. for an hour.

Oxygen is added into the insulating layer 102 by an ion implantation method, an ion doping method, a plasma immersion ion implantation method, or the like. The addition of oxygen may be controlled by setting the addition conditions such as the acceleration voltage and the dosage, or the thickness of the film through which the oxygen passes as appropriate. Note that the dose of oxygen is $2 \times 10^{16}$ ions/cm$^2$.

Next, an oxide semiconductor film is formed over the insulating layer 102.

A 15-nm-thick In—Ga—Zn-based oxide film (IGZO film) is formed by a sputtering method using a polycrystalline target. In this embodiment, an In—Ga—Zn-based oxide target having an atomic ratio of In:Ga:Zn=1:1:1 (=1/3:1/3:1/3) is used. The deposition conditions are as follows: the atmosphere is oxygen and argon (the flow rate of oxygen: 33.3%), the pressure is 0.4 Pa, the power supply is 0.5 kW, and the substrate temperature is 300° C.

In this embodiment, before the oxide semiconductor film is processed into an island shape, the substrate is introduced into an electric furnace, which is one of heat treatment apparatuses, and the oxide semiconductor film is subjected to heat treatment at 450° C. in a nitrogen atmosphere for an hour and further at 450° C. in an atmosphere of oxygen for an hour.

Next, an island-shaped oxide semiconductor layer 103c is formed using a first resist mask formed by an electron beam exposure. Then, a 20-nm-thick tungsten film is formed by a sputtering method and selectively etched with use of a second resist mask formed by an electron beam exposure to form the drain electrode 104b and the source electrode 104a which are in contact with the oxide semiconductor layer 103c.

Next, a 10-nm-thick titanium nitride film is formed by a sputtering method and selectively removed with use of a third resist mask formed by an electron beam exposure to form the drain electrode 164b and the source electrode 164a. Thus, the channel length L is determined by the shortest distance between the drain electrode 164b and the source electrode 164a. The shortest distance between the drain electrode 164b and the source electrode 164a is determined by etching using a resist obtained by an electron beam exposure as a mask.

Figure 3A:
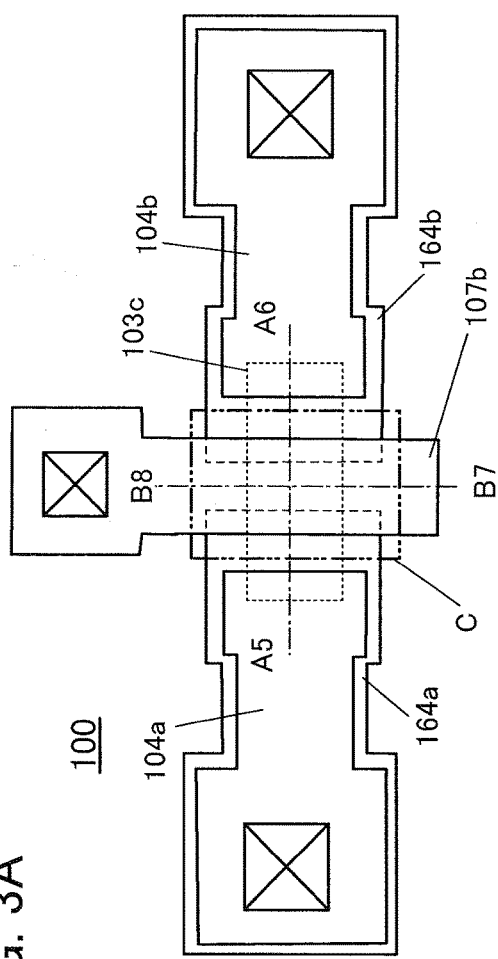
FIG. 3A is a top view illustrating a semiconductor device of one embodiment of the present invention.
Figure 3C:
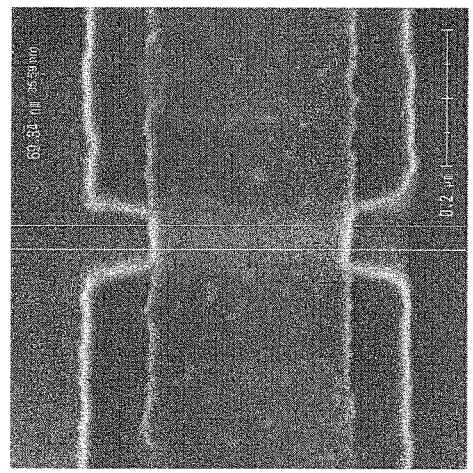
FIG. 3C is an image thereof with use of a CD-SEM before formation of a gate electrode.

FIG. 3C is an image showing the steps so far which was taken with use of an apparatus called a CD-SEM (critical dimension SEM). The measured value, that is, the shortest distance between the drain electrode 164b and the source electrode 164a was 35.59 nm.

Precise exposure and development using an electron beam can provide a precise pattern; thus, a minute transistor with a channel length L of less than 50 nm can be manufactured.

Next, a 10-nm-thick silicon oxynitride film is formed as an insulating layer serving as a gate insulating film 106 by a plasma CVD method under the following conditions: a mixture gas of a silane gas and a N$_2$O gas is used as a material gas, and the substrate temperature is 350° C.

Next, a 10-nm-thick tantalum nitride film is formed by a sputtering method, and a 10-nm-thick tungsten film is formed thereover. Then, selective etching is performed with use of a fourth resist mask formed by an electron beam exposure, so that the gate electrode 107a formed using the tantalum nitride film and the gate electrode 107b formed using the tungsten film are formed.

Next, a 20-nm-thick silicon oxynitride film is formed as an insulating layer 108a by a plasma CVD method, and a 50-nm-thick silicon nitride film is stacked thereover as an insulating layer 108b by a plasma CVD method. Further, a 150-nm-thick silicon oxynitride film is formed thereover as an insulating layer 108c by a plasma CVD method.

After that, a resist mask is formed with use of a first photomask, contact holes reaching the gate electrode 107b, the drain electrode 164b, and the source electrode 164a are formed by selective etching of the insulating layers 108a, 108b, and 108c, and a conductive film is formed. Then, a resist mask is formed with use of a second photomask, and the conductive film is selectively etched to form a wiring. Note that the wiring has a structure in which a 50-nm-thick titanium film, a 200-nm-thick aluminum film, and a 50-nm-thick titanium film were stacked.

Then, a 1.5-μm-thick polyimide resin film is formed as a protection film, and lastly, heat treatment is performed at 300° C. under an air atmosphere for an hour.

Figure 3B:
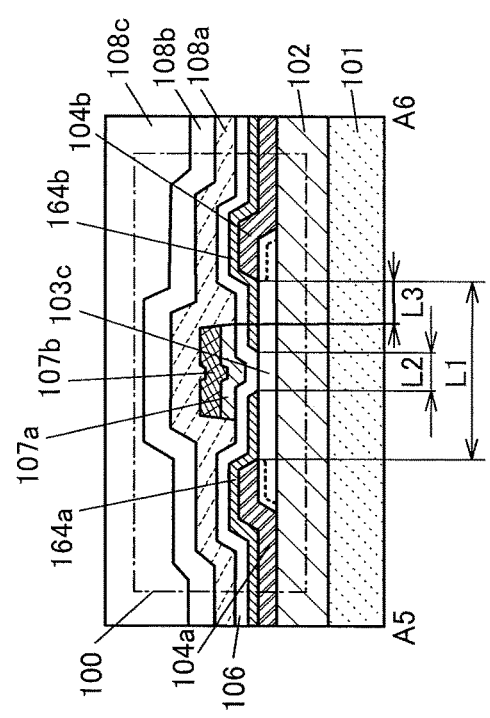
FIG. 3B is a cross-sectional view thereof.

FIG. 3A is a top view of a transistor 100 thus obtained, and FIG. 3B is a cross-sectional view taken along chain line A5-A6 of FIG. 3A. Note that a region surrounded by chain line C of FIG. 3A corresponds to a region taken by a CD-SEM before formation of the gate electrode.

Figure 4:
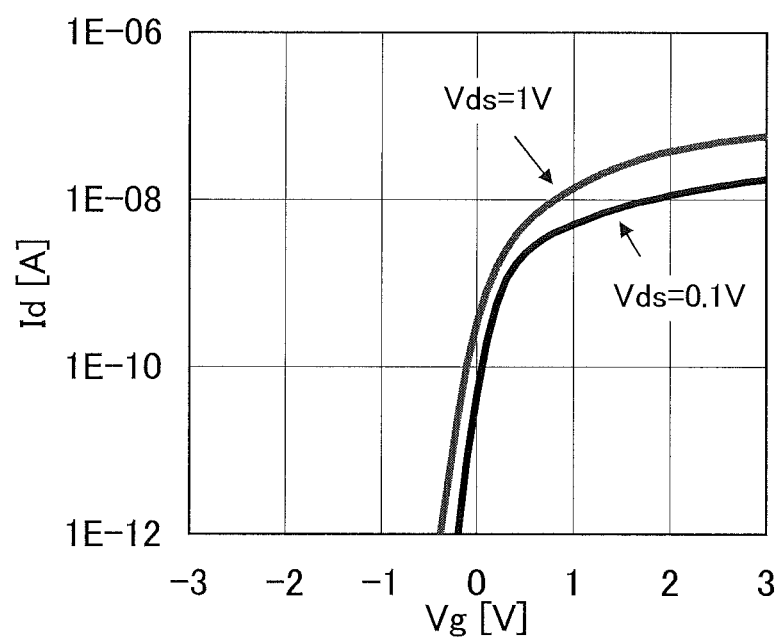
FIG. 4 shows $V_g$-$I_d$ characteristics of a semiconductor device of one embodiment of the present invention.

FIG. 4 shows the Vg-Id characteristics which are the initial characteristics of the transistor 100. In FIG. 4, the Vg-Id characteristics on the upper side show data obtained when Vds=1 V, and the Vg-Id characteristics on the lower side show data obtained when Vds=0.1 V. Note that the channel length L2 is 35.59 nm and the channel width W is 300 nm. Further, L1 is about 330 nm Note that Lov which is the width in the channel length direction of a region where the drain electrode 164b and the gate electrode 107a overlap with each other is about 50 nm. In addition, the length L3 in FIG. 3B is about 100 nm.

Figure 6:
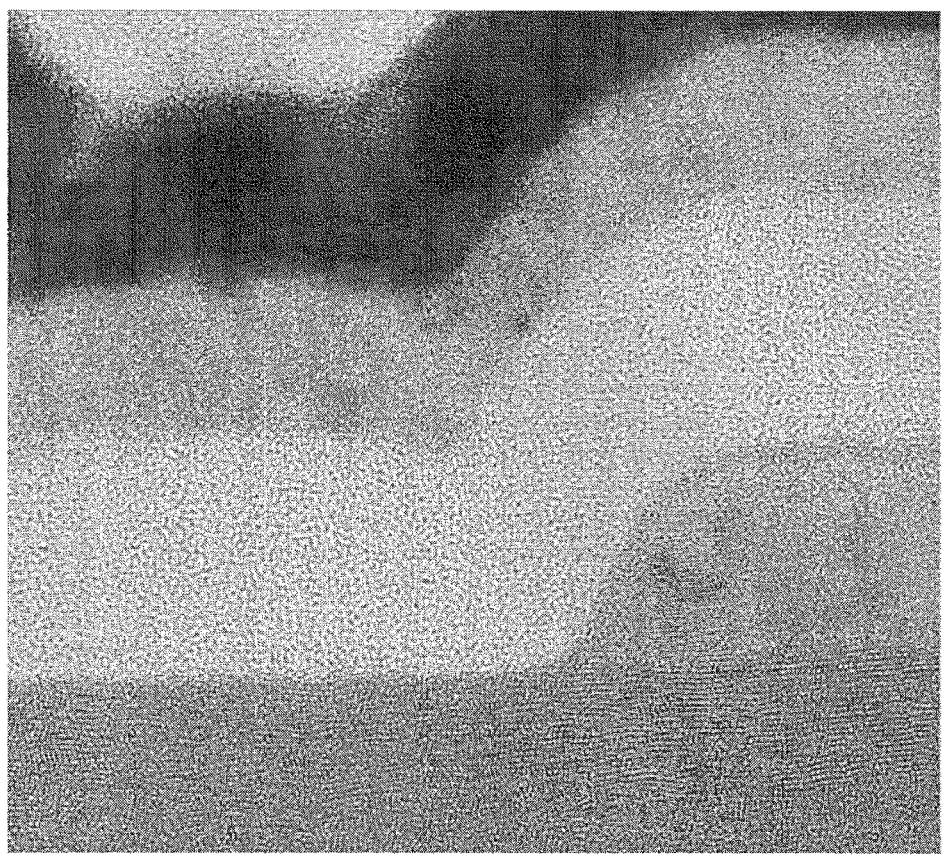
FIG. 6 is an enlarged view of part of FIG. 5A.

Note that a region surrounded by a dotted line T in FIG. 5B corresponds to a region taken in FIG. 5A. FIG. 6 is an image in which a region surrounded by a dotted line R in FIG. 5B is enlarged.

In FIG. 6, it can be seen that the oxide semiconductor layer 103c is crystallized. The oxide semiconductor layer 103c includes a plurality of crystal parts and is a CAAC-OS film. In the cross-sectional TEM image of FIG. 6, it can be confirmed that a region of the oxide semiconductor layer 103c which is in contact with the drain electrode 164b or the source electrode 164a has the same crystal structure as a region of the oxide semiconductor layer 103c which does not overlap with the drain electrode 164b and the source electrode 164a (channel formation region). A clear lattice image showing alignment of the CAAC-OS film can be observed from an interface between the insulating layer 102 and the oxide semiconductor layer 103c to an interface between the oxide semiconductor layer 103c and the silicon oxynitride film serving as a gate insulating film 106. In addition, a clear lattice image showing alignment of the CAAC-OS film can be observed from an interface between the insulating layer 102 and the oxide semiconductor layer 103c to an interface between the oxide semiconductor layer 103c and the titanium nitride film serving as the source electrode 164a or the drain electrode 164b.

(Localized Level of CAAC-OS Film)

Here, localized levels of the CAAC-OS film as the oxide semiconductor layer 103c are described. Here, measurement results of the CAAC-OS film by a constant photocurrent method (CPM) are described.

First, a structure of a sample subjected to CPM measurement is described.

The measurement sample includes the CAAC-OS film provided over a glass substrate, a pair of electrodes in contact with the CAAC-OS film, and an insulating film covering the CAAC-OS film and the pair of electrodes.

Next, a method for forming the CAAC-OS film included in the measurement sample is described.

The CAAC-OS film was formed by a sputtering method under the following conditions: an In—Ga—Zn-oxide target (In:Ga:Zn=1:1:1 [atomic ratio]) was used; an argon gas with a flow rate of 30 sccm and an oxygen gas with a flow rate of 15 sccm were used as a deposition gas; the pressure was 0.4 Pa; the substrate temperature was 400° C.; and a direct-current power of 0.5 kW was supplied. Next, treatment for releasing hydrogen in the CAAC-OS film and treatment for supplying oxygen to the CAAC-OS film were performed in such a manner that heating was performed at 450° C. under a nitrogen atmosphere for an hour, and then heating was performed at 450° C. under an oxygen atmosphere for an hour.

Next, CPM measurement was pertained on the measurement sample which includes the CAAC-OS film. Specifically, the amount of light with which a surface of the sample between terminals is irradiated is adjusted so that a photocurrent value is kept constant in the state where voltage is applied between a first electrode and a second electrode provided in contact with the CAAC-OS film, and then an absorption coefficient is derived from the amount of the irradiation light in an intended wavelength range.

Figure 14:
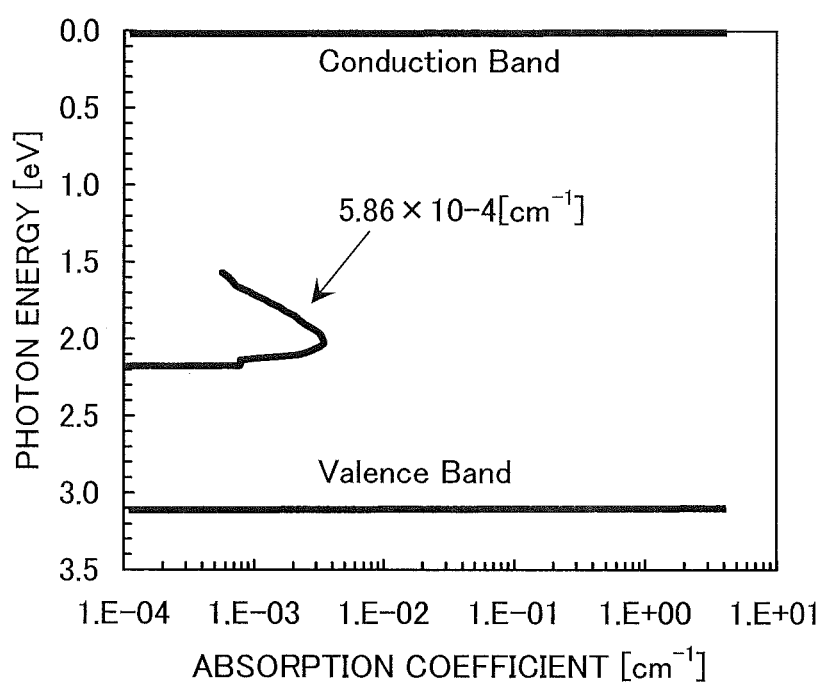
FIG. 14 is a graph showing results of CPM measurement of an oxide semiconductor film.

An absorption coefficient shown in FIG. 14 was obtained by removing an absorption coefficient due to the band tail from an absorption coefficient obtained by CPM measurement of the measurement sample. That is, an absorption coefficient due to defects is shown in FIG. 14. In FIG. 14, the horizontal axis indicates the absorption coefficient, and the vertical axis indicates the photon energy. The bottom of the conduction band and the top of the valence band of the CAAC-OS film are set to 0 eV and 3.15 eV, respectively, on the vertical axis in FIG. 14. Each curve in FIG. 14 represents a relation between the absorption coefficient and photon energy, which corresponds to defect states.

In the curve shown in FIG. 14, the absorption coefficient due to defect states was $5.86 \times 10^{-4}$ $cm^{-1}$. That is, the absorption coefficient of the CAAC-OS film due to defect states is lower than $1 \times 10^{-3}$/cm, preferably lower than $1 \times 10^{-4}$/cm, and thus the CAAC-OS film has a low density of defect states.

Note that the film density of the CAAC-OS film was measured by X-ray reflectometry (XRR). The film density of the CAAC-OS film was 6.3 $g/cm^3$. That is, the CAAC-OS film has high film density.

<Observation Result of Electron Diffraction Pattern of CAAC-OS Film>

Next, an observation result of an electron diffraction pattern of the CAAC-OS film is described.

The CAAC-OS film used in this embodiment is an In—Ga—Zn-based oxide film formed using a target which is an In—Ga—Zn oxide whose atomic ratio of In to Ga and Zn is 1:1:1 by a sputtering method using a deposition gas containing oxygen.

Figure 17A:
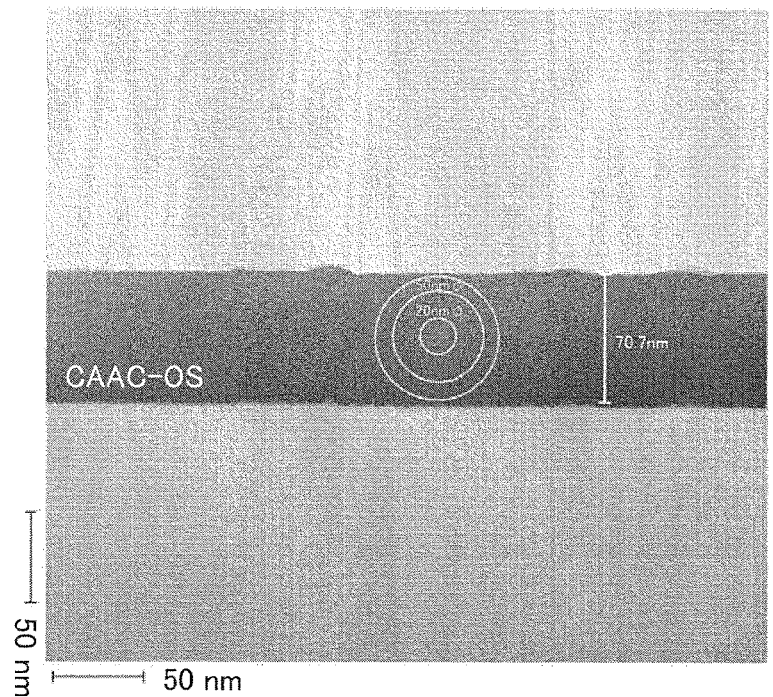
FIG. 17A is a cross-sectional TEM image of a CAAC-OS film.
Figure 17B:
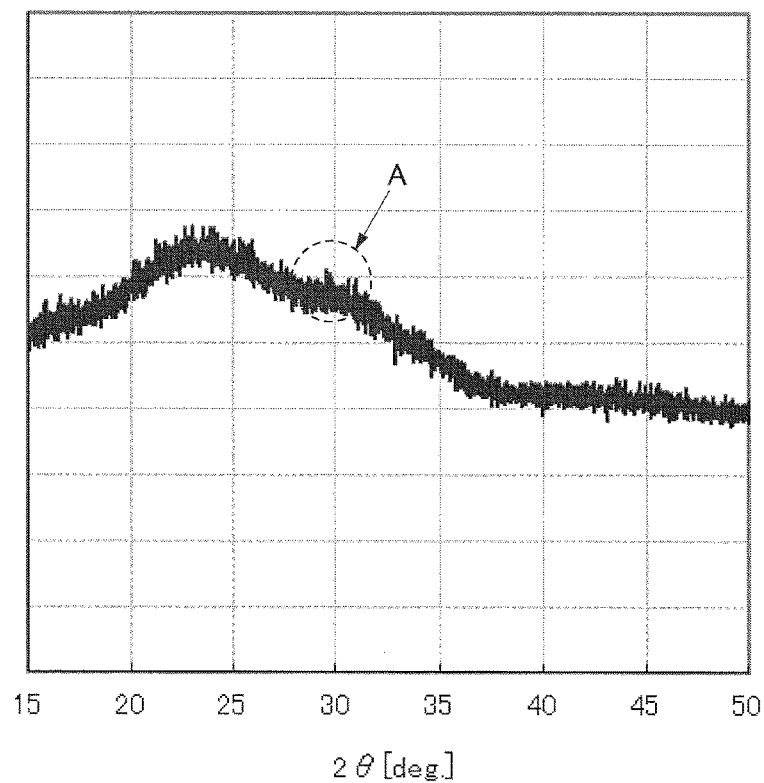
FIG. 17B is an X-ray diffraction spectrum thereof.
Figure 18A:
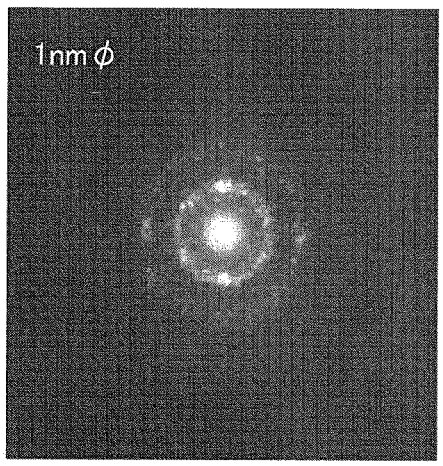
FIGS. 18A to 18D are electron diffraction patterns of a CAAC-OS film.
Figure 18B:
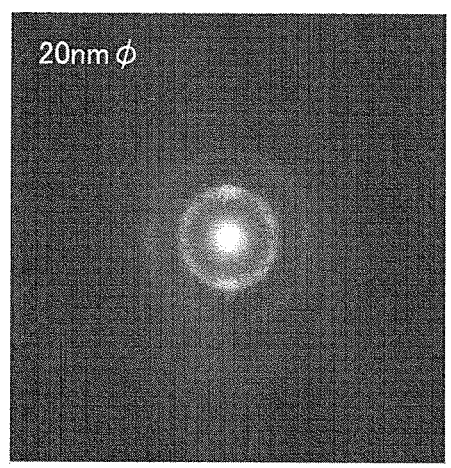
Figure 18C:
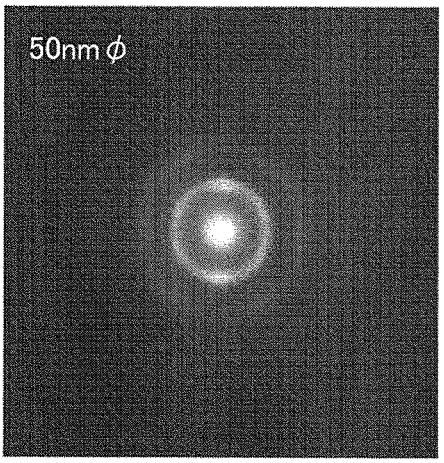
Figure 18D:
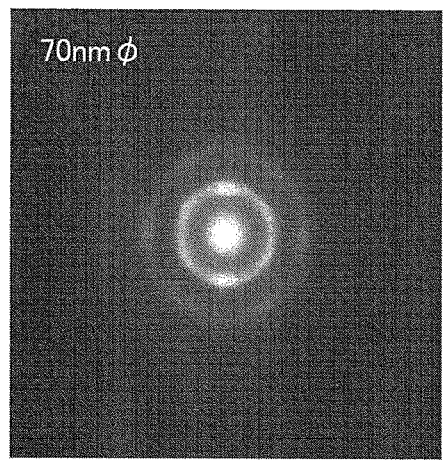

FIG. 17A is a cross-sectional TEM (transmission electron microscopy) image of the CAAC-OS film, and FIG. 17B shows an X-ray diffraction spectrum.

The CAAC-OS film may have a variety of forms, and Peak A which indicates a crystal component appears around 29=31° as shown in FIG. 17B, but the peak does not appear clearly in some cases.

The cross-sectional TEM image of FIG. 17A was taken with a transmission electron microscope ("H-9000NAR" manufactured by Hitachi High-Technologies Corporation) at an acceleration voltage of 300 kV and at a magnification of 2000000 times.

Further, electron diffraction was performed on regions of the CAAC-OS film in FIG. 17A which are indicated by concentric circles with an electron-beam diameter changed. Results thereof are shown in FIGS. 18A, 18B, 18C, and 18D. FIGS. 18A, 18B, 18C, and 18D are electron diffraction patterns taken with a transmission electron microscope ("HF-2000" manufactured by Hitachi High-Technologies Corporation) at an acceleration voltage of 200 kV and with beam diameters of 1 nmϕ, 20 nmϕ, 50 nmϕ, and 70 nmϕ. Note that an electron diffraction with an electron-beam diameter of 10 nmϕ or smaller is particularly called a nanobeam electron diffraction. The measurement range by an electron diffraction with an electron-beam diameter of about 1 nmϕ☐☐☐☐5 nmϕ or larger and 10 nmϕ or smaller.

In the case of an electron-beam diameter of 1 nmϕ, a pattern formed by clear spots (bright points) can be observed. As the electron-beam diameter is increased, the spots (bright points) become a bit unclear but a diffraction pattern can be observed; therefore, the whole film is a CAAC-OS film or a film including a CAAC-OS film.

Figure 19A:
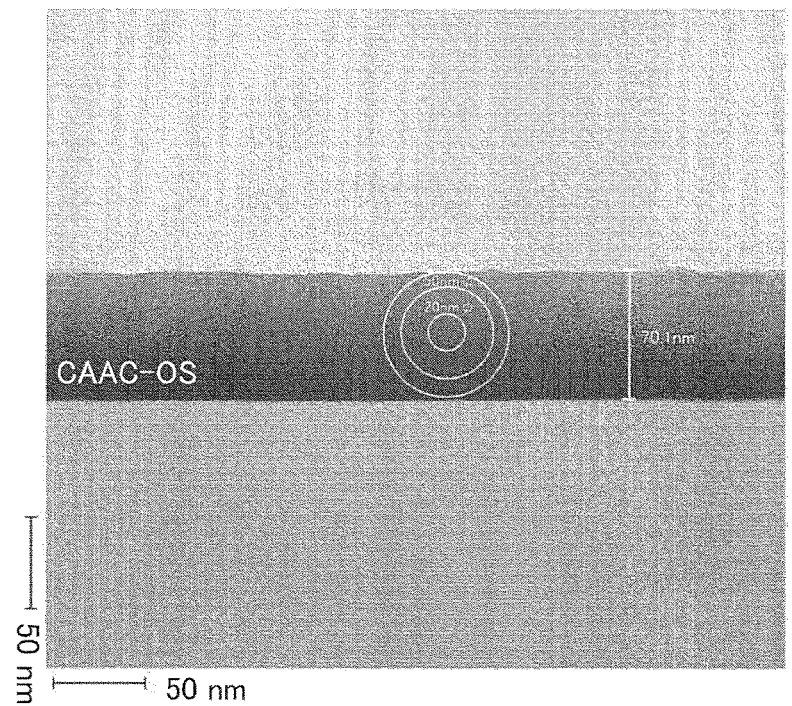
FIG. 19A is a cross-sectional TEM image of a CAAC-OS film.
Figure 19B:
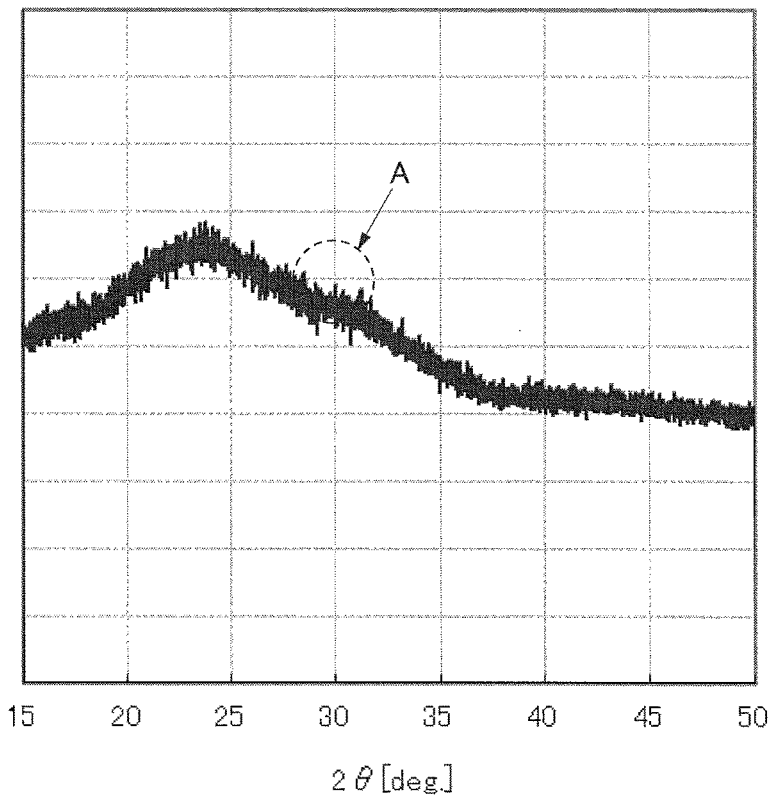
FIG. 19B is an X-ray diffraction spectrum thereof.
Figure 20A:
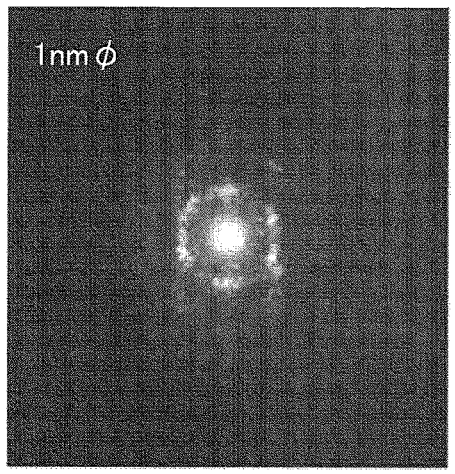
FIGS. 20A to 20D are electron diffraction patterns of a CAAC-OS film.
Figure 20B:
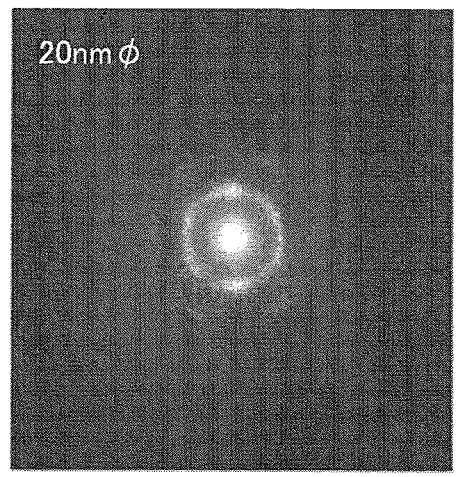
Figure 20C:
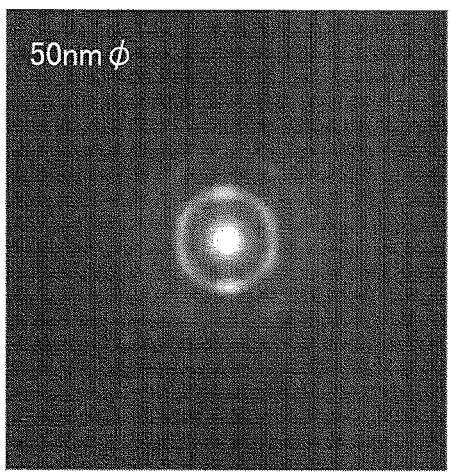
Figure 20D:
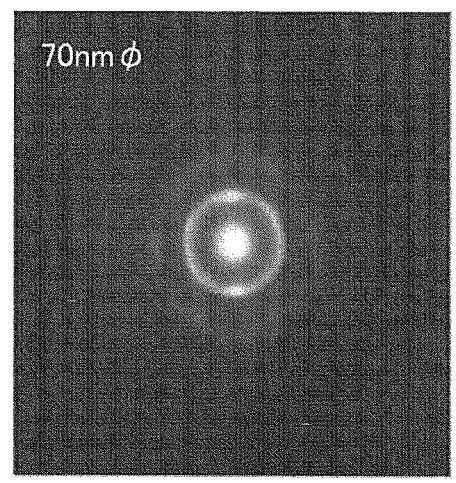

FIGS. 19A and 19B are a cross-sectional TEM image and an X-ray diffraction spectrum, respectively, of the CAAC-OS film used for the cross-sectional TEM observation in FIG. 17A, which was subjected to heat treatment at 450° C.

FIGS. 20A to 20D show results of electron diffraction in regions in the CAAC-OS film with electron-beam diameters of 1 nmϕ, 20 nmϕ, 50 nmϕ, and 70 nmϕ. The regions are indicated by concentric circles in FIG. 19A. In the case of an electron-beam diameter of 1 nmϕ, a pattern formed by clear spots (bright points) can be observed as in the results shown in FIGS. 18A to 18D. As the electron-beam diameter is increased, the spots (bright points) become a bit unclear but a diffraction pattern can be observed; therefore, the whole film is a CAAC-OS film or a film including a CAAC-OS film.

Figure 21A:
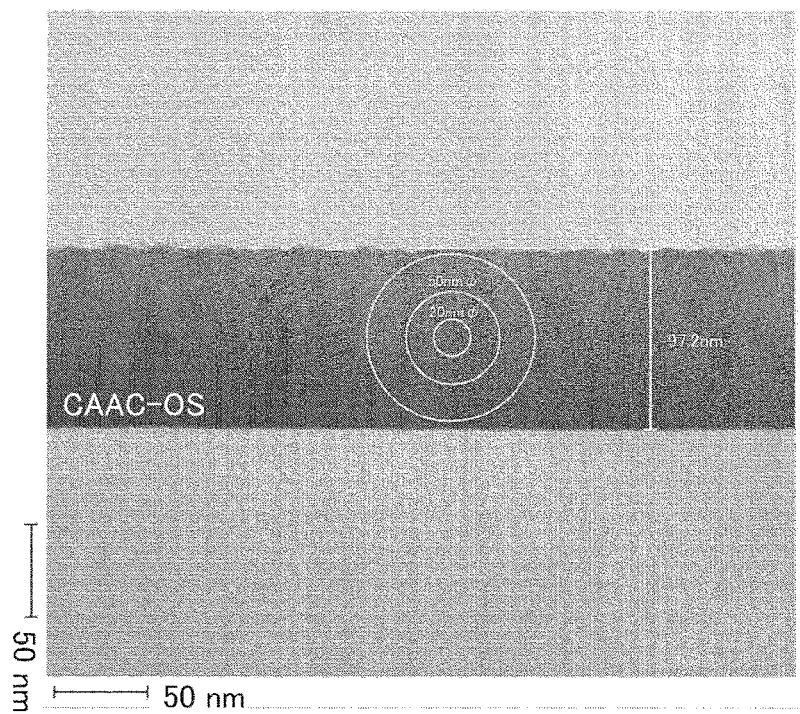
FIG. 21A is a cross-sectional TEM image of a CAAC-OS film.
Figure 21B:
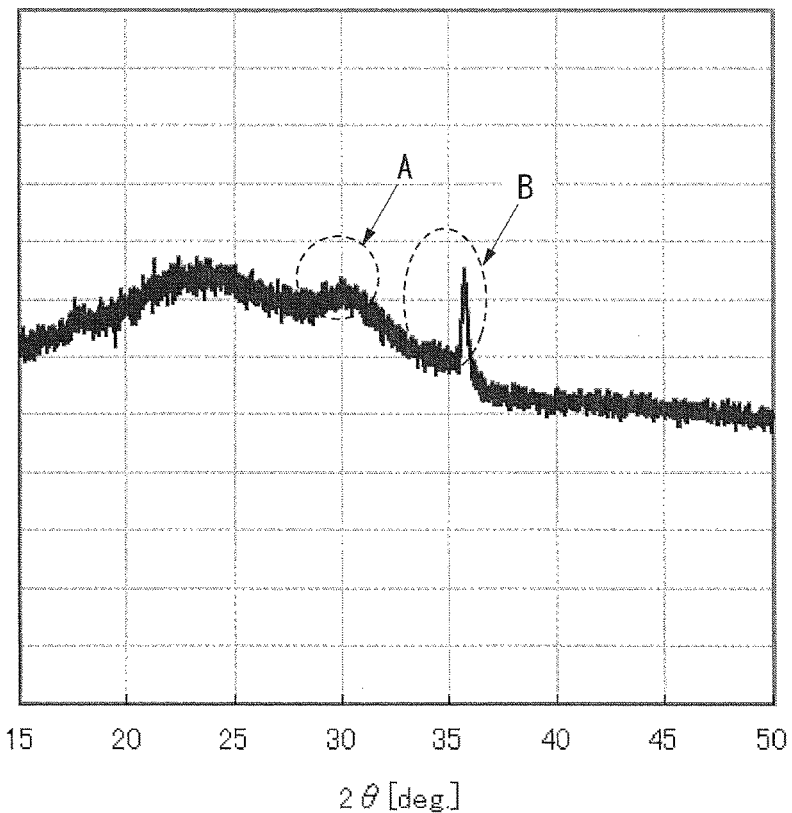
FIG. 21B is an X-ray diffraction spectrum thereof.
Figure 22A:
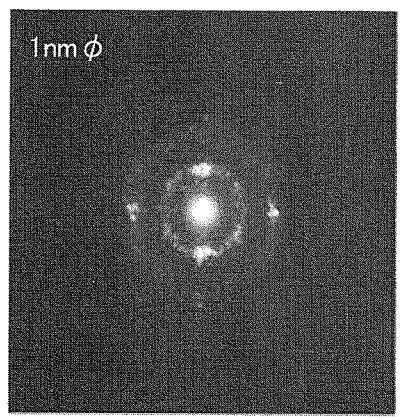
FIGS. 22A to 22D are electron diffraction patterns of a CAAC-OS film.
Figure 22B:
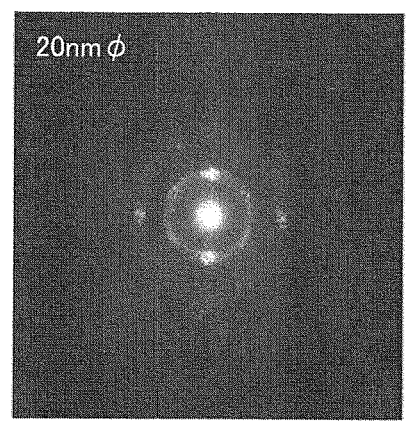
Figure 22C:
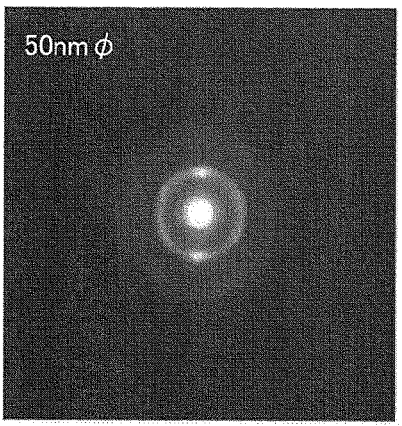
Figure 22D:
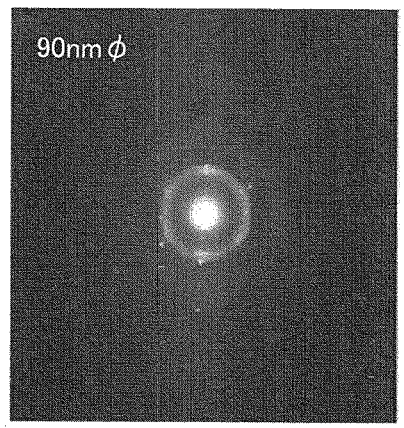

FIGS. 21A and 21B are a cross-sectional TEM image and an X-ray diffraction spectrum of a CAAC-OS film different from the CAAC-OS film used for the cross-sectional TEM image of FIG. 17A. The CAAC-OS film has a variety of forms, and as shown in FIG. 21B, as well as Peak A indicating a crystal component around 28=31°, Peak B which is derived from a spinel crystal structure appears in some cases.

FIGS. 22A to 22D show results of electron diffraction in regions in the CAAC-OS film with electron-beam diameters of 1 nmϕ, 20 nmϕ, 50 nmϕ, and 90 nmϕ. The regions are indicated by concentric circles in FIG. 21A. In the case of an electron-beam diameter of 1 nmϕ, a pattern formed by clear spots (bright points) can be observed. As the electron-beam diameter is increased, the spots (bright points) become a bit unclear but a diffraction pattern can be observed. Further, in the case of a beam diameter of 90 nmϕ, clearer spots (bright points) can be observed. Accordingly, the whole film is a CAAC-OS film or a film including a CAAC-OS film.

Figure 15:
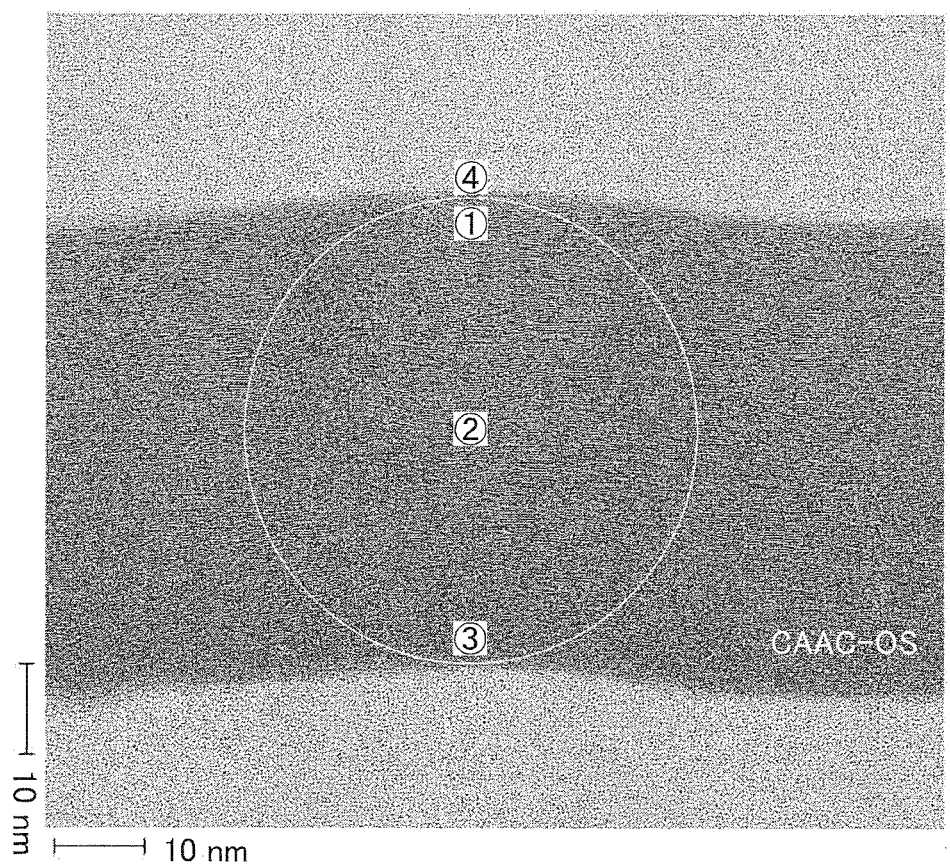
FIG. 15 is a cross-sectional TEM image of a CAAC-OS film.

FIG. 15 is a cross-sectional TEM image of a CAAC-OS film different from the CAAC-OS film used for the cross-sectional TEM observation in FIG. 17A. FIGS. 16A, 16B, 16C, and 16D are electron diffraction patterns at Point 1, Point 2, Point 3, and Point 4 in FIG. 15, respectively, which were observed by electron diffraction.

The electron diffraction patterns shown in FIGS. 16A, 16B, 16C, and 16D are obtained with a transmission electron microscope, at an acceleration voltage of 200 kV, and with a beam diameter of about 1 nmϕ or about 50 nmϕ□

Figure 16A:
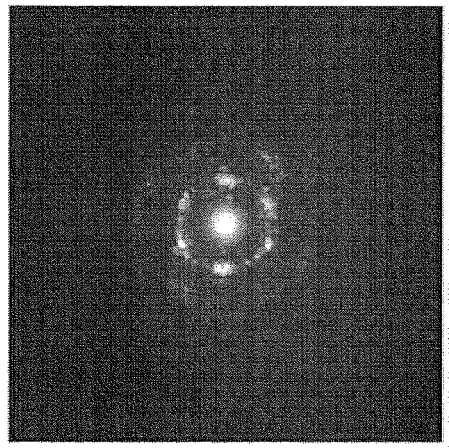
FIGS. 16A to 16D are electron diffraction patterns of a CAAC-OS film.
Figure 16B:
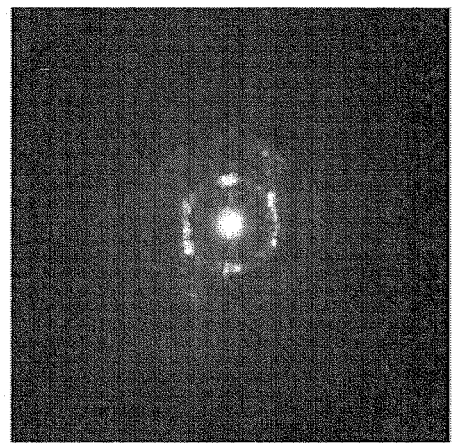
Figure 16C:
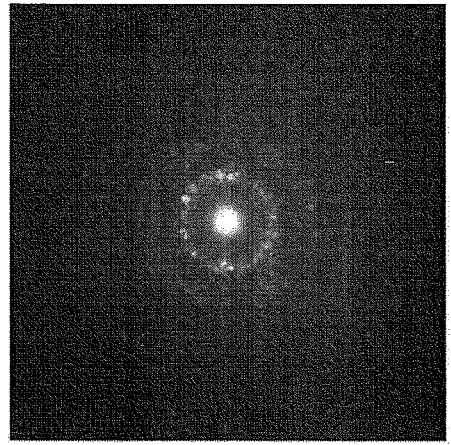
Figure 16D:
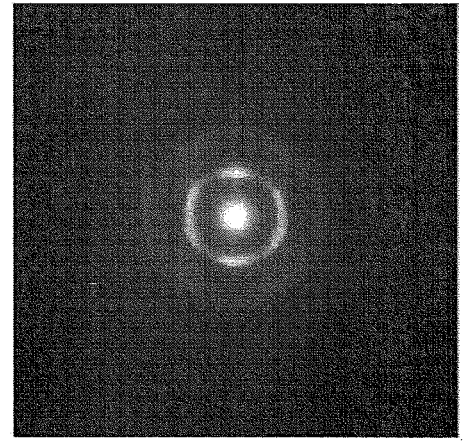

Electron diffraction patterns of Point 1 (the surface side of the film), Point 2 (the center of the film), and Point 3 (the base side of the film) shown in FIG. 15 correspond to FIGS. 16A, 16B, and 16C, respectively and are obtained with an electron-beam diameter of about 1 nmϕ. An electron diffraction pattern in Point 4 (the whole film) shown in FIG. 15 corresponds to FIG. 16D and is obtained with an electron-beam diameter of about 50 nmϕ.

A pattern formed by spots (bright points) is observed in each of the electron diffraction patterns of Point 1 (on the surface side of the film) and Point 2 (the center of the film), and a slightly broken pattern is observed in Point 3 (on the base side of the film). This indicates that the crystal state varies in the thickness direction in the CAAC-OS film. Note that a pattern formed by spots (bright points) is observed in Point 4 (the whole film), which indicates that the whole film is a CAAC-OS film or a film including a CAAC-OS film.

<Method for Forming CAAC-OS Film>

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

There are three methods for forming a CAAC-OS film.

The first method is to form an oxide semiconductor film at a temperature higher than or equal to 100° C. and lower than or equal to 450° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

<Target and Method for Manufacturing Target>

First, a method for manufacturing a sputtering target is described with reference to FIGS. 23A and 23B.

Figure 23A:
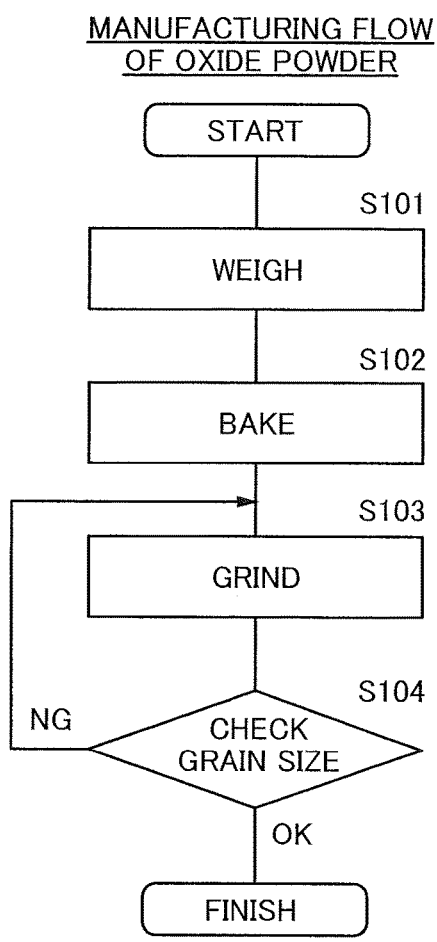
FIGS. 23A and 23B show a method for manufacturing a sputtering target.

FIG. 23A shows manufacture of an oxide powder containing a plurality of metal elements to be the sputtering target. First, the oxide powder is weighed in a step S101.

Here, description is given on the case where an oxide powder containing In, M, and Zn (also referred to as an In-M-Zn oxide powder) is obtained as the oxide powder containing a plurality of metal elements. Specifically, an $InO_X$ oxide powder, an $MO_Y$ oxide powder, and a $ZnO_Z$ oxide powder are prepared as a raw material. Note that X, Y, and Z are each a given positive number; for example, X Y, and Z are 1.5, 1.5, and 1, respectively. It is needless to say that the above oxide powders are examples, and oxide powders can be selected as appropriate in order to obtain a desired composition. Note that M refers to Ga, Sn, Hf, Al, La, Ce, Pr, Nd, Sm, Eu, Gd, Tb, Dy, Ho, Er, Tm, Yb, or Lu. Although the case where three kinds of oxide powders are used is shown as an example in this embodiment, one embodiment of the present invention is not limited thereto. For example, this embodiment may be applied to the case where four or more kinds of oxide powders are used or the case where one or two kinds of oxide powders are used.

Next, the $InO_X$ oxide powder, the $MO_Y$ oxide powder, and the $ZnO_Z$ oxide powder are mixed in a predetermined mole ratio.

For example, the predetermined mole ratio of the $InO_X$ oxide powder, the $MO_Y$ oxide powder, and the $ZnO_Z$ oxide powder is 2:2:1, 8:4:3, 3:1:1, 1:1:1, 4:2:3, 1:1:2, 3:1:4, 1:3:2, 1:3:4, 1:3:6, 1:3:8, 1:3:10, 1:3:12, 1:6:4, 1:6:6, 1:6:8, 1:6:10, 1:6:12, 1:6:14, 1:6:16, 1:6:20, or 3:1:2. With such a mole ratio, a sputtering target including a polycrystalline oxide with high crystallinity can be obtained easily later.

Next, in a step S102, an In-M-Zn oxide is obtained by performing first baking on the $InO_X$ oxide powder, the $MO_Y$ oxide powder, and the $ZnO_Z$ oxide powder which are mixed in a predetermined mole ratio.

Note that the first baking is performed in an inert atmosphere, an oxidation atmosphere, or under a reduced pressure at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than the main reaction can be suppressed, and the impurity concentration in the In-M-Zn oxide powder can be reduced. Accordingly, the crystallinity of the In-M-Zn oxide powder can be increased.

The first baking may be performed plural times at different temperatures and/or in different atmospheres. For example, the In-M-Zn oxide powder may be first held at a first temperature in a first atmosphere and then at a second temperature in a second atmosphere. Specifically, it is preferable that the first atmosphere be an inert atmosphere or under a reduced pressure and the second atmosphere be an oxidation atmosphere. This is because oxygen vacancies are generated in the In-M-Zn oxide when impurities contained in the In-M-Zn oxide powder are reduced in the first atmosphere. Therefore, it is preferable that oxygen vacancies in the obtained In-M-Zn oxide be reduced in the second atmosphere. The impurity concentration and oxygen vacancies in the In-M-Zn oxide are reduced, whereby the crystallinity of the In-M-Zn oxide powder can be increased.

Next, the In-M-Zn oxide powder is obtained by grinding the In-M-Zn oxide in a step S103.

The In-M-Zn oxide has a high proportion of crystals with structures of planes parallel to the a-b plane. Therefore, the obtained In-M-Zn oxide powder includes many flat plate-like crystal grains whose top and bottom surfaces are parallel to the a-b plane. Moreover, the crystal of the In-M-Zn oxide is in many cases a hexagonal crystal; therefore, in many cases, the above flat plate-like crystal grains each have the shape of a hexagonal cylinder whose top and bottom surfaces are approximately equilateral hexagons each having interior angles of 120°.

Next, the grain size of the obtained In-M-Zn oxide powder is checked in a step S104. Here, the average grain size of the In-M-Zn oxide powder is checked to be less than or equal to 3 µm, preferably less than or equal to 2.5 µm, more preferably less than or equal to 2 µm. Note that the step S104 may be omitted and only the In-M-Zn oxide powder whose grain size is less than or equal to 3 µm, preferably less than or equal to 2.5 µm, more preferably less than or equal to 2 µm may be sifted using a grain size filter. The average grain size of the In-M-Zn oxide powder can be certainly less than or equal to 3 µm, preferably less than or equal to 2.5 µm, more preferably less than or equal to 2 µm by sifting the In-M-Zn oxide powder whose grain size is less than or equal to 3 µm, preferably less than or equal to 2.5 µm, more preferably less than or equal to 2 µm.

In the case where the average grain size of the In-M-Zn oxide powder exceeds a predetermined size in the step S104, the procedure returns to the step S103 and the In-M-Zn oxide powder is ground again.

In the above manner, the In-M-Zn oxide powder whose average grain size is less than or equal to 3 µm, preferably less than or equal to 2.5 µm, more preferably less than or equal to 2 µm can be obtained. Note that the grain size of a crystal grain included in a sputtering target to be formed later can be reduced by obtaining the In-M-Zn oxide powder whose average grain size is less than or equal to 3 µm, preferably less than or equal to 2.5 µm, more preferably less than or equal to 2 µm.

Figure 23B:
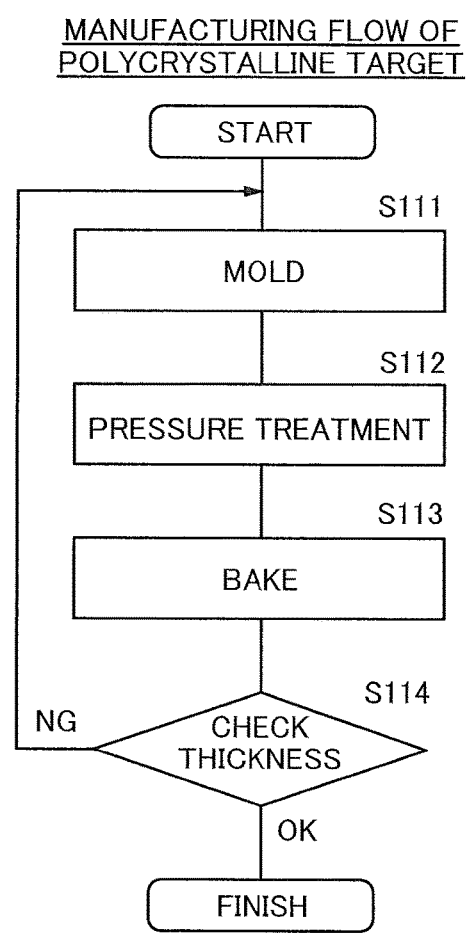

Next, in FIG. 23B, a sputtering target is formed using the In-M-Zn oxide powder obtained in the flow chart shown in FIG. 23A.

In a step S111, the In-M-Zn oxide powder is made to spread over a mold and molded. Here, molding refers to making powder or the like spread over a mold to obtain a uniform thickness. Specifically, the In-M-Zn oxide powder is introduced to the mold, and then vibration is externally applied so that the In-M-Zn oxide powder is molded. Alternatively, the In-M-Zn oxide powder is introduced to the mold, and then molding is performed using a roller or the like so as to obtain a uniform thickness. Note that in the step S111, slurry in which the In-M-Zn oxide powder is mixed with water, a dispersant, and a binder may be molded. In that case, the slurry is poured into the mold and then molded by sucking the mold from the bottom. After that, drying treatment is performed on a molded body after the mold is sucked. The drying treatment is preferably natural drying because the molded body is less likely to be cracked. After that, the molded body is subjected to heat treatment at a temperature higher than or equal to 300° C. and lower than or equal to 700° C., so that residual moisture or the like which cannot be taken out by natural drying is removed.

When the In-M-Zn oxide powder including many flat plate-like crystal grains whose top and bottom surfaces are parallel to the a-b plane is made to spread over the mold and molded, the crystal grains are arranged with the planes which are parallel to the a-b plane thereof facing upward. Therefore, the proportion of the surface structures of planes parallel to the a-b plane can be increased in such a manner that the obtained In-M-Zn oxide powder is made to spread over the mold and molded. Note that the mold may be formed of a metal or an oxide and the upper shape thereof is rectangular or rounded.

Next, first pressure treatment is performed on the In-M-Zn oxide powder in a step S112. After that, in a step S113, second baking is performed to obtain a plate-like In-M-Zn oxide. The second baking is performed under conditions similar to those of the first baking. The crystallinity of the In-M-Zn oxide can be increased by performing the second baking.

Note that the first pressure treatment may be performed in any manner as long as the In-M-Zn oxide powder can be pressed. For example, a weight which is formed of the same kind of material as the mold can be used. Alternatively, the In-M-Zn oxide powder may be pressed under a high pressure using compressed air. Besides, the first pressure treatment can be performed using a variety of techniques. Note that the first pressure treatment may be performed at the same time as the second baking.

Planarization treatment may be performed after the first pressure treatment. As the planarization treatment, CMP treatment or the like can be employed.

The plate-like In-M-Zn oxide thus obtained becomes a polycrystalline oxide with high crystallinity.

Next, the thickness of the obtained plate-like In-M-Zn oxide is checked in a step S114. When the thickness of the plate-like In-M-Zn oxide is less than a desired thickness, the procedure returns to the step S111 and the In-M-Zn oxide powder is made to spread over the plate-like In-M-Zn oxide and molded. When the plate-like In-M-Zn oxide has a desired thickness in the step S114, the plate-like In-M-Zn oxide is used as a sputtering target. The description of the case where the thickness of the plate-like In-M-Zn oxide is less than a desired thickness is given below.

Next, in the step S112, second pressure treatment is performed on the plate-like In-M-Zn oxide and the In-M-Zn oxide powder over the plate-like In-M-Zn oxide. Then, in the step S113, third baking is performed, whereby a plate-like In-M-Zn oxide whose thickness is increased by the thickness of the In-M-Zn oxide powder is obtained. A plate-like In-M-Zn oxide with an increased thickness is obtained through crystal growth with use of the plate-like In-M-Zn oxide as a seed crystal; therefore, the plate-like In-M-Zn oxide is a polycrystalline oxide with high crystallinity.

Note that the third baking is performed under conditions similar to those of the second baking. The second pressure treatment is performed under conditions similar to those of the first pressure treatment. Note that the second pressure treatment may be performed at the same time as the third baking.

The thickness of the obtained plate-like In-M-Zn oxide is checked again in the step S114.

Through the above steps, the thickness of the plate-like In-M-Zn oxide can be gradually increased while the crystal alignment is improved.

By repeating these steps of increasing the thickness of a plate-like In-M-Zn oxide n times (n is a natural number), the plate-like In-M-Zn oxide having a desired thickness (t), for example, greater than or equal to 2 mm and less than or equal to 20 mm, preferably greater than or equal to 3 mm and less than or equal to 20 mm can be obtained. The plate-like In-M-Zn oxide is used as a sputtering target.

After that, planarization treatment may be performed.

Note that fourth baking may be performed on the obtained sputtering target. The fourth baking is performed under conditions similar to those of the first baking. A sputtering target including a polycrystalline oxide with much higher crystallinity can be obtained by performing the fourth baking.

Note that the sputtering target formed in such a manner can have high density. When the density of the sputtering target is increased, the density of a film to be formed can also be increased.

Specifically, the relative density of the sputtering target can be set to be higher than or equal to 90%, preferably higher than or equal to 95%, more preferably higher than or equal to 99%. Note that the relative density of the sputtering target refers to a ratio between the density of the sputtering target and the density of a substance which is free of porosity and has the same composition as the sputtering target.

Note that the structure and the like described in this embodiment can be used as appropriate in combination with any of the structures and the like in the other embodiments.

Embodiment 2

In this embodiment, an example in which an oxide semiconductor film having a microcrystalline structure is used as one layer of the stack is described. Here, an oxide semiconductor film having a microcrystalline structure is referred to as a microcrystalline oxide semiconductor film (also referred to as an nc-OS or a nanocrystalline oxide semiconductor).

Figure 24:
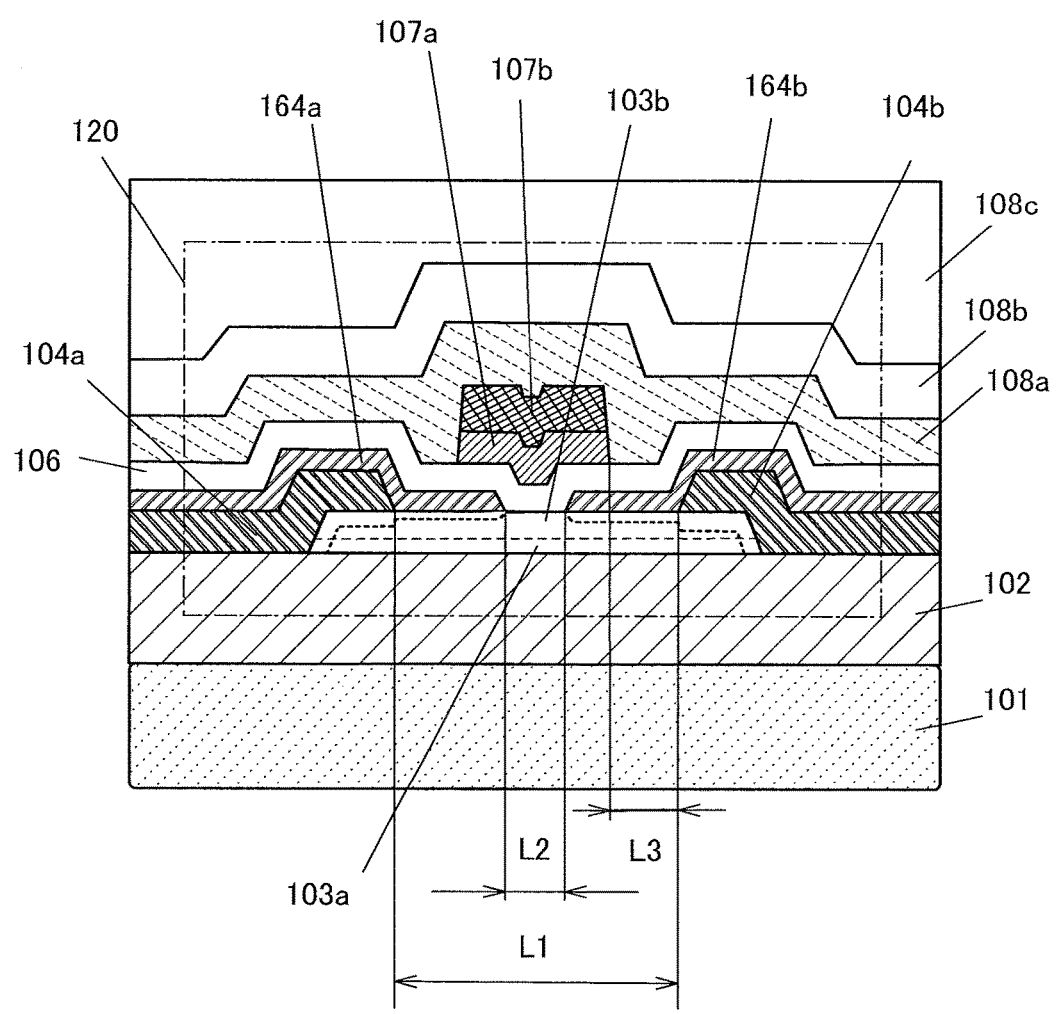
FIG. 24 is a cross-sectional view of a semiconductor device of one embodiment of the present invention.

Further, a structure of a transistor having a structure different from the structure of the transistor in Embodiment 1 is described with reference to FIG. 24. Note that a structure of a transistor 120 illustrated in FIG. 24 is partly different from the structure of FIGS. 3A to 3C; therefore, the same portions as those in FIGS. 3A to 3C are denoted by the same reference numerals.

The oxide semiconductor layer 103c in FIGS. 3A to 3C has a single-layer structure. On the other hand, an example of a stacked-layer structure in which the second oxide layer 103b is formed over the first oxide layer 103a is illustrated in FIG. 24.

The first oxide layer 103a is formed by a sputtering method under the following conditions: a polycrystalline target was used; the substrate temperature is higher than or equal to −50° C. and lower than or equal to 50° C., preferably higher than or equal to −10° C. and lower than or equal to 10° C.; and a film formation gas whose dew point is lower than or equal to −80° C., preferably lower than or equal to −100° C., more preferably lower than or equal to −120° C. is used. As a material of the first oxide layer 103a, for example, an oxide semiconductor containing indium, zinc, and gallium can be used. Specifically, the first oxide layer 103a can be formed using an In—Ga—Zn oxide whose atomic ratio of In to Ga and Zn is 1:3:2, an In—Ga—Zn oxide whose atomic ratio of In to Ga and Zn is 1:6:4, an In—Ga—Zn oxide whose atomic ratio of In to Ga and Zn is 1:9:6, or an oxide having a composition which is in the neighborhood of any of the above atomic ratios. In this embodiment, deposition is performed using an In—Ga—Zn-based oxide target whose atomic ratio of In to Ga and Zn is 1:3:2 under an atmosphere containing oxygen. The first oxide layer 103a obtained under such conditions is a microcrystalline oxide semiconductor film.

The second oxide layer 103b is formed by a sputtering method under the following conditions: a polycrystalline target was used; the substrate temperature is higher than or equal to 150° C. and lower than or equal to 450° C.; and a film formation gas whose dew point is lower than or equal to −80° C., preferably lower than or equal to −100° C., more preferably lower than or equal to −120° C. is used. As a material of the second oxide layer 103b, for example, an oxide semiconductor containing indium, zinc, and gallium can be used. Specifically, the second oxide layer 103b can be formed using an In—Ga—Zn oxide whose atomic ratio of In to Ga and Zn is 1:1:1, an In—Ga—Zn oxide whose atomic ratio of In to Ga and Zn is 3:1:2, or an oxide having a composition which is in the neighborhood of any of the above atomic ratios. In this embodiment, deposition is performed using an In—Ga—Zn-based oxide target whose atomic ratio of In to Ga and Zn is 1:1:1 under an atmosphere containing oxygen. The second oxide layer 103b obtained under such conditions is a CAAC-OS film. Note that the thickness of the second oxide layer 103b is preferably larger than that of the first oxide layer 103a.

Note that although an example of a structure in which the layers formed using different targets so as to have different crystal states are stacked is described in this embodiment, there is no particular limitation thereto, and a structure in which the layers formed using the same target and having different crystal states by changing the deposition temperature are stacked may be employed. Further, when a film is formed on and in contact with the insulating layer 102 under the film formation conditions for forming the CAAC-OS film, a region of the film in contact with the insulating layer 102 can be made a microcrystalline oxide semiconductor film depending on a material and a surface condition of the insulating layer 102, and the CAAC-OS film can be formed thereover.

Further, the source electrode 104a and the drain electrode 104b are formed using a conductive material which is easily bonded to oxygen. The source electrode 164a and the drain electrode 164b are formed using a conductive material which is not easily bonded to oxygen compared to a material for the source electrode 104a and the drain electrode 104b. Specifically, a tungsten film is used for the source electrode 104a and the drain electrode 104b, and a tungsten nitride film is used for the source electrode 164a and the drain electrode 164b. As illustrated by a dotted line in FIG. 24, the depth of an n-type region can be made different. Further, in order to make a channel formation region i-type, after formation of the insulating layer 106, oxygen may be supplied to the first oxide layer 103a and the second oxide layer 103b by ion implantation of oxygen.

A microcrystalline oxide semiconductor film used as the first oxide layer 103a includes a microcrystal with a size greater than or equal to 1 nm and less than 10 nm, for example.

The nanocrystalline oxide semiconductor film is macroscopically equivalent to a film having disordered atomic arrangement. For this reason, in some cases, a peak indicating an orientation is not observed in X-ray diffraction analysis which is performed on a large area of a measurement sample (for example, in which the beam diameter is larger than that of the sputtered particle). Further, in some cases, an electron diffraction pattern obtained by using an electron beam with a diameter larger than that of the sputtered particle is a halo pattern. In this case, for example, a nanocrystalline oxide semiconductor film is measured with an electron-beam diameter much smaller than the sputtered particle, whereby a spot (bright point) can be observed in the obtained nanobeam electron diffraction pattern.

<Localized Level of Nanocrystalline Oxide Semiconductor Film>

A localized level of a nanocrystalline oxide semiconductor film is described. Here, measurement results of a nanocrystalline oxide semiconductor film by a CPM are described.

First, a structure of a measurement sample is described.

The measurement sample includes a nanocrystalline oxide semiconductor film provided over a glass substrate, a pair of electrodes in contact with the nanocrystalline oxide semiconductor film, and an insulating film covering the nanocrystalline oxide semiconductor film and the pair of electrodes.

Next, a method for forming the nanocrystalline oxide semiconductor film included in the measurement sample is described.

A first nanocrystalline oxide semiconductor film was formed by a sputtering method under the following conditions: a metal oxide target which is an In—Ga—Zn-oxide target (In:Ga:Zn=1:1:1 [atomic ratio]) was used; an argon gas with a flow rate of 30 sccm and an oxygen gas with a flow rate of 15 sccm were used as a deposition gas; the pressure was 0.4 Pa; the substrate temperature was a room temperature; and a DC power of 0.5 kW was supplied.

The first nanocrystalline oxide semiconductor film was heated at 450° C. in a nitrogen atmosphere for one hour and then heated at 450° C. in an oxygen atmosphere for one hour to release hydrogen contained in the first nanocrystalline oxide semiconductor film and supply oxygen to the first nanocrystalline oxide semiconductor film, so that a second nanocrystalline oxide semiconductor film was formed.

Next, the measurement sample including the first nanocrystalline oxide semiconductor film and the measurement sample including the second nanocrystalline oxide semiconductor film were subjected to CPM measurement. Specifically, the amount of light with which a surface of the measurement sample between terminals is irradiated is adjusted so that a photocurrent value is kept constant in the state where voltage is applied between a pair of electrodes provided in contact with the nanocrystalline oxide semiconductor film, and then an absorption coefficient is calculated from the amount of the irradiation light in an intended wavelength range.

Figure 25A:
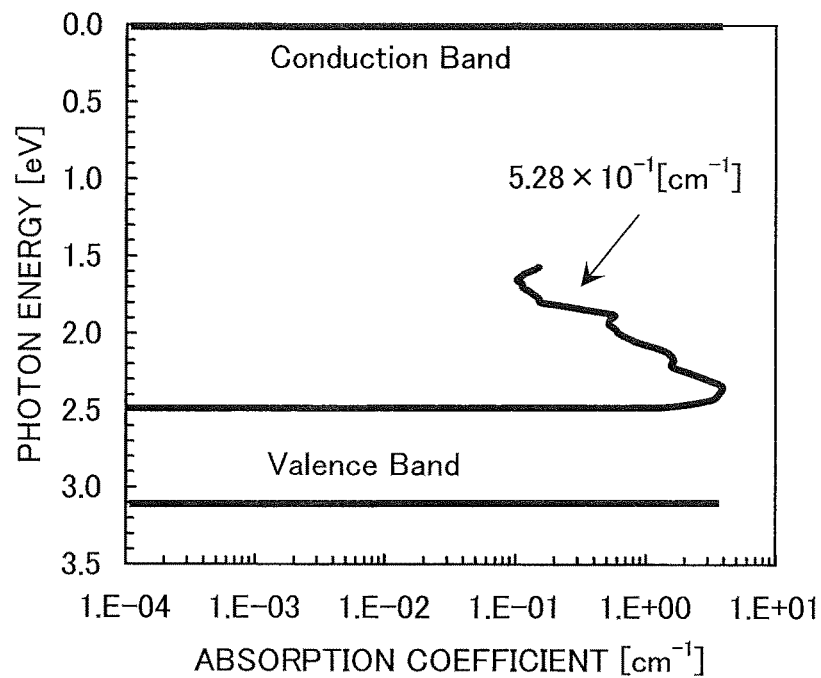
FIGS. 25A and 25B are each a graph showing results of CPM measurement of an oxide semiconductor film.
Figure 25B:
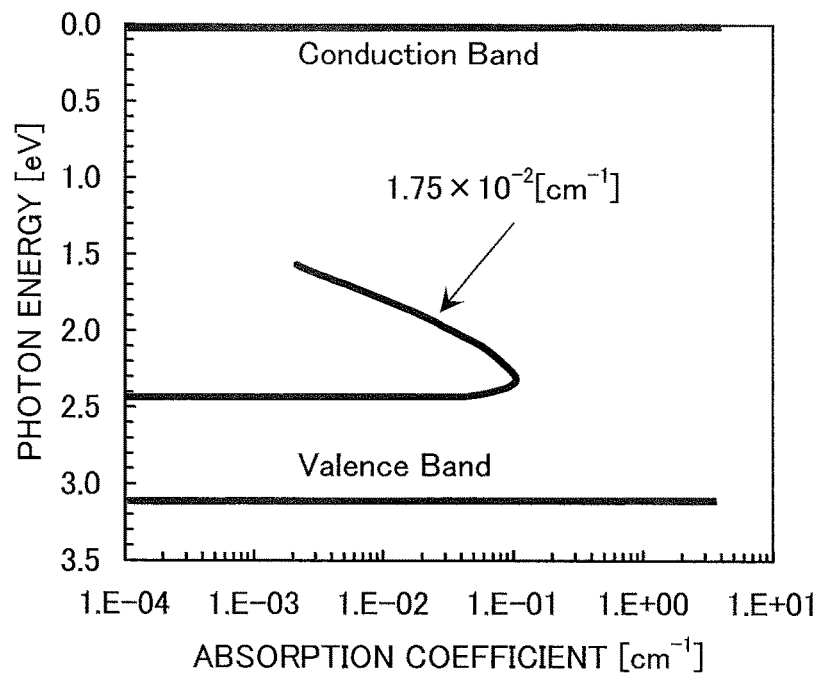

An absorption coefficient shown in each of FIGS. 25A and 25B was obtained by removing an absorption coefficient due to the band tail from an absorption coefficient obtained by CPM measurement of the measurement samples. That is, an absorption coefficient due to defects is shown in FIGS. 25A and 25B. In FIGS. 25A and 25B, the horizontal axis indicates the absorption coefficient, and the vertical axis indicates the photon energy. The bottom of the conduction band and the top of the valence band of the nanocrystalline oxide semiconductor film are set to 0 eV and 3.15 eV, respectively, on the vertical axis in FIGS. 25A and 25B. Each curve in FIGS. 25A and 25B represents a relation between the absorption coefficient and photon energy, which corresponds to defect states.

FIG. 25A shows measurement results of the measurement sample including the first nanocrystalline oxide semiconductor film, and an absorption coefficient due to defect states is $5.28 \times 10^{-1}$ cm$^{-1}$. FIG. 25B shows measurement results of the measurement sample including the second nanocrystalline oxide semiconductor film, and an absorption coefficient due to defect states is $1.75 \times 10^{-2}$ cm$^{-1}$.

Thus, by the heat treatment, the defects included in the nanocrystalline oxide semiconductor film can be reduced.

The film densities of the first nanocrystalline oxide semiconductor film and the second nanocrystalline oxide semiconductor film were measured by X-ray reflectometry (XRR). The film density of the first nanocrystalline oxide semiconductor film was 5.9 g/cm$^3$, and the film density of the second nanocrystalline oxide semiconductor film was 6.1 g/cm$^3$.

Thus, by the heat treatment, the film density of the nanocrystalline oxide semiconductor film can be increased.

That is, in the nanocrystalline oxide semiconductor film, as the film density is increased, the defects in the film are reduced.

Electron diffraction patterns of nanocrystalline oxide semiconductor films are described with reference to FIGS. 26A to 26D, FIGS. 27A and 27B, FIG. 28, FIG. 29, FIGS. 30A and 30B, FIG. 31, and FIGS. 32A to 32C.

An electron diffraction pattern obtained by electron diffraction with a beam diameter of 10 nmϕ or less (nanobeam electron diffraction) of a nanocrystalline oxide semiconductor film is neither a halo pattern indicating an amorphous state nor a pattern with spots having regularity indicating a crystalline state in which crystals are aligned with a specific plane. That is, the nanocrystalline oxide semiconductor film is an oxide semiconductor film whose electron diffraction pattern has spots not having directionality.

Figure 26A:
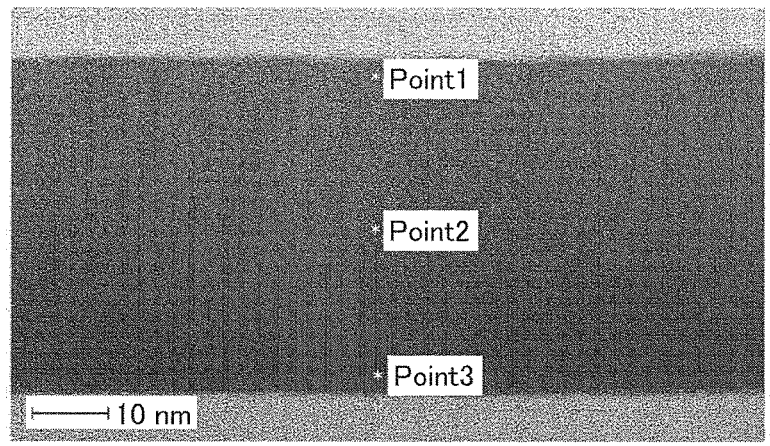
FIG. 26A is a cross-sectional TEM image of a nanocrystalline oxide semiconductor film.
Figure 26B:
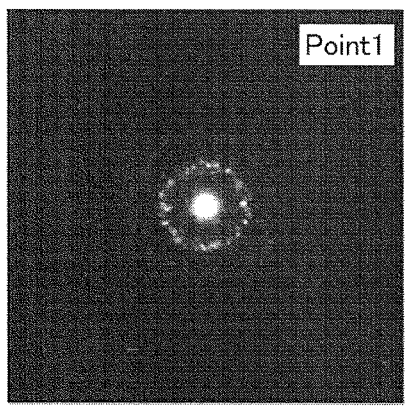
FIGS. 26B to 26D are nanobeam electron diffraction patterns thereof.
Figure 26C:
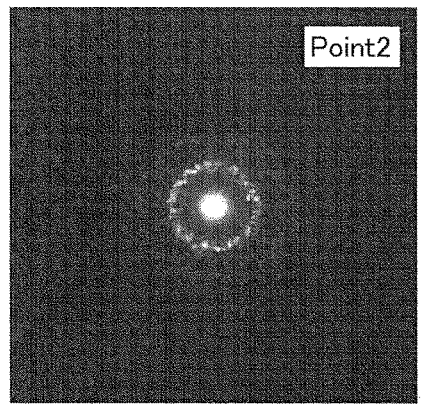
Figure 26D:
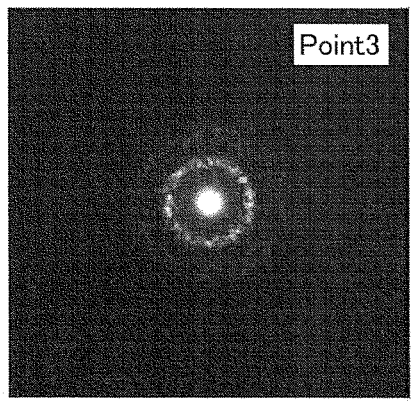

FIG. 26A is a cross-sectional transmission electron microscopy (TEM) image of a nanocrystalline oxide semiconductor film. FIGS. 26B, 26C, and 26D show electron diffraction patterns obtained by nanobeam electron diffraction performed on Points 1, 2, 3 in FIG. 26A, respectively.

A sample in which an In—Ga—Zn-based oxide film was formed, as an example of the nanocrystalline oxide semiconductor film in FIGS. 26A to 26D, over a quartz glass substrate to a thickness of 50 nm was used. The nanocrystalline oxide semiconductor film shown in FIGS. 26A to 26D was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the width of the formed nanocrystalline oxide semiconductor film was reduced to 100 nm or less (e.g., 40 nm±10 nm), and a cross-sectional TEM image and nanobeam electron diffraction patterns were obtained.

FIG. 26A is the cross-sectional TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 2,000,000 times. FIGS. 26B to 26D show the electron diffraction patterns obtained by nanobeam electron diffraction with a beam diameter of about 1 nmϕ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmϕ is greater than or equal to 5 nmϕ and less than or equal to 10 nmϕ.

As shown in FIG. 26B, in the nanobeam electron diffraction pattern of the nanocrystalline oxide semiconductor film, a plurality of circumferentially arranged spots (bright points) are observed. In other words, in the pattern of the nanocrystalline oxide semiconductor film, a plurality of circumferentially (concentrically) distributed spots are observed, or a plurality of circumferentially distributed spots form a plurality of concentric circles.

In FIG. 26C showing the central portion of the nanocrystalline oxide semiconductor film in the thickness direction and in FIG. 26D showing the vicinity of an interface between the nanocrystalline oxide semiconductor film and the quartz glass substrate, a plurality of circumferentially distributed spots are observed as in FIG. 26B. In FIG. 26C, the distance from a main spot to each of the circumferentially distributed spots is in a range from 3.88/nm to 4.93/nm, or from 0.203 nm to 0.257 nm when converted into interplanar spacing.

The nanobeam electron diffraction patterns shown in FIGS. 26B to 26D indicate that the nanocrystalline oxide semiconductor film includes a plurality of crystal parts whose surface orientations are random and whose sizes are different from each other.

Figure 27A:
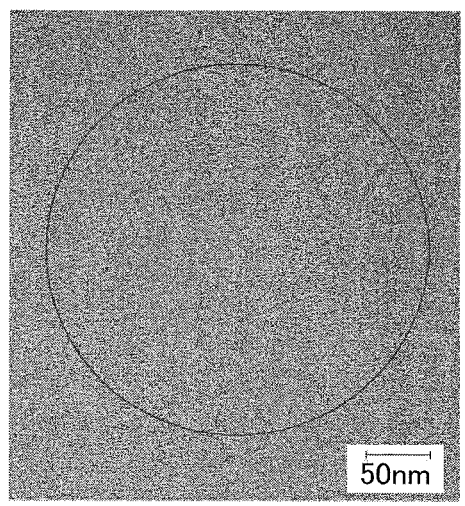
FIG. 27A is a plane TEM image of a nanocrystalline oxide semiconductor film.
Figure 27B:
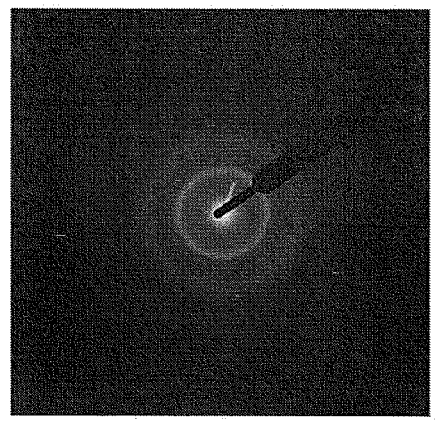
FIG. 27B is a selected-area electron diffraction pattern thereof.

FIG. 27A is a plane TEM image of a nanocrystalline oxide semiconductor film. FIG. 27B shows an electron diffraction pattern obtained by selected-area electron diffraction performed on a region surrounded by a circle in FIG. 27A.

A sample in which an In—Ga—Zn-based oxide film was formed, as an example of the nanocrystalline oxide semiconductor film shown in FIGS. 27A and 27B, over a quartz glass substrate to a thickness of 30 nm was used. The nanocrystalline oxide semiconductor film shown in FIGS. 27A and 27B was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the sample was thinned, and the plane TEM image and the selected-area electron diffraction pattern of the nanocrystalline oxide semiconductor film were obtained.

FIG. 27A is the plane TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 500,000 times. FIG. 27B is the electron diffraction pattern obtained by electron diffraction with a selected area of 300 nmφ. Note that the measurement area is greater than or equal to 300 nmφ in consideration of electron beam expansion.

As shown in FIG. 27B, the electron diffraction pattern of the nanocrystalline oxide semiconductor film which was obtained by selected-area electron diffraction the measurement area of which is wider than that of the nanobeam electron diffraction is a halo pattern, in which the plurality of spots observed by the nanobeam electron diffraction are not observed.

Figure 32A:
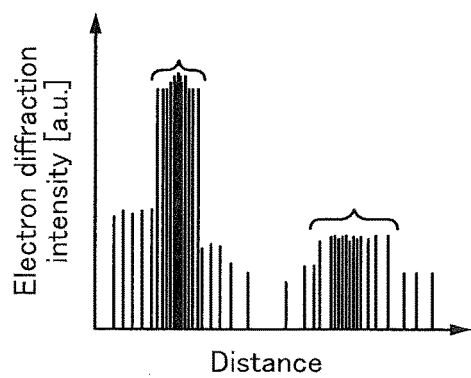
FIGS. 32A to 32C are conceptual diagrams of electron diffraction intensity distribution.
Figure 32B:
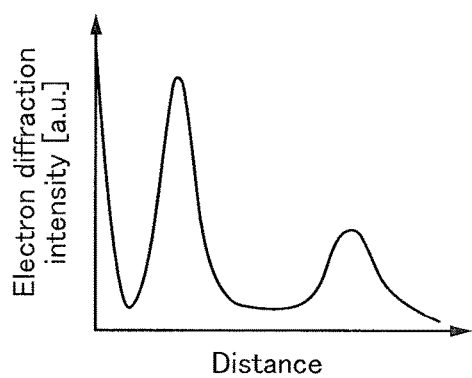
Figure 32C:
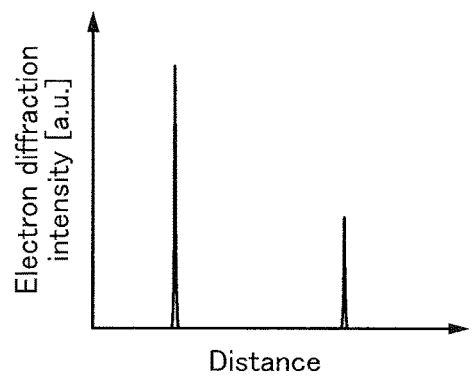

FIGS. 32A to 32C conceptually show diffraction intensity distribution in the electron diffraction patterns shown in FIGS. 26B to 26D and FIG. 27B. FIG. 32A is a conceptual diagram showing diffraction intensity distribution in the nanobeam electron diffraction patterns shown in FIGS. 26B to 26D. FIG. 32B is a conceptual diagram showing diffraction intensity distribution in the selected-area electron diffraction pattern shown in FIG. 27B. FIG. 32C is a conceptual diagram showing diffraction intensity distribution in an electron diffraction pattern of a single crystal structure or a polycrystalline structure.

In each of FIGS. 32A to 32C, the vertical axis represents the electron diffraction intensity (arbitrary unit) indicating distribution of spots or the like and the horizontal axis represents the distance from a main spot.

In each of FIGS. 32A to 32C, spots are observed at a specific distance from the main spot, which is based on interplanar spacing (d value).

As shown in each of FIGS. 26B to 26D, a circumferential region formed by the plurality of spots observed in the nanobeam electron diffraction pattern of the nanocrystalline oxide semiconductor film has a relatively large width. Thus, FIG. 32A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the nanocrystalline oxide semiconductor film is continuous as shown in FIG. 32B. Since FIG. 32B can approximate a result obtained by widely observing the electron diffraction intensity distribution shown in FIG. 32A, the continuous intensity distribution can be considered to result from the overlapping and connection of the plurality of spots.

FIGS. 32A to 32C indicate that the nanocrystalline oxide semiconductor film includes a plurality of crystal parts whose surface orientations are random and whose sizes are different from each other and that the crystal parts are so minute that spots are not observed in the selected-area electron diffraction pattern.

In FIGS. 26B to 26D in which the plurality of spots are observed, the width of the nanocrystalline oxide semiconductor film is 50 nm or less. Further, since the diameter of the electron beam was reduced to 1 nmφ, the measurement area is greater than or equal to 5 nm and less than or equal to 10 nm. Thus, it is assumed that the diameter of the crystal part included in the nanocrystalline oxide semiconductor film is 50 nm or less, for example, 10 nm or less or 5 nm or less.

Figure 28:
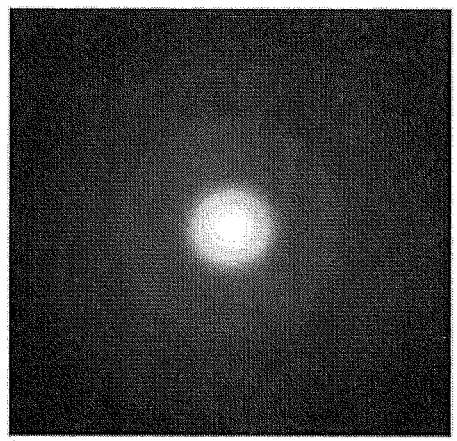
FIG. 28 shows a nanobeam electron diffraction pattern of a quartz glass substrate.

FIG. 28 shows a nanobeam electron diffraction pattern of a quartz glass substrate. The measurement conditions were similar to those for the electron diffraction patterns shown in FIGS. 26B to 26D.

As shown in FIG. 28, the nanobeam electron diffraction pattern of the quartz glass substrate having an amorphous structure is a halo pattern without specific spots in which the luminance is gradually changed form a main spot. This means that a plurality of circumferentially distributed spots like those observed in the pattern of the nanocrystalline oxide semiconductor film are not observed in the pattern of a film having an amorphous structure even when electron diffraction is performed on a minute region. This indicates that the plurality of circumferentially distributed spots observed in FIGS. 26B to 26D are peculiar to the nanocrystalline oxide semiconductor film.

Figure 29:
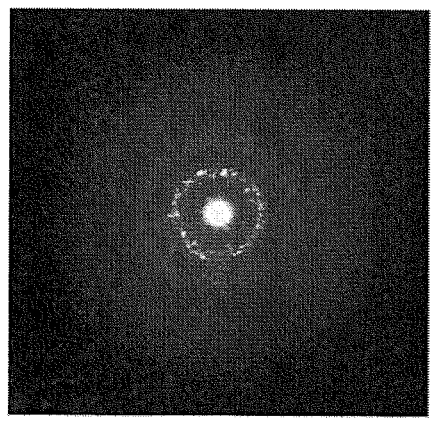
FIG. 29 shows a cross-sectional TEM image of a nanocrystalline oxide semiconductor film.

FIG. 29 shows an electron diffraction pattern obtained after one-minute irradiation of Point 2 in FIG. 26A with an electron beam whose diameter was reduced to about 1 nmφ.

As in the electron diffraction pattern shown in FIG. 26C, a plurality of circumferentially distributed spots are observed in the electron diffraction pattern shown in FIG. 29, and there is no significant difference from FIG. 26C. This means that the crystal part observed in the electron diffraction pattern shown in FIG. 26C existed at the time of the formation of the oxide semiconductor film and did not result from irradiation with the electron beam with the reduced diameter.

Figure 30A:
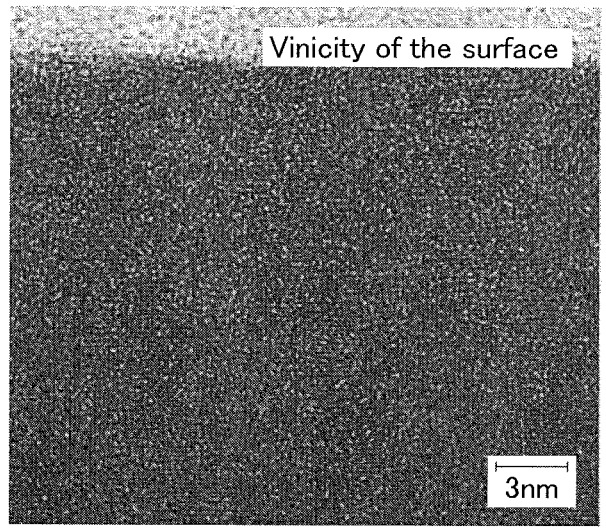
FIGS. 30A and 30B each show a cross-sectional TEM image of a nanocrystalline oxide semiconductor film.
Figure 30B:
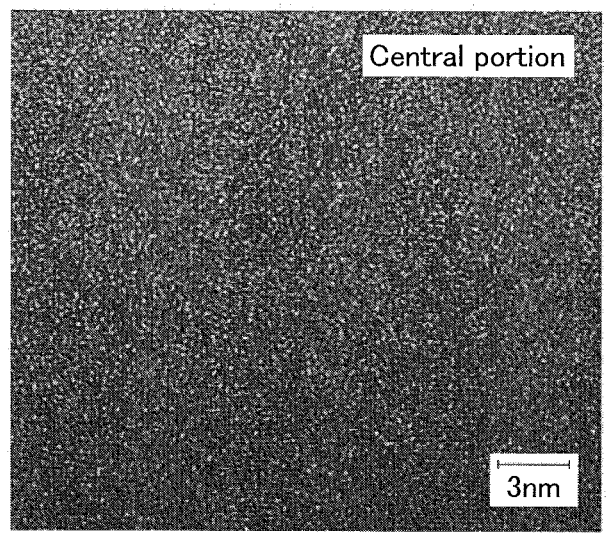

FIGS. 30A and 30B are enlarged images of portions in the cross-sectional TEM image of FIG. 26A. FIG. 30A is a cross-sectional TEM image of the vicinity of Point 1 (the surface of the nanocrystalline oxide semiconductor film) in FIG. 26A, which was observed at an observation magnification of 8,000,000 times. FIG. 30B is a cross-sectional TEM image of the vicinity of Point 2 (the central portion of the nanocrystalline oxide semiconductor film in the thickness direction) in FIG. 26A, which was observed at an observation magnification of 8,000,000 times.

According to each of the TEM images of FIGS. 30A and 30B, a crystalline structure cannot be clearly observed in the nanocrystalline oxide semiconductor film.

Figure 31:
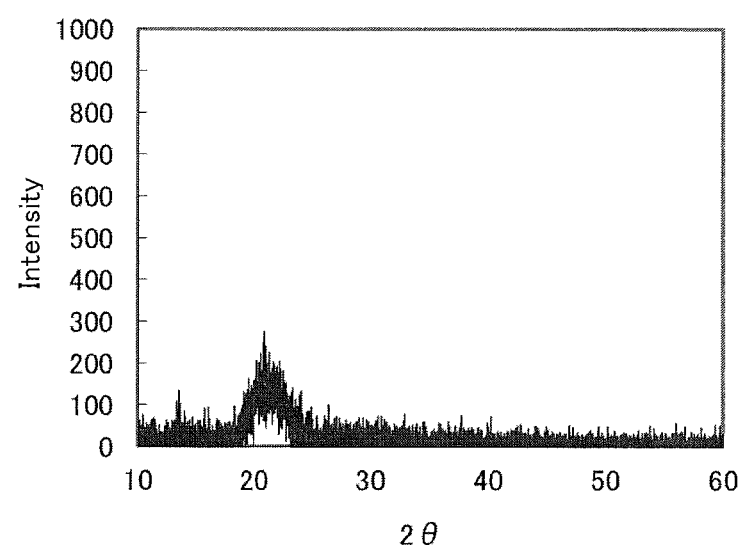
FIG. 31 shows an XRD spectrum of a nanocrystalline oxide semiconductor film.

The samples for the electron diffraction patterns shown in FIGS. 26A to 26D and FIGS. 27A and 27B, in each of which the nanocrystalline oxide semiconductor film of this embodiment was formed over the quartz glass substrate, were analyzed by X-ray diffraction (XRD). FIG. 31 shows an XRD spectrum of the samples measured by an out-of-plane method.

In FIG. 31, the vertical axis represents the X-ray diffraction intensity (arbitrary unit) and the horizontal axis represents the diffraction angle 2θ (degree). Note that the XRD spectrum was measured with an X-ray diffractometer, D8 ADVANCE manufactured by Bruker AXS.

As shown in FIG. 31, a peak corresponding to quartz is observed at around 2θ=20° to 23°; however, a peak corresponding to the crystal part included in the nanocrystalline oxide semiconductor film cannot be observed.

The results in FIGS. 30A and 30B and FIG. 31 also indicate that the crystal part included in the nanocrystalline oxide semiconductor film is minute.

As described above, in the case of the nanocrystalline oxide semiconductor film of this embodiment, a peak indicating an orientation was not observed by X-ray diffraction (XRD) analysis the measurement area of which is wide and the electron diffraction pattern obtained by selected-area electron diffraction the measurement area of which is wide is a halo pattern. This indicates that the nanocrystalline oxide semiconductor film of this embodiment is macroscopically equivalent to a film having disordered atomic arrangement. However, spots (bright points) can be observed in the nanobeam electron diffraction pattern of the nanocrystalline oxide semiconductor film which was obtained by nanobeam electron diffraction in which the diameter of an electron beam is sufficiently small (e.g., 10 nmϕ or less). Thus, it can be assumed that the nanocrystalline oxide semiconductor film of this embodiment is a film in which minute crystal parts having random surface orientations (e.g., crystal parts each with a diameter of 10 nm or less, 5 nm or less, or 3 nm or less) cohere. A nanocrystal region including the minute crystal parts is included in the entire region of the nanocrystalline oxide semiconductor film in the thickness direction.

<Method for Forming Nanocrystalline Oxide Semiconductor Film>

Next, a method of forming the nanocrystalline oxide semiconductor film is described below. The nanocrystalline oxide semiconductor film is formed by a sputtering method under an atmosphere containing oxygen at temperature higher than or equal to room temperature and lower than or equal to 75° C., preferably higher than or equal to room temperature and lower than or equal to 50° C. With use of the atmosphere containing oxygen, oxygen vacancies in the nanocrystalline oxide semiconductor film can be reduced and a film including a nanocrystal region can be formed.

A reduction of oxygen vacancies in the nanocrystalline oxide semiconductor film allows the formation of a film having stable physical properties. In particular, in the case of manufacturing a semiconductor device using a nanocrystalline oxide semiconductor film, oxygen vacancies in the nanocrystalline oxide semiconductor film are easily bonded to hydrogen, which is a factor of a variation in the electric characteristics of the semiconductor device. Thus, a semiconductor device formed using a nanocrystalline oxide semiconductor film in which oxygen vacancies are reduced can be highly reliable.

Note that it is preferable to increase the oxygen partial pressure in the deposition atmosphere because the oxygen vacancies in the nanocrystalline oxide semiconductor film can be further reduced. Specifically, the oxygen partial pressure in the deposition atmosphere is preferably greater than or equal to 33%.

Note that for a target used in formation of a nanocrystalline oxide semiconductor film by a sputtering method, a target and a forming method which are similar to those of the CAAC-OS can be used.

Table 1 shows comparison between oxide semiconductors (represented by OS) having crystal structures and silicon (represented by Si) having crystal structures.

TABLE 1

|  | | Amorphous | Microcrystal | Polycrystal | Continuous crystal | Single crystal |
|---|---|---|---|---|---|---|
| OS | | a-OS<br>a-OS:H | nc-OS<br>μc-OS | Polycrystalline OS | CAAC-OS | Single crystal OS |
| | Nanobeam electron diffraction | Halo | Ring + Spot | Spot | Spot | Spot |
| | Crystal part | — | nm-μm | Discontinuous | Continuously connected | — |
| | DOS | High | Slightly low | — | Low | Extremely low |
| | Density | Low | Medium | — | High | — |
| Si | | a-Si<br>a-Si:H | nc-Si<br>μc-Si | Polycrystalline Si | CG silicon | Single crystal Si |

As shown in Table 1, examples of oxide semiconductors having crystal structures include an amorphous oxide semiconductor (a-OS and a-OS:H), a nanocrystalline oxide semiconductor (nc-OS and μc-OS), a polycrystalline oxide semiconductor (polycrystalline OS), a continuous crystal oxide semiconductor (CAAC-OS), and a single crystal oxide semiconductor (single crystal OS). Note that examples of the crystal state of silicon include, as shown in Table 1, amorphous silicon (a-Si and a-Si:H), nanocrystalline silicon (nc-Si and μc-Si), polycrystalline silicon (polycrystalline Si), continuous crystal silicon (continuous grain (CG) silicon), and single crystal silicon (single crystal Si).

When the oxide semiconductors in the above crystal states are subjected to electron diffraction (nanobeam electron diffraction) using an electron beam whose diameter is reduced to less than or equal to 10 nmϕ, the following electron diffraction patterns (nanobeam electron diffraction patterns) can be observed. A halo pattern (also referred to as a halo ring or a halo) is observed in the amorphous oxide semiconductor. Spots and/or a ring pattern are/is observed in the nanocrystalline oxide semiconductor. Spots are observed in the polycrystalline oxide semiconductor. Spots are observed in the continuous crystal oxide semiconductor.

Spots are observed in the single crystal oxide semiconductor. According to the nanobeam electron diffraction pattern, a crystal part in the nanocrystalline oxide semiconductor has a diameter of nanometers (nm) to micrometers (μm). The polycrystalline oxide semiconductor has discontinuous grain boundaries between crystal parts. No boundary is observed between crystal parts in the continuous crystal oxide semiconductor and the crystal parts are connected continuously.

The density of the oxide semiconductor in each crystal state is described. The amorphous oxide semiconductor has a low density. The nanocrystalline oxide semiconductor has a medium density. The continuous crystal oxide semiconductor has a high density. That is, the density of the continuous crystal oxide semiconductor is higher than that of the nanocrystalline oxide semiconductor, and the density of the nanocrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the nanocrystalline oxide semiconductor is slightly low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the nanocrystalline oxide semiconductor, and the DOS of the nanocrystalline oxide semiconductor is lower than that of the amorphous oxide semiconductor.

This embodiment can be combined with any of the other embodiments in this specification as appropriate.

Embodiment 3

In each of Embodiments 1 and 2, an example of a top-gate transistor is described. In this embodiment, an example of a bottom-gate transistor is described.

Figure 33A:
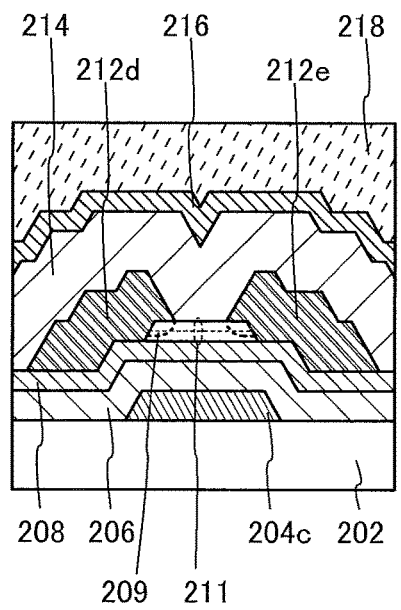
FIGS. 33A and 33B are cross-sectional views of a semiconductor device of one embodiment of the present invention.

A transistor illustrated in FIG. 33A includes a conductive layer 204c over a substrate 202, insulating layers 206 and 208 over the substrate 202 and the conductive layer 204c, a multilayer film 211 over the insulating layer 208, and conductive layers 212d and 212e over the insulating layer 208 and the multilayer film 211. The transistor illustrated in FIG. 33A may further be provided with insulating layers 214, 216, and 218 over the transistor, specifically, over the insulating layer 208, the multilayer film 211, and the conductive layers 212d and 212e.

Note that depending on the kind of a conductive film used for the conductive layers 212d and 212e, oxygen is removed from part of the multilayer film 211 so that n-type regions 209 are formed in the multilayer film 211 in some cases. In FIG. 33A, the n-type regions 209 can be formed in regions of the multilayer film 211 which are in the vicinity of the interface with the conductive layers 212d and 212e. The n-type regions 209 can function as source and drain regions.

In the transistor illustrated in FIG. 33A, the conductive layer 204c functions as a gate electrode, the conductive layer 212d functions as one of a source electrode and a drain electrode, and the conductive layer 212e functions as the other of the source electrode and the drain electrode.

In the transistor illustrated in FIG. 33A, the distance in a region of the multilayer film 211 which overlaps with the conductive layer 204c and is between the conductive layer 212d and the conductive layer 212e is referred to as a channel length. A channel formation region refers to a region of the multilayer film 211 which overlaps with the conductive layer 204c and is sandwiched between the conductive layer 212d and the conductive layer 212e. Further, a channel refers to a region through which current mainly flows in the channel formation region.

Here, the multilayer film 211 is described in detail with reference to FIG. 33B.

Figure 33B:
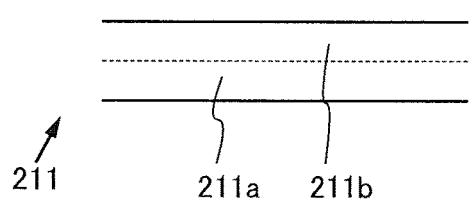

FIG. 33B is an enlarged view of a region of the multilayer film 211 which is surrounded by broken line in FIG. 33A. The multilayer film 211 includes an oxide semiconductor layer 211a and an oxide layer 211b.

The oxide semiconductor layer 211a preferably includes a layer represented by an In-M-Zn oxide containing at least indium (In), zinc (Zn), and M (M is a metal such as Al, Ga, Ge, Y, Zr, Sn, La, Ce, or Hf). The oxide semiconductor materials, the formation method, and the like that can be used for the stack 103 or the oxide layer 105 described in Embodiment 1 can be referred to for those of the oxide semiconductor layer 211a.

The oxide layer 211b contains one or more kinds of elements contained in the oxide semiconductor layer 211a. The energy at the bottom of the conduction band of the oxide layer 211b is located closer to the vacuum level than that of the oxide semiconductor layer 211a by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the conductive layer 204c functioning as a gate electrode, a channel is formed in the oxide semiconductor layer 211a having a lower energy at the bottom of the conduction band in the multilayer film 211. In other words, the oxide layer 211b is placed between the oxide semiconductor layer 211a and the insulating layer 214, whereby the channel of the transistor can be formed in the oxide semiconductor layer 211a not in contact with the insulating layer 214. Since the oxide layer 211b contains one or more elements contained in the oxide semiconductor layer 211a, interface scattering is unlikely to occur at the interface between the oxide semiconductor layer 211a and the oxide layer 211b. Thus, transfer of carriers is not inhibited between the oxide semiconductor layer 211a and the oxide layer 211b, resulting in an increase in the field-effect mobility of the transistor. Moreover, an interface state is less likely to be formed between the oxide semiconductor layer 211a and the oxide layer 211b. When an interface state is formed between the oxide semiconductor layer 211a and the oxide layer 211b, a second transistor in which the interface between the oxide semiconductor layer 211a and the oxide layer 211b serves as a channel and which has different threshold voltage from the transistor is formed and the apparent threshold voltage of the transistor varies in some cases. Thus, with the oxide layer 211b, fluctuation in the electrical characteristics of the transistors, such as threshold voltage, can be reduced.

As the oxide layer 211b, an oxide layer that is represented by an In-M-Zn oxide (M is a metal such as Al, Ti, Ga, Ge, Y, Zr, Sn, La, Ce, or Hf) and contains a larger amount of M in an atomic ratio than that in the oxide semiconductor layer 211a is used. Specifically, the amount of any of the above elements in the oxide layer 211b in an atomic ratio is 1.5 or more times, preferably 2 or more times, more preferably 3 or more times that in the oxide semiconductor layer 211a in an atomic ratio. Any of the above elements is more strongly bonded to oxygen than indium is, and thus has a function of suppressing generation of oxygen vacancies in the oxide layer. In other words, the oxide layer 211b is an oxide layer in which oxygen vacancies are less likely to be generated than in the oxide semiconductor layer 211a.

That is to say, when each of the oxide semiconductor layer 211a and the oxide layer 211b is an In-M-Zn oxide containing at least indium, zinc, and M (M is a metal such as Al, Ti, Ga, Ge, Y, Zr, Sn, La, Ce, or Hf) and when the oxide layer 211b has an atomic ratio of In to M and Zn which is $x_1:y_1:z_1$ and the oxide semiconductor layer 211a has an atomic ratio of In to M and Zn which is $x_2:y_2:z_2$, $y_1/x_1$ is preferably larger than $y_2/x_2$. $y_1/x_1$ is 1.5 or more times, preferably 2 or more times, more preferably 3 or more times $y_2/x_2$. At this time, when $y_2$ is greater than or equal to $x_2$ in the oxide semiconductor layer 211a, the transistor can have stable electrical characteristics. However, when $y_2$ is 3 or more times $x_2$, the field-effect mobility of the transistor is reduced; accordingly, $y_2$ is preferably smaller than 3 times $x_2$.

When the oxide semiconductor layer 211a is an In-M-Zn oxide, in the case where the total atomic percentage of In and M is assumed to be 100 at. %, the atomic ratio of In to M is preferably as follows: the atomic percentage of In is higher than or equal to 25 at. % and the atomic percentage of M is lower than 75 at. %; more preferably, the atomic percentage of In is higher than or equal to 34 at. % and the atomic percentage of M is lower than 66 at. %. When the oxide layer 211b is an In-M-Zn oxide, the atomic ratio of In to M is preferably as follows: the atomic percentage of In is lower than 50 at. % and the atomic percentage of M is higher than or equal to 50 at. %; more preferably, the atomic percentage of In is lower than 25 at. % and the atomic percentage of M is higher than or equal to 75 at. %.

For the oxide semiconductor layer 211a and the oxide layer 211b, an oxide semiconductor containing indium, zinc, and gallium can be used. Specifically, the oxide semiconductor layer 211a can be formed using an In—Ga—Zn oxide whose atomic ratio of In to Ga and Zn is 1:1:1, an In—Ga—Zn oxide whose atomic ratio of In to Ga and Zn is 3:1:2, or an oxide having a composition in the neighborhood of any of the above atomic ratios. The oxide layer 211b can be formed using an In—Ga—Zn oxide whose atomic ratio of In to Ga and Zn is 1:3:2, an In—Ga—Zn oxide whose atomic ratio of In to Ga and Zn is 1:6:4, an In—Ga—Zn oxide whose atomic ratio of In to Ga and Zn is 1:9:6, or an oxide having a composition in the neighborhood of any of the above atomic ratios.

The thickness of the oxide semiconductor layer 211a is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide layer 211b is greater than or equal to 3 nm and less than or equal to 100 nm, preferably greater than or equal to 3 nm and less than or equal to 50 nm.

This embodiment can be combined with any of the other embodiments in this specification as appropriate.

Embodiment 4

An example of a system for charging and discharging a power storage device is described with reference to FIG. 34.

Figure 34:
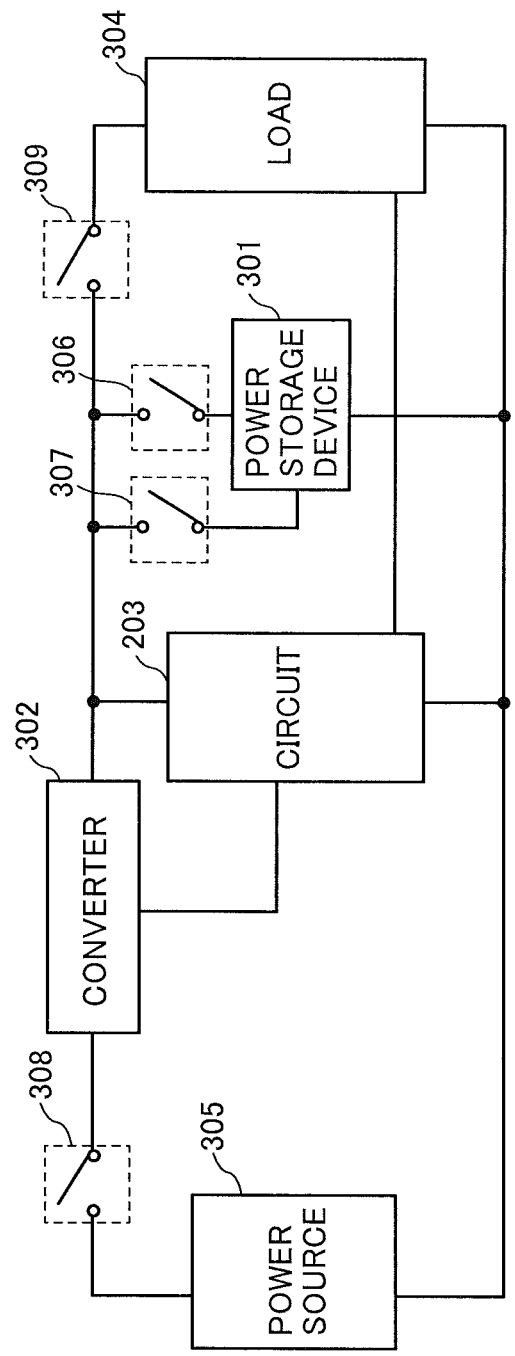
FIG. 34 illustrates a system for charging and discharging a power storage device.

A system for charging and discharging a power storage device illustrated in FIG. 34 includes at least a power storage device 301, a converter 302, a circuit 203, a load 304, a power source 305, a switch 306, a switch 307, a switch 308, and a switch 309. Note that the number of connecting points or the like can be reduced by providing the components in one device. For example, the power storage device 301 and the circuit 203 may be provided in one device. Alternatively, the power storage device 301, the converter 302, and the circuit 203 may be provided in one device.

The converter 302 is connected to the power storage device 301 and the circuit 203.

The converter 302 has a function of controlling a current value in charging and discharging the power storage device 301, for example, by converting a voltage supplied from the power source 305.

As the converter 302, a buck boost converter can be used, for example. The buck boost converter includes a switching regulator and a control circuit, for example. The switching regulator includes an inductor and a switch, for example. The buck boost converter allows an input voltage to be switched between step-up and step-down and the value of a raised or lowered voltage to be controlled with use of the control circuit controlling the switch, and allows selection between input and output by switching the direction of a current flowing through the inductor; thus, charging and discharging of the power storage device 301 can be switched. Note that without limitation on this example, instead of the control circuit, the circuit 203 may be used to control the switch of the switching regulator. As the buck boost converter, a single ended primary inductor converter (SEPIC), a Zeta converter, or the like can be used.

The circuit 203 is connected to the power storage device 301. The circuit 203 is supplied with electric power from the power storage device 301 or the power source 305.

The circuit 203 has a function of controlling a value of an output voltage of the converter 302 by generating and outputting an instruction signal indicating the state of the converter 302, and has a function of controlling the direction of current flow in the inductor in the converter 302. In addition, the circuit 203 has a function of controlling on/off states of the switch 306 and the switch 307 which are described later. Note that the circuit 203 may be a control circuit. Further, the circuit 203 may be a microcomputer, a microprocessor (MPU), a microcontroller unit (MCU), a field-programmable gate array (FPGA), a central processing unit (CPU), or a battery management unit (BMU).

The load 304 is connected to the power storage device 301, the converter 302, and the circuit 203. The load 304 is supplied with electric power from the power storage device 301 or the power source 305. Note that a control signal may be input to the circuit 203 from the load 304. A power gate may be provided in the load 304 to control supply of electric power to a circuit included in the load 304. Note that the circuit 203 is not necessarily connected to the load 304.

As the power source 305, a power supply circuit using a system power supply can be used, for example. Without limitation on this example, a device capable of supplying electric power in a contactless manner, such as a power feeding device, may be used.

The switch 306 is connected to a positive electrode of the power storage device 301 and has a function of controlling conduction between the power storage device 301 and the converter 302, for example. The switch 306 may be controlled by the control circuit of the converter 302 or the circuit 203.

The switch 307 is connected to an electrode of the power storage device 301 and has a function of controlling conduction between the power storage device 301 and the converter 302, for example. The switch 307 may be controlled by the control circuit of the converter 302 or the circuit 203.

The switch 308 has a function of controlling conduction between the power source 305 and the converter 302. The switch 308 may be controlled by the control circuit of the converter 302 or the circuit 203.

The switch 309 has a function of controlling conduction between the power storage device 301 and the load 304. The switch 309 may be controlled by the control circuit of the converter 302 or the circuit 203.

As the switches 307 to 309, a transistor, a diode, or the like can be used, for example.

An example of the circuit 203 will be described below with reference to FIG. 35.

The circuit 203 includes a processor 710, a bus bridge 711, a memory 712, a memory interface 713, a controller 720, an interrupt controller 721, an I/O interface (input/output interface) 722, and a power gate unit 730.

The circuit 203 further includes a crystal oscillation circuit 741, a timer circuit 745, an I/O interface 746, an I/O port 750, a comparator 751, an I/O interface 752, a bus line 761, a bus line 762, a bus line 763, and a data bus line 764. Further, the circuit 203 includes at least connection terminals 770 to 776 as portions for connection to an external device. Note that each of the connection terminals 770 to 776 represents one terminal or a terminal group including a plurality of terminals. An oscillation unit 742 including a quartz crystal unit 743 is connected to the circuit 203 through the connection terminal 772 and the connection terminal 773.

The processor 710 includes a register 785 and is connected to the bus lines 761 to 763 and the data bus line 764 through the bus bridge 711.

The memory 712 is a memory device which can function as a main memory of the processor 710. As an example thereof, a random access memory (RAM) is used. The memory 712 is a device that stores an instruction to be executed by the processor 710, data necessary for execution of the instruction, and data processed by the processor 710. Under the instruction of the processor 710, data is written into and read out from the memory 712.

In the circuit 203 in a low power consumption mode, supply of power to the memory 712 is blocked. Thus, it is preferable that the memory 712 be a memory which can hold data even while power is not supplied.

The memory interface 713 is an input/output interface with an external memory device. Under the instruction of the processor 710, data is written into and read out from the external memory device connected to the connection terminal 776 via the memory interface 713.

A clock generation circuit 715 is a circuit that generates a clock signal MCLK (hereinafter simply also referred to as "MCLK") to be used in the processor 710, and includes an RC oscillator and the like. MCLK is also output to the controller 720 and the interrupt controller 721.

The controller 720 is a circuit which controls the entire circuit 203, and can control, for example, a bus, a memory map, and the like, power supply of the circuit 203, the clock generation circuit 715, the crystal oscillation circuit 741, and the like.

The connection terminal 770 is a terminal for inputting an external interrupt signal. A non-maskable interrupt signal NMI is input to the controller 720 through the connection terminal 770. As soon as the non-markable interrupt signal NMI is input to the controller 720, the controller 720 outputs the non-maskable interrupt signal NMI to the processor 710, so that the processor 710 executes interrupt processing.

An interrupt signal INT is input to the interrupt controller 721 through the connection terminal 770. Interrupt signals (T0IRQ, P0IRQ, and C0IRQ) from peripheral circuits are input to the interrupt controller 721 without going through the buses (761 to 764).

The interrupt controller 721 has a function of setting priorities to interrupt requests. When the interrupt controller 721 detects the interrupt signal, the interrupt controller 721 determines if the interrupt request is valid or not. If the interrupt request is valid, the interrupt controller 721 outputs an interrupt signal NT into the controller 720.

The interrupt controller 721 is connected to the bus line 761 and the data bus line 764 through the I/O interface 722.

When the interrupt signal INT is input, the controller 720 outputs an interrupt signal INT to the processor 710 and makes the processor 710 execute interrupt processing.

The interrupt signal T0IRQ is directly input to the controller 720 without going through the interrupt controller 721 in some cases. When the controller 720 receives the interrupt signal T0IRQ, the controller 720 outputs a non-maskable interrupt signal NMI to the processor 710, so that the processor 710 executes interrupt processing.

A register 780 of the controller 720 is provided in the controller 720. A register 786 of the interrupt controller 721 is provided in the I/O interface 722.

Then, peripheral circuits included in the circuit 203 will be described. The circuit 203 includes the timer circuit 745, the I/O port 750, and the comparator 751 as peripheral circuits. These peripheral circuits are just examples, and a circuit needed for an electrical device using the circuit 203 can be provided as appropriate.

The timer circuit 745 has a function of measuring time in response to a clock signal TCLK (hereinafter simply also referred to as "TCLK") output from a clock generation circuit 740. In addition, the timer circuit 745 outputs the interrupt signal T0IRQ to the controller 720 and the interrupt controller 721 at predetermined intervals. The timer circuit 745 is connected to the bus line 761 and the data bus line 764 through the I/O interface 746.

TCLK is a clock signal the frequency of which is lower than that of MCLK. For example, the frequency of MCLK is about several megahertz (MHz) (e.g., 8 MHz) and the frequency of TCLK is about several tens of kilohertz (kHz) (e.g., 32 kHz). The clock generation circuit 740 includes the crystal oscillation circuit 741 incorporated in the circuit 203 and the oscillation unit 742 which is connected to the connection terminal 772 and the connection terminal 773. The quartz crystal unit 743 is used as a resonator unit of the oscillation unit 742. In addition, the clock generation circuit 740 is made up of a CR oscillator and the like, and thereby, all modules in the clock generation circuit 740 can be incorporated in the circuit 203.

The I/O port 750 is an interface that inputs and outputs information to/from an external device which is connected to the I/O port 750 through the connection terminal 774 and is an input/output interface for a digital signal. The I/O port 750 outputs the interrupt signal P0IRQ to the interrupt controller 721 in response to an input digital signal. Note that a plurality of connection terminals 774 may be provided.

The comparator 751 compares a potential (or current) of the analog signal inputted from the connection terminal 775 with a potential (or current) of a reference signal and generates a digital signal the level of which is 0 or 1. Further, the comparator 751 generates the interrupt signal C0IRQ when the level of the digital signal is 1. The interrupt signal C0IRQ is output to the interrupt controller 721.

The I/O port 750 and the comparator 751 are connected to the bus line 761 and the data bus line 764 through the I/O interface 752 common to the both. Here, one I/O interface 752 is used because the I/O interfaces of the I/O port 750 and the comparator 751 can share a circuit; however, the I/O port 750 and the comparator 751 can have respective I/O interfaces.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The circuit 203 includes the power gate unit 730 that can stop power supply to the internal circuits. Power is supplied only to a circuit necessary for operation by the power gate unit 730, so that power consumption of the whole circuit 203 can be lowered.

Figure 35:
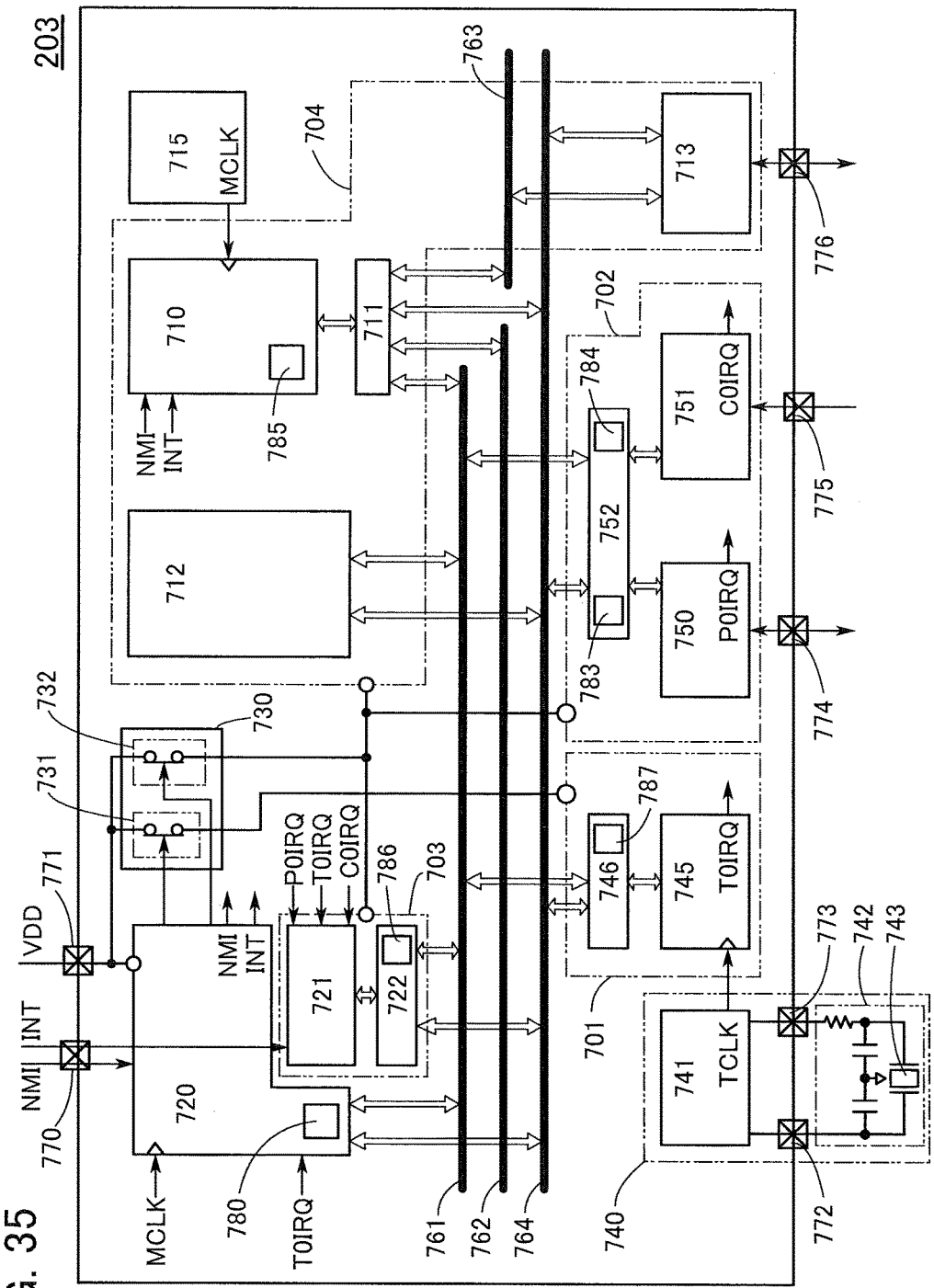
FIG. 35 shows a control circuit.

As illustrated in FIG. 35, circuits in a unit 701, a unit 702, a unit 703, and a unit 704 in the circuit 203 which are surrounded by dashed lines are connected to the connection terminal 771 through the power gate unit 730. The connection terminal 771 is connected to, for example, the power storage device 301. Note that a converter may be provided between the connection terminal 771 and the power storage device 301.

In this embodiment, the unit 701 includes the timer circuit 745 and the I/O interface 746; the unit 702 includes the I/O port 750, the comparator 751, and the I/O interface 752; the unit 703 includes the interrupt controller 721 and the I/O interface 722; the unit 704 includes the processor 710, the memory 712, the bus bridge 711, and the memory interface 713.

The power gate unit 730 is controlled by the controller 720. The power gate unit 730 includes a switch circuit 731 and a switch circuit 732 for blocking supply of a power supply voltage to the units 701 to 704.

The switching of the switches 731 and 732 is controlled by the controller 720. Specifically, the controller 720 outputs a signal to turn off one or both of the switches included in the power gate unit 730, depending on the request by the processor 710 (power supply stop). In addition, the controller 720 outputs a signal to turn on the switch included in the power gate unit 730 with, as a trigger, the non-maskable interrupt signal NMI or the interrupt signal T0IRQ from the timer circuit 745 (start of power supply).

FIG. 35 illustrates a structure where two switches (the switches 731 and 732) are provided in the power gate unit 730; however, the structure is not limited thereto. Switches may be provided as much as needed to block supply of power.

In this embodiment, the switch 731 is provided to independently control supply of power to the unit 701, and the switch 732 is provided to independently control supply of power to the units 702 to 704. However, this embodiment is not limited to such power supply paths. For example, another switch which is different from the switch 732 may be provided to independently control supply of power to the memory 712. Further, a plurality of switches may be provided for one circuit.

In addition, a power supply voltage is constantly supplied from the connection terminal 771 to the controller 720 without going through the power gate unit 730. In order to reduce noise, a power supply potential from an external power supply circuit, which is different from the power supply circuit for the power supply voltage, is given to each of the oscillation circuit of the clock generation circuit 715 and the crystal oscillation circuit 741.

By provision of the controller 720, the power gate unit 730, and the like, the circuit 203 can operate in three kinds of operation modes. The first operation mode is a normal operation mode where all circuits included in the circuit 203 are active. Here, the first operation mode is referred to as "Active mode".

The second and third operation modes are low power consumption modes where some of the circuits are active. In the second operation mode, the controller 720, the timer circuit 745, and circuits (the crystal oscillation circuit 741 and the I/O interface 746) associated therewith are active. In the other of the third operation mode, the controller 720 alone is active. Here, the second operation mode is referred to as "the Noff1 mode" and the third operation mode is referred to as "the Noff2 mode". The controller 720 and some of the peripheral circuits (circuits necessary for timer operation) alone operate in the Noff1 mode and the controller 720 alone operates in the Noff2 mode.

Note that power is constantly supplied to the oscillator of the clock generation circuit 715 and the crystal oscillation circuit 741 regardless of the operation modes. In order to bring the clock generation circuit 715 and the crystal oscillation circuit 741 into non-active modes, an enable signal is inputted from the controller 720 or an external circuit to stop oscillation of the clock generation circuit 715 and the crystal oscillation circuit 741.

In addition, in Noff1 and Noff2 modes, power supply is stopped by the power gate unit 730, so that the I/O port 750 and the I/O interface 752 are non-active, but power is supplied to parts of the I/O port 750 and the I/O interface 752 in order to allow the external device connected to the connection terminal 774 to operate normally. Specifically, power is supplied to an output buffer of the I/O port 750 and the register 783 of the I/O port 750. In the Noff1 and Noff2 modes, actual functions of the I/O port 750, that is, functions of data transmission between the I/O interface 752 and the external device and generation of an interrupt signal, are stopped. In addition, a communication function of the I/O interface 752 is also stopped similarly.

Note that in this specification, the phrase "a circuit is non-active" includes a state where major functions in Active mode (normal operation mode) are stopped and an operation state with power consumption lower than that in Active mode, as well as a state where a circuit is stopped by blocking supply of power.

With the above-described structure, when a user forcefully terminates charging operation of the power storage device, a signal for turning off one or both of the switches included in the power gate unit 730 is output in response to the request by the processor 710 to switch the circuit 203 to the Noff1 or Noff2 mode; thus, supply of electric power to a circuit block which does not need to be supplied with electric power can be stopped.

Further, an example of a structure of the register which can be used in each circuit block will be described with reference to FIGS. 36A and 36B.

Figure 36A:
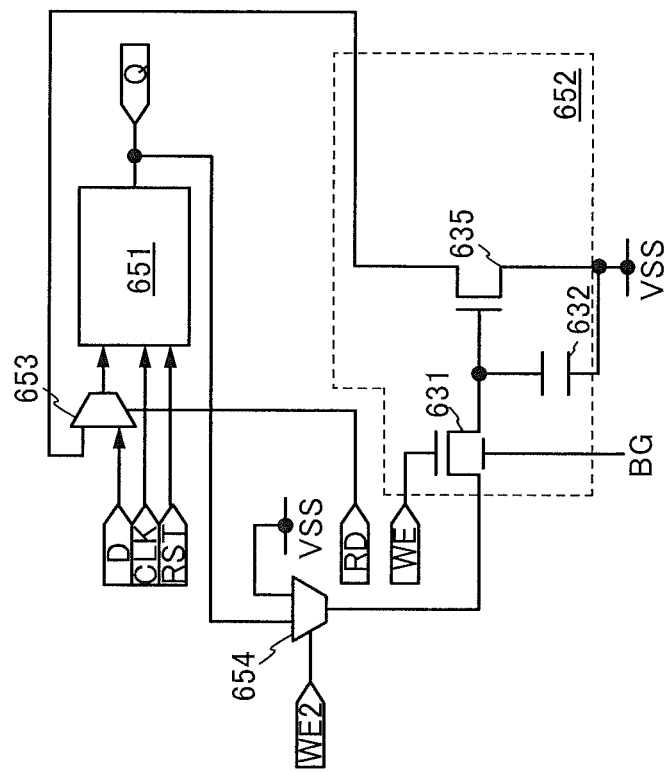
FIGS. 36A and 36B each illustrate a control circuit.

The register illustrated in FIG. 36A includes a memory circuit 651, a memory circuit 652, and a selector 653.

The memory circuit 651 is supplied with a reset signal RST, a clock signal CLK, and a data signal D. The memory circuit 651 has a function of storing, in response to the clock signal CLK, data of the data signal D that is input and outputting the data as a data signal Q. The memory circuit 651 can form, for example, a register such as a buffer register or a general-purpose register. As the memory circuit 651, a cache memory including a static random access memory (SRAM) or the like can be provided. Data of such a register or a cache memory can be stored in the memory circuit 652.

The memory circuit 652 is supplied with a write control signal WE, a read control signal RD, and a data signal.

The memory circuit 652 has a function of storing data of an input data signal in accordance with the write control signal WE and outputting the stored data as a data signal in accordance with the read control signal RD.

The selector 653 selects the data signal D or the data signal output from the memory circuit 652 and inputs the selected signal to the memory circuit 651 in accordance with the read control signal RD.

The memory circuit 652 includes a transistor 631 and a capacitor 632.

The transistor 631, which is an n-channel transistor, functions as a selection transistor. One of a source and a drain of the transistor 631 is connected to an output terminal of the memory circuit 651. Further, a back gate of the transistor 631 is supplied with a power supply potential. The transistor 631 has a function of controlling holding of a data signal output from the memory circuit 651 in accordance with the write control signal WE.

A transistor with low off-state current may be used as the transistor 631, for example. As the transistors with low off-state current, a transistor including a channel formation region that includes an oxide semiconductor with a wider bandgap than that of silicon and is substantially i-type can be used, for example.

The transistor including the oxide semiconductor can be fabricated in such a manner that, for example, impurities such as hydrogen or water are reduced as much as possible and oxygen vacancies are reduced as much as possible by supply of oxygen.

Note that any of the transistors described in Embodiments 1 to 3 can be used as the transistor 631. The amount of hydrogen that is regarded as a donor impurity in the channel formation region of the transistor, which is measured by secondary ion mass spectrometry (SIMS), is preferably reduced to lower than or equal to $1 \times 10^{19}/cm^3$, further preferably lower than or equal to $1 \times 10^{18}/cm^3$. The off-state current per micrometer of the channel width of the transistor 631 at 25° C. is lower than or equal to $1 \times 10^{-19}$ A (100 zA), preferably lower than or equal to $1 \times 10^{-22}$ A (100 yA). It is preferable that the off-state current of the transistor be as low as possible; the lowest value of the off-state current of the transistor is estimated to be about $1 \times 10^{-30}$ A/μm.

One of a pair of electrodes of the capacitor 632 is connected to the other of the source and the drain of the transistor 631, and the other of the pair of electrodes is supplied with a low power supply potential VSS. The capacitor 632 has a function of holding charge based on data of a stored data signal. Since the off-state current of the transistor 631 is extremely low, the charge in the capacitor 632 is held and thus the data is stored even when the supply of the power supply voltage is stopped.

A transistor 633 is a p-channel transistor. A high power supply potential VDD is supplied to one of a source and a drain of the transistor 633, and the read control signal RD is input to a gate of the transistor 633.

A transistor 634 is an n-channel transistor. One of a source and a drain of the transistor 634 is connected to the other of the source and the drain of the transistor 633, and the read control signal RD is input to a gate of the transistor 634.

A transistor 635 is an n-channel transistor. One of a source and a drain of the transistor 635 is connected to the other of the source and the drain of the transistor 634, and the other of the source and the drain of the transistor 635 is supplied with the low power supply potential VSS.

An input terminal of an inverter 636 is connected to the other of the source and the drain of the transistor 633. An output terminal of the inverter 636 is connected to an input terminal of the selector 653.

One of a pair of electrodes of a capacitor 637 is connected to the input terminal of the inverter 636, and the other of the pair of electrodes is supplied with the low power supply potential VSS. The capacitor 637 has a function of holding charge based on data of a data signal input to the inverter 636.

Note that without limitation to the above, the memory circuit 652 may include a phase-change RAM (PRAM), a phase change memory (PCM), a resistive RAM (ReRAM), a magnetoresistive RAM (MRAM), or the like. For the MRAM, a magnetic tunnel junction element (MTJ element) can be used for example.

Next, an example of a method for driving the register illustrated in FIG. 36A will be described.

First, in a normal operation period, the register is supplied with the power supply voltage that is power for the register, the reset signal RST, and the clock signal CLK. At this time, the selector 653 outputs data of the data signal D to the memory circuit 651. The memory circuit 651 stores, in accordance with the clock signal CLK, the data of the data signal D that is input. At this time, in response to the read control signal RD, the transistor 633 is turned on while the transistor 634 is turned off.

Then, in a backup period provided immediately before the supply of the power supply voltage is stopped, in accordance with the pulse of the write control signal WE, the transistor 631 is turned on, the data of the data signal D is stored in the memory circuit 652, and the transistor 631 is turned off. After that, the supply of the clock signal CLK to the register is stopped, and then, the supply of the reset signal RST to the register is stopped. Note that when the transistor 631 is on, the back gate of the transistor 631 may be supplied with a positive power supply potential. At this time, in response to the read control signal RD, the transistor 633 is turned on while the transistor 634 is turned off.

Next, in a power stop period, the supply of the power supply voltage to the register is stopped. During this period, the stored data is held because the off-state current of the transistor 631 in the memory circuit 652 is low. Note that the supply of the power supply voltage may be stopped by supplying the ground potential GND instead of the high power supply potential VDD. Note that when the transistor 631 is off, the back gate of the transistor 631 may be supplied with a negative power supply potential, so that the transistor 631 is kept off.

Then, in a recovery period immediately before a normal operation period, the supply of the power supply voltage to the register is restarted; then, the supply of the clock signal CLK is restarted, and after that, the supply of the reset signal RST is restarted. At this time, before the supply of the clock signal CLK is restarted, the wiring which is to be supplied with the clock signal CLK is set to the high power supply potential VDD. Moreover, in accordance with the pulse of the read control signal RD, the transistor 633 is turned off, the transistor 634 is turned on, and the data signal stored in the memory circuit 652 is output to the selector 653. The selector 653 outputs the data signal to the memory circuit 651 in accordance with the pulse of the read control signal RD. Thus, the memory circuit 651 can be returned to a state just before the power stop period.

Then, in a normal operation period, normal operation of the memory circuit 651 is performed again.

The above is an example of the method for driving the register illustrated in FIG. 36A.

Note that the structure of the register is not limited to that illustrated in FIG. 36A.

Figure 36B:
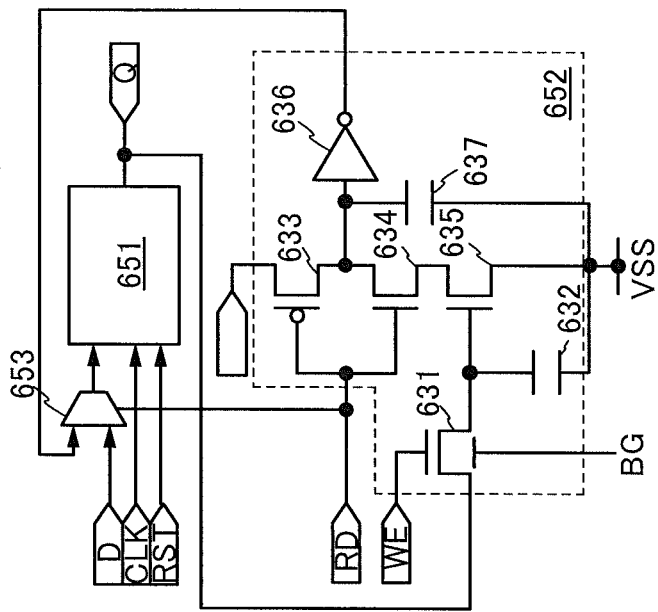

For example, the register illustrated in FIG. 36B has a structure in which the transistors 633 and 634, the inverter 636, and the capacitor 637 are removed from the register illustrated in FIG. 36A and a selector 654 is added to the register illustrated in FIG. 36A. For the same components as those in the register illustrated in FIG. 36A, the description of the register in FIG. 36A is referred to as appropriate.

One of the source and the drain of the transistor 635 is connected to the input terminal of the selector 653.

In the selector 654, the low power supply potential VSS to be data or the data signal output from the memory circuit 651 is selected in accordance with the write control signal WE2, and input to the memory circuit 652.

Next, an example of a method for driving the register illustrated in FIG. 36B will be described.

First, in a normal operation period, the register is supplied with the power supply voltage, the reset signal RST, and the clock signal CLK. At this time, the selector 653 outputs data of the data signal D to the memory circuit 651. The memory circuit 651 stores, in accordance with the clock signal CLK, the data of the data signal D that is input. In addition, the selector 654 outputs the low power supply potential VSS to the memory circuit 652 in accordance with the write control signal WE2. In the memory circuit 652, the transistor 631 is turned on in response to the pulse of the write control signal WE, and the low power supply potential VSS is stored as data in the memory circuit 652.

Then, in a backup period provided immediately before the supply of the power supply voltage is stopped, the selector 654 does not supply the low power supply potential VSS but provides electrical conduction between the output terminal of the memory circuit 651 and one of the source and the drain of the transistor 631 in accordance with the write control signal WE2. Further, in accordance with the pulse of the write control signal WE, the transistor 631 is turned on, the data of the data signal D is stored in the memory circuit 652, and the transistor 631 is turned off. At this time, the data of the memory circuit 652 is rewritten only when the potential of the data signal D is equal to the high power supply potential VDD. Furthermore, the supply of the clock signal CLK to the register is stopped, and then, the supply of the reset signal RST to the register is stopped. Note that when the transistor 631 is on, the back gate of the transistor 631 may be supplied with a positive power supply potential.

Next, in a power stop period, the supply of the power supply voltage to the register is stopped. During this period, the stored data is held in the memory circuit 652 because the off-state current of the transistor 631 is low. Note that the supply of the power supply voltage may be stopped by supplying the ground potential GND instead of the high power supply potential VDD. Note that when the transistor 631 is off, the back gate of the transistor 631 may be supplied with a negative power supply potential from a multiplexer, so that the transistor 631 is kept off.

Then, in a recovery period immediately before a normal operation period, the supply of the power supply voltage to the register is restarted; then, the supply of the clock signal CLK is restarted, and after that, the supply of the reset signal RST is restarted. At this time, before the supply of the clock signal CLK is restarted, the wiring which is to be supplied with the clock signal CLK is set to the high power supply potential VDD. In accordance with the pulse of the read control signal RD, the selector 653 outputs to the memory circuit 651 the data signal corresponding to the data stored in the memory circuit 652. Thus, the memory circuit 651 can be returned to a state just before the power stop period.

Then, in a normal operation period, normal operation of the memory circuit 651 is performed again.

The above is an example of the method for driving the register illustrated in FIG. 36B.

By using the structure illustrated in FIG. 36B, the data of the low power supply potential VSS does not need to be written in the backup period, resulting in an increase in operation speed.

In the case of using the above-described register for the registers 784 to 787, when Active mode shifts to Noff1 or Noff2 mode, prior to the block of power supply, data stored in the memory circuit 651 of the registers 784 to 787 is written to the memory circuit 652, so that data in the memory circuit 651 is reset to initial values; then, supply of power is blocked.

In the case where Noff1 or Noff2 mode is returned to Active mode, when power supply to the registers 784 to 787 is restarted, data in the memory circuit 651 is reset to initial values. Then, data in the memory circuit 652 is written to the memory circuit 651.

Accordingly, even in the low power consumption mode, data needed for processing by the circuit 203 are stored in the registers 784 to 787, and thus, the circuit 203 can return from the low power consumption mode to Active mode immediately. Therefore, the power consumption of the circuit 203 can be reduced. This embodiment can be combined with any of the other embodiments in this specification as appropriate.

Embodiment 5

In this embodiment, an example of a memory that uses an oxide semiconductor film will be described. The memory can be used in the memory 712 in FIG. 35, for example.

Here, a static random access memory (SRAM), a memory including a flip-flop to which a circuit of an inverter is applied, will be described.

An SRAM retains data by using a flip-flop. Thus, unlike a dynamic random access memory (DRAM), an SRAM does not require refresh operation. Therefore, power consumption at the time of data retention can be reduced. In addition, an SRAM does not require a capacitor and is therefore suitable for applications where high speed operation is required.

Figure 37:
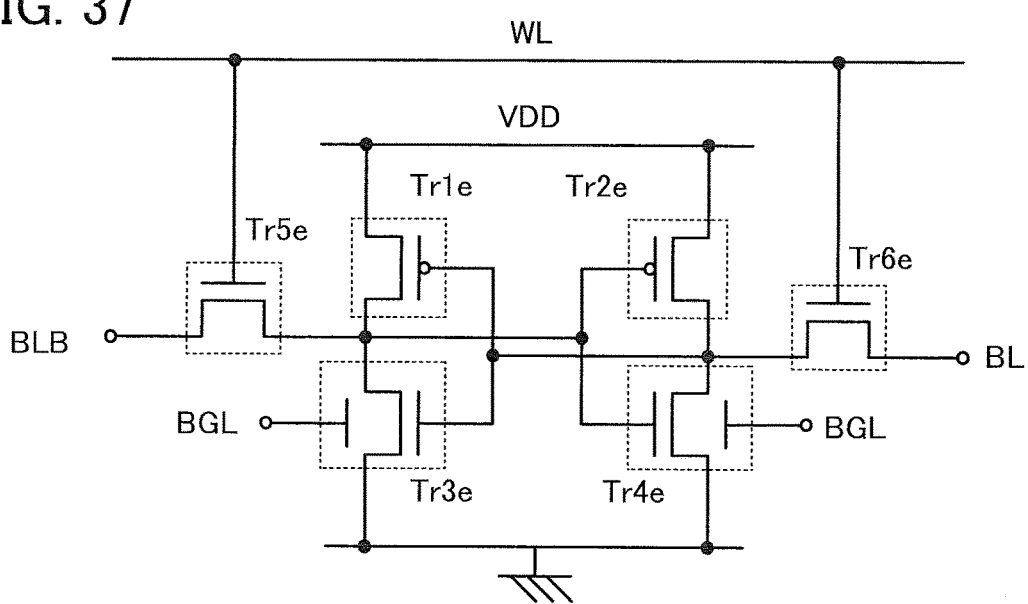
FIG. 37 shows a memory.

FIG. 37 is a circuit diagram corresponding to a memory cell of an SRAM using an oxide semiconductor film Note that FIG. 37 illustrates only one memory cell; the present invention can also be applied to a memory cell array in which a plurality of such memory cells are arranged.

The memory cell illustrated in FIG. 37 includes a transistor Tr1e, a transistor Tr2e, a transistor Tr3e, a transistor Tr4e, a transistor Tr5e, and a transistor Tr6e. The transistors Tr1e and Tr2e are p-channel transistors. The transistors Tr3e and Tr4e are n-channel transistors. A gate of the transistor Tr1e is electrically connected to a drain of the transistor Tr2e, a gate of the transistor Tr3e, a drain of the transistor Tr4e, and one of a source and a drain of the transistor Tr6e. A high power supply potential VDD is supplied to a source of the transistor Tr1e. A drain of the transistor Tr1e is electrically connected to a gate of the transistor Tr2e, a drain of the transistor Tr3e, and one of a source and a drain of the transistor Tr5e. The high power supply potential VDD is supplied to a source of the transistor Tr2e. The ground potential GND is supplied to a source of the transistor Tr3e. A back gate of the transistor Tr3e is electrically connected to a back gate line BGL. The ground potential GND is supplied to a source of the transistor Tr4e. A back gate of the transistor Tr4e is electrically connected to a back-gate line BGL. A gate of the transistor Tr5e is electrically connected to a word line WL. The other of the source and the drain of the transistor Tr5e is electrically connected to a bit line BLB. A gate of the transistor Tr6e is electrically connected to the word line WL. The other of the source and the drain of the transistor Tr6e is electrically connected to a bit line BL.

Note that this embodiment shows an example where n-channel transistors are used as the transistors Tr5e and Tr6e. However, the transistors Tr5e and Tr6e are not limited to n-channel transistors and may be p-channel transistors. In that case, writing, retaining, and reading methods described below may be changed as appropriate.

A flip-flop is thus configured in such a manner that an inverter including the transistors Tr1e and Tr3e and an inverter including the transistors Tr2e and Tr4e are connected in a ring.

The p-channel transistors may be, but are not limited to, transistors using silicon for example. The n-channel transistors may each be the transistor including an oxide semiconductor film described in any of Embodiments 1 to 3.

Here, the transistors Tr3e and Tr4e may each be a transistor including an oxide semiconductor film. With an extremely low off-state current, the transistor has an extremely low flow-through current.

Note that instead of the p-channel transistors, n-channel transistors may be applied to the transistors Tr1e and Tr2e. In the case where n-channel transistors are used as the transistors Tr1e and Tr2e, depletion transistors may be employed.

Writing, retaining, and reading operation of the memory cell illustrated in FIG. 37 will be described below.

In writing, first, a potential corresponding to data 0 or data 1 is applied to the bit line BL and the bit line BLB.

For example, in the case where data 1 is to be written, the high power supply potential VDD is applied to the bit line BL and the ground potential GND is applied to the bit line BLB. Then, a potential (VH) higher than or equal to the sum of the high power supply potential VDD and the threshold voltage of the transistors Tr5e and Tr6e is applied to the word line WL.

Next, the potential of the word line WL is set to be lower than the threshold voltage of the transistors Tr5e and Tr6e, whereby the data 1 written to the flip-flop is retained. In the case of the SRAM, a current flowing in retaining data is only the leakage current of the transistors. Here, the transistor with a low off-state current, is applied to some of the transistors in the SRAM, resulting in a reduction in stand-by power for retaining data.

In reading, the high power supply potential VDD is applied to the bit line BL and the bit line BLB in advance. Then, the VH is applied to the word line WL, so that the bit line BLB is discharged through the transistors Tr5e and Tr3e to be equal to the ground potential GND while the potential of the bit line BL is kept at the high power supply potential VDD. The potential difference between the bit line BL and the bit line BLB is amplified by a sense amplifier (not illustrated), whereby the retained data 1 can be read.

In the case where data 0 is to be written, the ground potential GND is applied to the bit line BL and the high power supply potential VDD is applied to the bit line BLB; then, the VH is applied to the word line WL. Next, the potential of the word line WL is changed to a potential lower than the threshold voltage of the transistor Tr5e and Tr6e, so that the data 0 written into the flip-flop is retained. In reading, the high power supply potential VDD is applied to the bit line BL and the bit line BLB in advance. Then, the VH is applied to the word line WL, so that the bit line BL is discharged through the transistors Tr6e and Tr4e to be equal to the ground potential GND while the potential of the bit line BLB is kept at the high power supply potential VDD. The potential difference between the bit line BL and the bit line BLB is amplified by the sense amplifier, whereby the retained data 0 can be read.

In the above-described manner, an SRAM with low stand-by power can be provided.

The transistor including an oxide semiconductor film described in one embodiment can have extremely low off-state current. That is, the transistor has electrical characteristics in which leakage of charge through the transistor is unlikely to occur. A dynamic oxide semiconductor random access memory (DOSRAM) will be described below as a memory which includes a transistor having such electrical characteristics. The memory includes a memory element which is superior in function to a known memory element. DOSRAM is a memory that uses the above-described transistor with low off-state current as a selection transistor (a transistor serving as a switching element) of a memory cell.

Figure 38A:
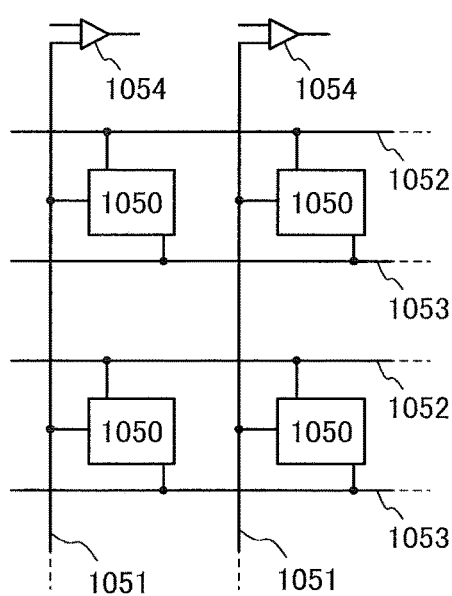
FIGS. 38A and 38B show a memory.
Figure 38B:
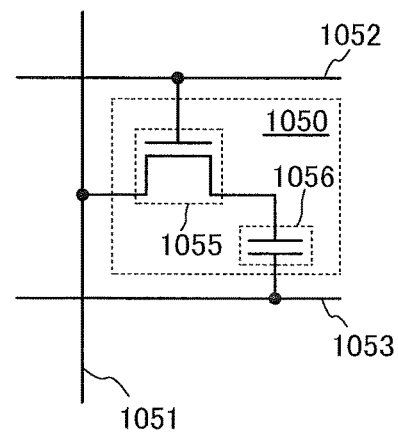

First, the memory will be described with reference to FIGS. 38A and 38B. FIG. 38A is a circuit diagram showing a memory cell array of the memory. FIG. 38B is a circuit diagram of a memory cell.

The memory cell array in FIG. 38A includes a plurality of memory cells 1050, a plurality of bit lines 1051, a plurality of word lines 1052, a plurality of capacitor lines 1053, and a plurality of sense amplifiers 1054.

Note that the bit lines 1051 and the word lines 1052 are provided in a grid pattern, and the memory cell 1050 is provided for each intersection of the bit line 1051 and the word line 1052. The bit lines 1051 are connected to the sense amplifiers 1054, which have a function of reading the potentials of the bit lines 1051 as data.

As shown in FIG. 38B, the memory cell 1050 includes a transistor 1055 and a capacitor 1056. A gate of the transistor 1055 is electrically connected to the word line 1052. A source of the transistor 1055 is electrically connected to the bit line 1051. A drain of the transistor 1055 is electrically connected to one terminal of the capacitor 1056. The other terminal of the capacitor 1056 is electrically connected to the capacitor line 1053.

Figure 39:
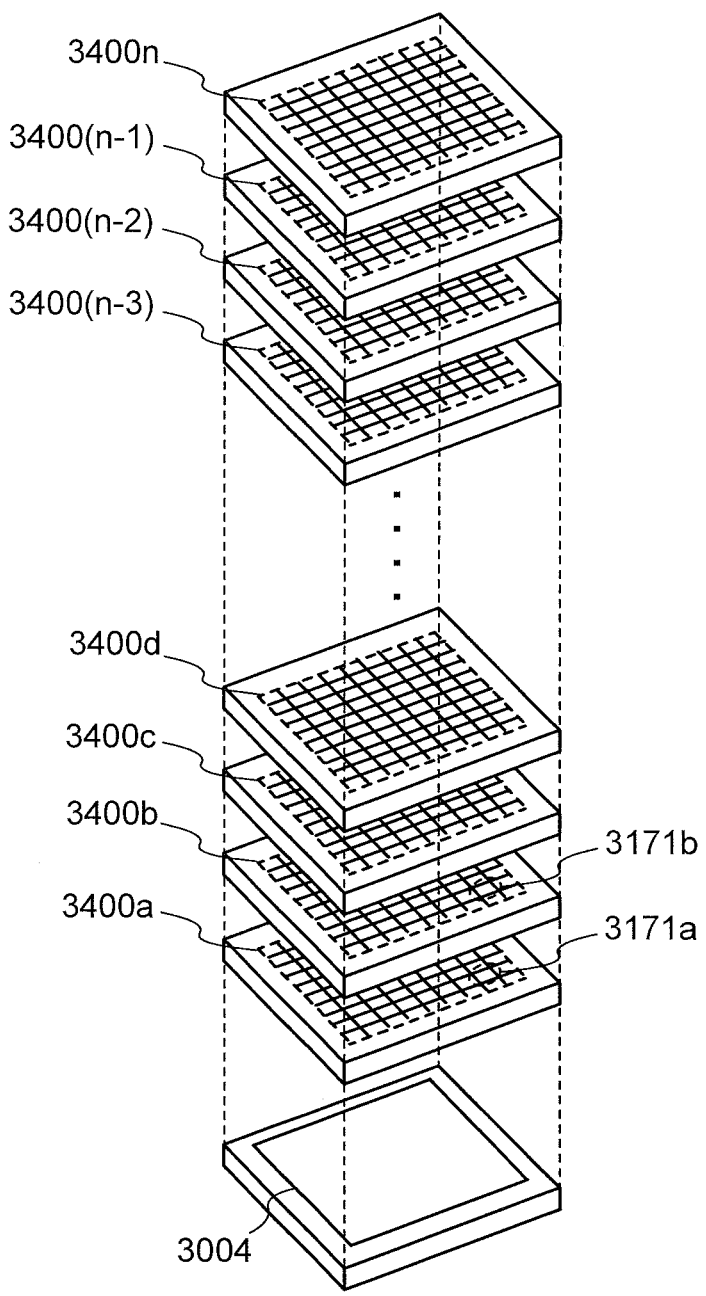
FIG. 39 shows a memory.

FIG. 39 is a perspective view of a memory. The memory illustrated in FIG. 39 includes a plurality of layers of memory cell arrays (memory cell arrays 3400a to 3400n (n is an integer greater than or equal to 2)) each including a plurality of memory cells as memory circuits in the upper portion, and a logic circuit 3004 which is necessary for operating the memory cell arrays 3400a to 3400n, in the lower portion.

A voltage retained in the capacitor 1056 gradually decreases with time due to leakage through the transistor 1055. A voltage originally charged from V0 to V1 is decreased with time to VA that is a limit for reading out data 1. This period is referred to as a retaining period T_1. In the case of a two-level memory cell, refresh operation needs to be performed within the retention period T_1.

For example, in the case where the off-state current of the transistor 1055 is not sufficiently small, the retention period T_1 becomes short because the voltage retained in the capacitor 1056 significantly changes with time. Accordingly, refresh operation needs to be frequently performed. An increase in frequency of refresh operation increases power consumption of the memory.

Since the off-state current of the transistor 1055 is extremely small here, the retention period T_1 can be made extremely long. In other words, the frequency of refresh operation can be reduced; thus, power consumption can be reduced. For example, in the case where a memory cell is formed using the transistor 1055 having an off-state current of $1 \times 10^{-21}$ A to $1 \times 10^{-25}$ A, data can be retained for several days to several decades without supply of electric power.

As described above, according to one embodiment of the present invention, a memory with high degree of integration and low power consumption can be provided.

Next, a nonvolatile oxide semiconductor random access memory (NOSRAM) is described as a memory that is different from the memories shown in FIG. 37 and FIG. 39. NOSRAM is a memory that uses the transistor with low off-state current as a selection transistor of a memory cell (a transistor serving as a switching element) and a transistor including a silicon material or the like as an output transistor of the memory cell.

Figure 40A:
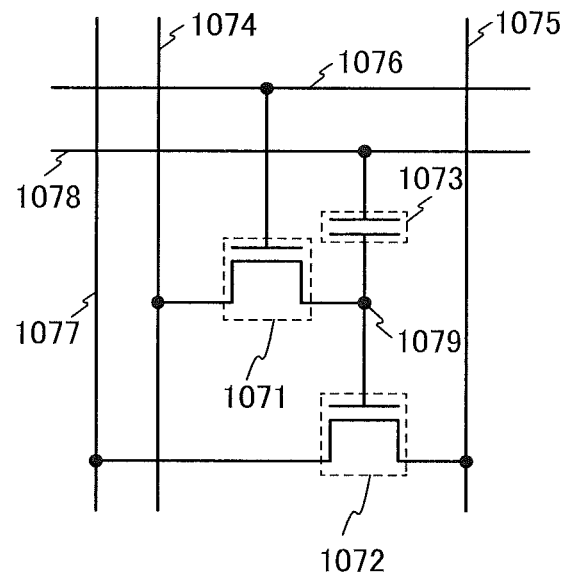
FIGS. 40A and 40B show a semiconductor device.
Figure 40B:
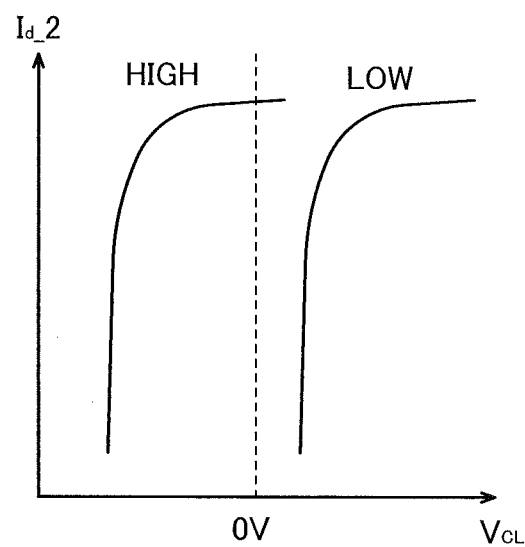

FIG. 40A is a circuit diagram showing a memory cell and wirings included in the memory. FIG. 40B is a graph showing the electrical characteristics of the memory cell in FIG. 40A.

As shown in FIG. 40A, the memory cell includes a transistor 1071, a transistor 1072, and a capacitor 1073. Here, a gate of the transistor 1071 is electrically connected to a word line 1076. A source of the transistor 1071 is electrically connected to a source line 1074. A drain of the transistor 1071 is electrically connected to a gate of the transistor 1072 and one terminal of the capacitor 1073, and this portion is referred to as a node 1079. A source of the transistor 1072 is electrically connected to a source line 1075. A drain of the transistor 1072 is electrically connected to a drain line 1077. The other terminal of the capacitor 1073 is electrically connected to a capacitor line 1078.

The semiconductor device illustrated in FIGS. 40A and 40B utilizes variation in the apparent threshold voltage of the transistor 1072, which depends on the potential of the node 1079. For example, FIG. 40B shows a relation between a voltage $V_{CL}$ of the capacitor line 1078 and a drain current $I_{d\_2}$ flowing through the transistor 1072.

Note that the potential of the node 1079 can be controlled through the transistor 1071. For example, the potential of the source line 1074 is set to a high power supply potential VDD. In this case, when the potential of the word line 1076 is set to be higher than or equal to the sum of the high power supply potential VDD and the threshold voltage Vth of the transistor 1071, the potential of the node 1079 can be HIGH. Further, when the potential of the word line 1076 is set to be lower than or equal to the threshold voltage Vth of the transistor 1071, the potential of the node 1079 can be LOW.

Thus, the transistor 1072 has electrical characteristics shown with either a $V_{CL}$-$I_{d\_2}$ curve denoted as LOW or a $V_{CL}$-$I_{d\_2}$ curve denoted as HIGH. That is, when the potential of the node 1079 is LOW, $I_{d\_2}$ is small at a $V_{CL}$ of 0 V; accordingly, data 0 is stored. Further, when the potential of the node 1079 is HIGH, $I_{d\_2}$ is large at a $V_{CL}$ of 0 V; accordingly, data 1 is stored. In this manner, data can be stored.

By using the transistor with low off-state current as the transistor 1071, data retention time can be lengthened. The transistor 1072 prevents loss of data in data reading and thereby enables repetitive data reading.

A structural example of a semiconductor device used in the control circuit, the memory, or the like, which is described above, is described.

First, examples of the structure of a transistor that can be used in the semiconductor device will be described.

The structure of a transistor is not particularly limited and can be a given structure. As the structure of a transistor, a staggered type or a planar type having a bottom gate structure or the like can be employed. A transistor may have a single-gate structure in which one channel formation region is formed or a multi-gate structure such as a double-gate structure in which two channel formation regions are formed or a triple-gate structure in which three channel formation regions are formed. In addition, a transistor may have a structure in which two gate electrodes are provided above and below a channel formation region with gate insulating films provided therebetween (in this specification, this structure is referred to as a dual-gate structure).

Figure 41A:
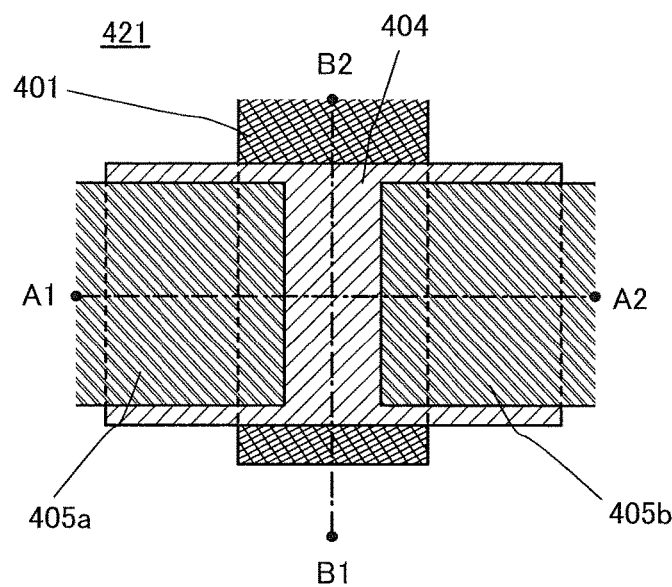
FIGS. 41A to 41C illustrate a structural example of a transistor.
Figure 41C:
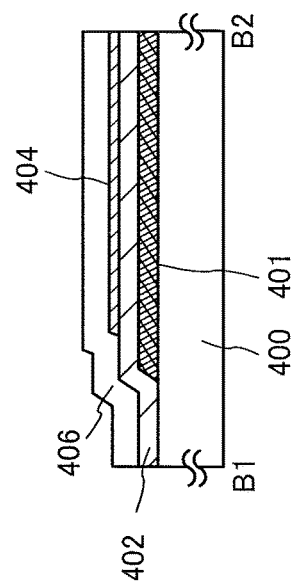
Figure 41B:
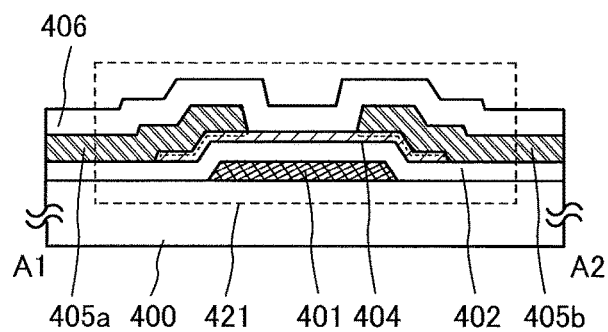

FIGS. 41A to 41C illustrate a structural example of a transistor 421 having a bottom-gate top-contact structure, which is one kind of bottom-gate transistor. FIG. 41A is a plan view of the transistor 421. FIG. 41B is a cross-sectional view taken along the long dashed short dashed line A1-A2 in FIG. 41A. FIG. 41C is a cross-sectional view taken along the long dashed short dashed line B1-B2 in FIG. 41A.

The transistor 421 includes a gate electrode 401 provided over a substrate 400 having an insulating surface, a gate insulating film 402 provided over the gate electrode 401, an oxide semiconductor film 404 overlapping with the gate electrode 401 with the gate insulating film 402 provided therebetween, and a source electrode 405a and a drain electrode 405b provided in contact with the oxide semiconductor film 404. In addition, an insulating film 406 is provided so as to cover the source electrode 405a and the drain electrode 405b and be in contact with the oxide semiconductor film 404. Note that the substrate 400 may be a substrate where another element is formed. The gate electrode 401 can be formed using a conductive material which extracts hydrogen from the oxide semiconductor film 404. For example, titanium, titanium nitride, an alloy of cobalt and titanium, an alloy of manganese and titanium, an alloy of iron and titanium, or the like is preferably used.

Note that in the oxide semiconductor film 404, a region in contact with the source electrode 405a and a region in contact with the drain electrode 405b may include an n-type region 403. When the source electrode 405a and the drain electrode 405b are formed using a conductive material which is easily bonded to oxygen, the n-type region 403 is easily formed. For example, tungsten, titanium, aluminum, copper, molybdenum, chromium, or tantalum, an alloy thereof, or the like is preferably used. Further, after the source electrode 405a and the drain electrode 405b are formed and the oxide semiconductor film 404 is exposed, it is preferable to perform treatment for reducing the concentration of hydrogen in the oxide semiconductor film 404, in particular, the concentration of hydrogen in the channel formation region. As such treatment, plasma treatment under an atmosphere containing oxygen, such as film formation by a sputtering method under an atmosphere containing oxygen, can be given.

Figure 42A:
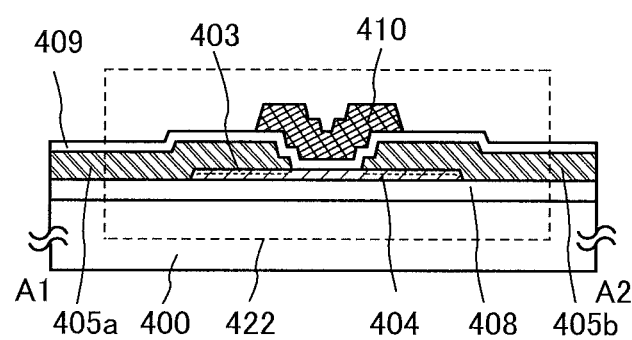
FIGS. 42A and 42B each illustrate a structural example of a transistor.

FIG. 42A illustrates a transistor 422 having a top-gate structure.

The transistor 422 includes an insulating film 408 provided over a substrate 400 having an insulating surface, an oxide semiconductor film 404 provided over the insulating film 408, a source electrode 405a and a drain electrode 405b provided in contact with the oxide semiconductor film 404, a gate insulating film 409 provided over the oxide semiconductor film 404, the source electrode 405a, and the drain electrode 405b, and a gate electrode 410 overlapping with the oxide semiconductor film 404 with the gate insulating film 409 provided therebetween. The gate electrode 410 can be formed using a conductive material which extracts hydrogen from the oxide semiconductor film 404. For example, titanium, titanium nitride, an alloy of cobalt and titanium, an alloy of manganese and titanium, an alloy of iron and titanium, or the like is preferably used.

Note that in the oxide semiconductor film 404, a region in contact with the source electrode 405a and a region in contact with the drain electrode 405b may include an n-type region 403. When the source electrode 405a and the drain electrode 405b are formed using a conductive material which is easily bonded to oxygen, the n-type region 403 is easily formed. For example, tungsten, titanium, aluminum, copper, molybdenum, chromium, or tantalum, an alloy thereof, or the like is preferably used. Further, after the source electrode 405a and the drain electrode 405b are formed and the oxide semiconductor film 404 is exposed, it is preferable to perform treatment for reducing the concentration of hydrogen in the oxide semiconductor film 404, in particular, the concentration of hydrogen in the channel formation region. As such treatment, plasma treatment under an atmosphere containing oxygen, such as film formation by a sputtering method under an atmosphere containing oxygen, can be given.

Figure 42B:
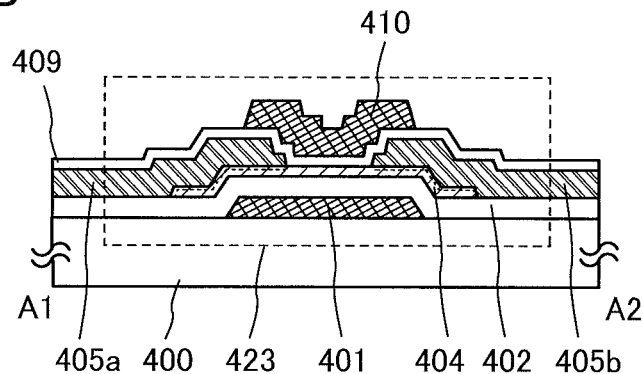

FIG. 42B illustrates a transistor 423 having a dual-gate structure, which includes two gate electrodes above and below a channel formation region with gate insulating films provided therebetween.

The transistor 423 includes a gate electrode 401 provided over a substrate 400 having an insulating surface, a gate insulating film 402 provided over the gate electrode 401, an oxide semiconductor film 404 overlapping with the gate electrode 401 with the gate insulating film 402 provided therebetween, a source electrode 405a and a drain electrode 405b provided in contact with the oxide semiconductor film 404, a gate insulating film 409 covering the source electrode 405a and the drain electrode 405b and in contact with the oxide semiconductor film 404, and a gate electrode 410 overlapping with the oxide semiconductor film 404 with the gate insulating film 409 provided therebetween.

Note that in the oxide semiconductor film 404, a region in contact with the source electrode 405a and a region in contact with the drain electrode 405b may include an n-type region 403. When the source electrode 405a and the drain electrode 405b are formed using a conductive material which is easily bonded to oxygen, the n-type region 403 is easily formed. For example, tungsten, titanium, aluminum, copper, molybdenum, chromium, or tantalum, an alloy thereof, or the like is preferably used. Note that this embodiment can be combined with any of the other embodiments in this specification as appropriate.

Embodiment 6

A structural example of a semiconductor device in the case of using the transistor in Embodiment 5 will be described. Needless to say, any of the transistors in Embodiments 1 to 3 can be used as appropriate instead of the transistor in Embodiment 5.

Figure 43:
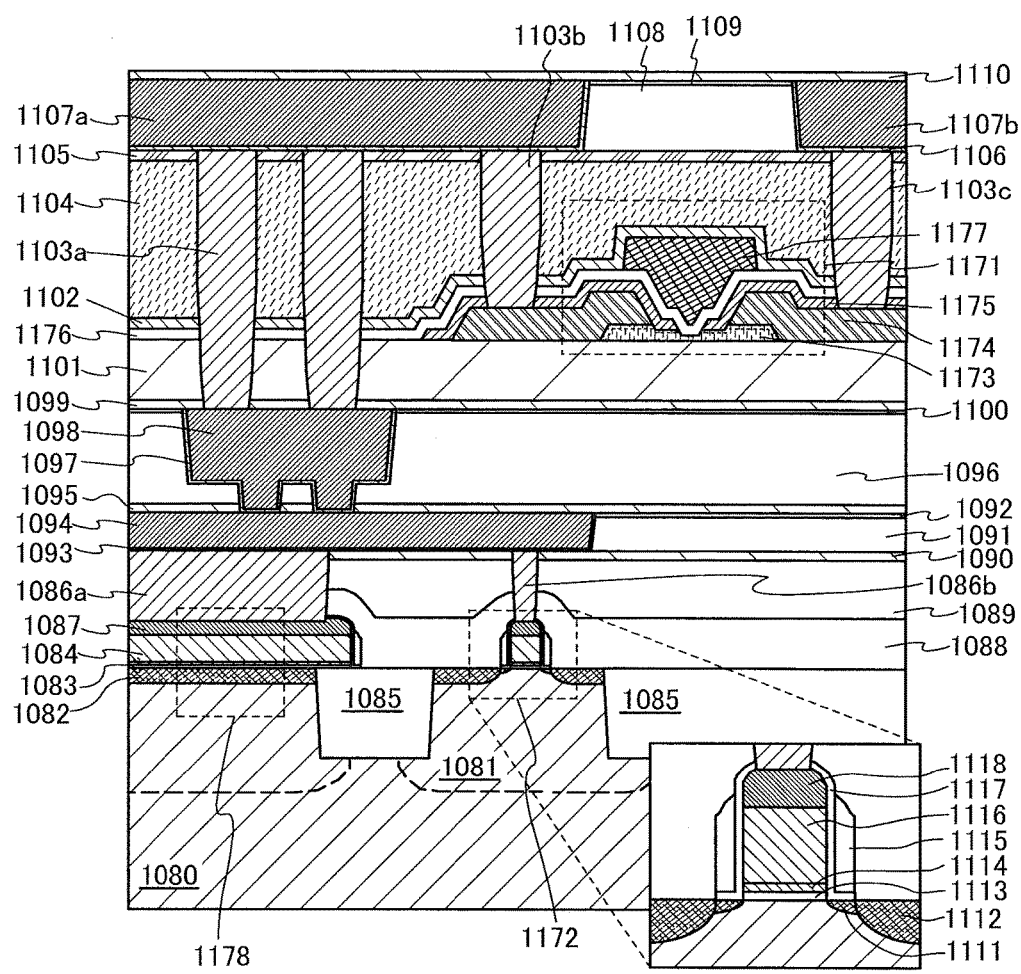
FIG. 43 illustrates a structural example of a semiconductor device.

FIG. 43 illustrates an example of a cross-sectional structure of a semiconductor device. The semiconductor device illustrated in FIG. 43 includes the transistor 1172, a transistor 1171 provided over the transistor 1172 with an insulating film provided therebetween, and a capacitor 1178.

In this embodiment, a semiconductor device is described which has a structure where a semiconductor material is used for the transistor 1172 in a lower portion, and the oxide semiconductor film is used for the transistor 1171 in an upper portion.

FIG. 43 illustrates one example of a cross-sectional structure of the semiconductor device in which a transistor including a semiconductor material is provided in a lower portion and a transistor including the oxide semiconductor film in Embodiment 5 is provided in an upper portion. Here, different materials are used as the semiconductor material and the oxide semiconductor film. As the semiconductor material different from an oxide semiconductor film, for example, silicon, germanium, silicon germanium, silicon carbide, gallium arsenide, or the like can be used, and a single crystal semiconductor is preferably used. A transistor manufactured using a single crystal semiconductor can operate at high speed easily. On the other hand, the transistor including the oxide semiconductor film can be used in a circuit utilizing a characteristic that is significantly low off-state current of about several yoctoamperes per micrometer (yA/μm) or several zeptoamperes per micrometer (zA/μm). Accordingly, the semiconductor device illustrated in FIG. 43 can be used to form a logic circuit with low power consumption, for example.

Although not illustrated, a semiconductor-on-insulator (SOI) substrate may be used instead of the semiconductor substrate.

The SOI substrate (also referred to as SOI wafer) includes a semiconductor substrate, a buried oxide film (also referred to as a buried oxide (BOX) layer) over the semiconductor substrate, and a semiconductor film (hereinafter referred to as an SOI layer) over the buried oxide film. As the SOI substrate, any of the following substrates can be used as appropriate: a SIMOX (Separation by IMplanted OXygen (a registered trademark of SUMCO TECHXIV Corporation)) substrate in which a BOX layer and an SOI layer are formed by implanting oxygen ions to a predetermined depth of a silicon substrate and performing high-temperature treatment; an ELTRAN (Epitaxial Layer TRANsfer (a registered trademark of Canon Inc.)) substrate formed using a porous silicon layer by anodization; a UNIBOND (a registered trademark of Soitec (S.O.I.TEC Silicon On Insulator Technologies S.A.)) substrate in which an SOI layer is formed by implanting hydrogen ions into a substrate (device wafer) provided with a thermal oxide film to form a weakened layer, bonding the substrate to another silicon substrate (handle wafer), and then separating the handle wafer from the weakened layer through heat treatment; and the like.

Note that the SOI substrate generally refers to a substrate in which an SOI layer made of a silicon thin film is provided over a silicon substrate with a BOX layer provided therebetween, but without limitation to silicon, another single crystal semiconductor material may be used. In addition, the SOI substrate includes, in its category, a substrate having a structure in which a semiconductor layer is provided over an insulating substrate such as a glass substrate with an insulating layer provided therebetween.

In the case of using the SOI substrate instead of the semiconductor substrate, the SOI layer is used for a channel region of the transistor in the lower portion. Compared with a transistor formed using a bulk silicon substrate, a transistor formed using an SOI substrate has many advantages such as small parasitic capacitance due to the presence of a BOX layer, low probability of soft errors caused by incidence of a rays or the like, no occurrence of latch-up caused by formation of a parasitic transistor, and easy element isolation.

The SOI layer includes a single crystal semiconductor such as single crystal silicon. Therefore, when the SOI layer is used for the transistor in the lower portion, the operation speed of the semiconductor device can be increased.

The transistor 1172 in FIG. 43 corresponds to the transistor 635 in FIG. 36, the transistor Tr1e or Tr2e in FIG. 37, or the transistor 1072 in FIG. 40A, for example. Either an n-channel transistor (NMOSFET) or a p-channel transistor (PMOSFET) can be used as the transistor 1172. In the example illustrated in FIG. 43, the transistor 1172 is electrically isolated from other elements by a shallow trench isolation (STI) region 1085. The use of the STI region 1085 can reduce the generation of a bird's beak in an element isolation region, which is caused in an LOCOS element isolation method, and can reduce the size of the element isolation region. On the other hand, in a semiconductor device which is not required to be structurally miniaturized or downsized, the STI region 1085 is not necessarily formed, and an element isolation means such as LOCOS can be used. Note that a well 1081 is formed within the STI region 1085 in order to control the threshold voltage of the transistor 1172.

The transistor 1172 in FIG. 43 includes a channel formation region provided in a substrate 1080, impurity regions 1112 (also referred to as a source region and a drain region) provided such that the channel formation region is sandwiched therebetween, gate insulating films 1113 and 1114 provided over the channel formation region, and gate electrodes 1116 and 1118 provided over the gate insulating films 1113 and 1114 so as to overlap with the channel formation region. A gate electrode can have, but is not limited to, a stacked structure of the gate electrode 1116 including a first material for increasing processing accuracy and the gate electrode 1118 including a second material for decreasing the resistance as a wiring; the material, the number of stacked layers, the shape, or the like can be adjusted as appropriate for required specifications. Note that a transistor whose source electrode and drain electrode are not illustrated in a drawing may also be referred to as a transistor for the sake of convenience.

Further, although not illustrated, contact plugs are connected to the impurity regions 1112 provided in the substrate 1080. Here, the contact plugs also function as a source electrode and a drain electrode of the transistor 1172 or the like. In addition, impurity regions 1111 which are different from the impurity regions 1112 are provided between the impurity regions 1112 and the channel formation region. The impurity regions 1111 function as LDD regions or extension regions for controlling the distribution of an electric field in the vicinity of the channel formation region, depending on the concentration of an impurity introduced thereto. A sidewall insulating film 1115 is provided at the side of the gate electrodes 1116 and 1118 with an insulating film 1117 provided therebetween. By using the insulating film 1117 and the sidewall insulating film 1115, the LDD regions or extension regions can be formed.

The transistor 1172 is covered with an interlayer insulating film 1088. The interlayer insulating film 1088 can function as a protective film and can prevent impurities from entering the channel formation region from the outside. In addition, when the interlayer insulating film 1088 is formed using a material such as silicon nitride by a CVD method, in the case where single crystal silicon is used for the channel formation region, hydrogenation can be performed by heat treatment. When an insulating film having tensile stress or compressive stress is used as the interlayer insulating film 1088, distortion can be caused in the semiconductor material in the channel formation region. By subjecting a silicon material in the channel formation region to tensile stress in the case of an n-channel transistor or subjecting a silicon material in the channel formation region to compressive stress in the case of a p-channel transistor, the mobility of the transistor can be improved.

Note that the transistor 1172 illustrated in FIG. 43 may have a fin-type structure (also referred to as a tri-gate structure or an Ω-gate structure). The fin-type structure refers to a structure in which part of a semiconductor substrate is processed into a plate-like projection and a gate electrode is provided so as to cross the longitudinal direction of the projection. The gate electrode covers the upper surface and the side surface of the projection with a gate insulating film provided therebetween. When the transistor 1172 has the fin-type structure, the channel width can be decreased so that the degree of integration of transistors can be increased. In addition, the transistor can allow more current to flow and can have higher control efficiency; thus, the off-state current and threshold voltage of the transistor can be lowered.

The capacitor 1178 is formed by a stacked layer of an impurity region 1082 which is provided in the substrate 1080, electrodes 1084 and 1087, and an insulating film 1083 which is provided therebetween and serves as a dielectric film. Here, the insulating film 1083 is formed using the same materials as the gate insulating films 1113 and 1114 of the transistor 1172, and the electrodes 1084 and 1087 are formed using the same materials as the gate electrodes 1116 and 1118 of the transistor 1172. The impurity region 1082 can be formed at the same timing as the impurity regions 1112 of the transistor 1172.

The transistor 1171 in FIG. 43 corresponds to the transistor 631 in FIGS. 36A and 36B, the transistors Tr3e, Tr4e in FIG. 37, and the transistor 1071 in FIG. 40A. The transistor 1171 includes an oxide semiconductor film 1173 provided over a base insulating film 1101, a pair of conductive layers 1174 in contact with the oxide semiconductor film 1173, a conductive layer 1175 in contact with top surfaces and side surfaces of the conductive layers 1174, and a conductive layer 1177 overlapping with the oxide semiconductor film 1173 with the insulating film 1176 interposed therebetween.

The transistor 1171 is electrically connected to a transistor including a semiconductor material such as the transistor 1172 in a lower layer, depending on a necessary circuit configuration. FIG. 43 illustrates, as one example, a structure in which a source or a drain of the transistor 1171 is electrically connected to the gate of the transistor 1172.

The conductive layers 1174 may function as source and drain electrodes of the transistor 1171. For the pair of conductive layers 1174, a conductive material which is easily bonded to oxygen can be used. For example, Al, Cr, Cu, Ta, Ti, Mo, or W can be used. In particular, W with a high melting point is preferably used, which allows subsequent process temperatures to be relatively high. Note that the conductive material which is easily bonded to oxygen includes, in its category, a material to which oxygen is easily diffused or transferred.

When the conductive material which is easily bonded to oxygen is in contact with the oxide layer, a phenomenon occurs in which oxygen included in the oxide layer is diffused or transferred into the conductive material which is easily bonded to oxygen. Since the formation process of the transistor involves some heat treatment steps, the above phenomenon causes generation of oxygen vacancies in regions of the oxide layer, which are in contact with the source electrode layer and the drain electrode layer, and the regions are changed into n-type regions. Thus, the n-type regions can serve as a source and a drain of the transistor.

Thus, as described in this embodiment, the source electrode layer and the drain electrode layer have stacked-layer structures, and the pair of conductive layers 1175, which determine the channel length, are formed using a conductive material which is not easily bonded to oxygen. As the conductive material, for example, a conductive nitride such as tantalum nitride or titanium nitride, or ruthenium is preferably used. Note that the conductive material which is not easily bonded to oxygen includes, in its category, a material to which oxygen is not easily diffused or transferred.

By the use of the above conductive material which is not easily bonded to oxygen for the pair of conductive layers 1175, generation of oxygen vacancies in the channel formation region of the oxide semiconductor film 1173 can be suppressed, so that change of the channel to an n-type region can be suppressed. In this manner, even a transistor with a short channel length can have favorable electric characteristics.

In the case where the source electrode layer and the drain electrode layer are formed using only the above conductive material which is not easily bonded to oxygen, the contact resistance with the oxide semiconductor film 1173 becomes too high; thus, it is preferable that the pair of conductive layers 1174 be formed over the oxide semiconductor film 1173 and the conductive layer 1175 be formed so as to cover the conductive layers 1174.

The insulating film 1176 may function as a gate insulating film. The insulating film 1176 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 1176 may be a stacked layer including any of the above materials.

The conductive layer 1177 may function as a gate electrode. For the conductive layer 1177, a conductive film of Al, Ti, Cr, Co, Ni, Cu, Y, Zr, Mo, Ru, Ag, Ta, W, or the like can be used. The conductive layer 1177 may be a stacked layer including any of the above materials.

For an insulating film 1102, a material in which oxygen is hardly diffused or transferred may be used. Further, a material containing little hydrogen when formed into a film is preferably used for the insulating film 1102. The hydrogen content of the insulating film 1102 is preferably lower than $5\times10^{19}/cm^3$, further preferably lower than $5\times10^{18}/cm^3$. When the hydrogen content of the insulating film 1102 has the above value, an off-state current of the transistor can be low. For example, a silicon nitride film or a silicon nitride oxide film is preferably used as the insulating film 1102.

The transistor 1171 has a short channel length of more than or equal to 5 nm and less than 60 nm, preferably more than or equal to 10 nm and less than or equal to 40 nm. Since the oxide semiconductor film is used for the channel formation region, the transistor 1171 exhibits no or quite little short-channel effect and shows favorable electric characteristics as a switching element.

Since the off-state current of the transistor 1171 is low, the use of the transistor enables stored data to be held for a long time. In other words, it is possible to obtain a memory device which does not require refresh operation or has an extremely low frequency of the refresh operation, which leads to a sufficient reduction in power consumption.

One of the source and the drain of the transistor 1171 is connected to a wiring 1107a which is formed above the transistor 1171, through a contact plug 1103b which penetrates the insulating film 1102, an interlayer insulating film 1104, and an interlayer insulating film 1105 provided over the transistor 1171.

Here, contact plugs (also referred to as connecting conductive portions, embedded plugs, or simply plugs) 1086a, 1086b, 1103a, 1103b, 1103c, and the like each have a columnar or wall shape. The contact plugs are each formed by filling an opening (via) provided in an interlayer insulating film with a conductive material. As the conductive material, a conductive material with high embeddability such as tungsten or polysilicon can be used. Although not illustrated, a side surface and a bottom surface of the material can be covered with a barrier film (a diffusion prevention film) of a titanium film, a titanium nitride film, a stacked-layer film of these films, or the like. In this case, the barrier film is regarded as part of the contact plug.

For example, the bottom surfaces of the contact plugs 1103b and 1103c are connected to the upper surface of the conductive layers 1174. However, the connection of the contact plugs 1103b and 1103c to the conductive layers 1174 is not limited to this connection structure. For example, the contact plugs 1103b and 1103c may penetrate the conductive layers 1174 and the bottom surfaces of the contact plugs 1103b and 1103c may be in contact with the upper surface of the base insulating film 1101. In this case, the connection of the contact plugs 1103b and 1103c to the conductive layers 1174 is made at the side surfaces of the contact plugs 1103b and 1103c. This allows the conductive layers 1174 and the contact plugs 1103b and 1103c to have better electrical contacts. Furthermore, the contact plugs 1103b and 1103c may penetrate into the base insulating film 1101.

Note that one contact plug is used for electrical connection between the conductive layer 1174 and the wiring 1107a or a wiring 1107b in FIG. 43. However, in order to decrease the contact resistance between the contact plug and the conductive layer 1174 or the wiring, a plurality of contact plugs arranged side by side may be used or a contact plug with a large diameter may be used.

Since the contact plugs are formed using a mask, the contact plugs can be formed in any desired position.

A wiring 1094, a wiring 1098, and the wirings 1107a and 1107b are embedded in an interlayer insulating film 1091, an interlayer insulating film 1096, and an interlayer insulating film 1108, respectively. For the wirings 1094, 1098, 1107a, and 1107b, it is preferable to use a low-resistance conductive material such as copper or aluminum. By using a low-resistance conductive material, RC delay of signals transmitted through the wirings 1094, 1098, 1107a, and 1107b can be reduced. In the case of using copper for the wirings 1094, 1098, 1107a, and 1107b, barrier films 1093, 1097, and 1106 are formed in order to prevent copper from diffusing into the channel formation regions. The barrier films can each be formed using a film of tantalum nitride, a stacked-layer film of tantalum nitride and tantalum, a film of titanium nitride, a stacked-layer film of titanium nitride and titanium, or the like for example, but are not limited to the films of these materials as long as their function of preventing diffusion of the wiring material and their adhesion to the wiring material, a base film, or the like are secured. The barrier films 1093, 1097, and 1106 may be formed as layers that are separate from the wirings 1094, 1098, 1107a, and 1107b, or may be formed in such a manner that a barrier film material contained in a wiring material is separated out by heat treatment to the inner walls of the openings provided in the interlayer insulating films 1091, 1096, and 1108.

For the interlayer insulating films 1091, 1096, and 1108, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. In addition, since CMP treatment is performed after the wirings are embedded in the interlayer insulating films, the interlayer insulating films need to have high mechanical strength. As long as their mechanical strength can be secured, the interlayer insulating films can be made porous to have a lower dielectric constant. The interlayer insulating films 1091, 1096, and 1108 are formed by a sputtering method, a CVD method, a coating method including a spin coating method (also referred to as spin on glass (SOG)), or the like.

Interlayer insulating films 1092, 1100, and 1109 may be provided over the interlayer insulating films 1091, 1096, and 1108. The interlayer insulating films 1092, 1100, and 1109 function as etching stoppers when planarization treatment by CMP or the like is performed after the wiring material is embedded in the interlayer insulating films 1091, 1096, and 1108.

Barrier films 1095, 1099, and 1110 are provided over the wirings 1094, 1098, 1107a, and 1107b in order to prevent diffusion of the wiring material such as copper. The barrier films 1095, 1099, and 1110 may be formed not only over the wirings 1094, 1098, 1107a, and 1107b but also over the interlayer insulating films 1091, 1096, and 1108. The barrier films 1095, 1099, and 1110 can be formed using an insulating material such as silicon nitride, SiC, or SiBON. Note that in the case where the barrier films 1095, 1099, and 1110 have a large thickness, which causes an increase in capacitance between wirings, it is preferable to select a material having barrier properties and a low dielectric constant.

The wiring 1098 includes an upper wiring portion and a lower via hole portion. The lower via hole portion is connected to the wiring 1094 in a lower layer. The wiring 1098 having this structure can be formed by a so-called dual damascene method or the like. Wirings in upper and lower layers may be connected using a contact plug instead of the dual damascene method.

The wiring 1094 is provided over the transistor 1172 and the capacitor 1178. The electrodes 1084 and 1087 serving as an upper electrode of the capacitor are electrically connected to the wiring 1094 through the contact plug 1086a which penetrates the interlayer insulating film 1088 and interlayer insulating films 1089 and 1090. The gate electrode of the transistor 1172 is electrically connected to the wiring 1094 through the contact plug 1086b which penetrates the interlayer insulating films 1088, 1089, and 1090. On the other hand, the one of the source and the drain of the transistor 1171 formed using the oxide semiconductor film for the channel is electrically connected to the wiring 1107a in an upper layer through the contact plug 1103b which penetrates the insulating film and the interlayer insulating films, and the wiring 1107a is electrically connected to the wiring 1098 through the contact plug 1103a which penetrates the insulating film, the interlayer insulating films, and the base insulating film 1101. The wiring 1098 is electrically connected to the wiring 1094 in a lower layer. Accordingly, the one of the source and the drain of the transistor 1171 is electrically connected to the upper electrode of the capacitor 1178 and the gate electrode of the transistor 1172.

Note that the electrical connection between wirings using a contact plug may be established using a plurality of contact plugs, like the connection between the wiring 1098 and the wiring 1107a illustrated in FIG. 43, or may be established using a wall-shaped contact plug, like the connection between the electrodes 1084 and 1087 and the wiring 1094.

The above electrical connections are mere examples, and elements may be connected using a wiring different from the above wirings. For example, in FIG. 43, two wiring layers are provided between the transistor 1171, the transistor 1172, and the capacitor 1178, but one wiring layer or three or more wiring layers may be provided. Alternatively, without wirings, elements may be directly and electrically connected to each other through a plurality of plugs connected vertically. Furthermore, in FIG. 43, the wirings 1094 and 1098 are formed by a damascene method (the wiring 1098 is formed by a so-called dual damascene method), but may be formed by another method.

Note that the capacitor 1178 may be omitted in the case where a capacitor is not needed. Furthermore, the capacitor 1178 may be separately provided above the transistor 1172 or above the transistor 1171.

Although not illustrated, a metal oxide film of aluminum oxide, aluminum oxynitride, gallium oxide, gallium oxynitride, yttrium oxide, yttrium oxynitride, hafnium oxide, hafnium oxynitride, or the like which has a blocking effect against oxygen, hydrogen, water, or the like is preferably provided between the base insulating film 1101 and the barrier film 1099 which functions as an impurity diffusion prevention film for the wiring 1098.

In FIG. 43, the transistor 1171 is provided to overlap with at least part of the transistor 1172. The source region or the drain region of the transistor 1171 is preferably provided to overlap with part of the oxide semiconductor film. The transistor 1171 may be provided to overlap with the capacitor 1178. When such a planar layout is employed, the area occupied by the semiconductor device can be reduced; thus, the degree of integration can be increased.

Note that although FIG. 43 shows an example where the transistor 1171 and the capacitor 1178 are provided in different layers, one embodiment of the present invention is not limited to this structure. For example, the transistor 1171 and the capacitor 1178 may be provided in the same plane, which enables a data holding portion having the same structure to be stacked over a data holding portion. Accordingly, the degree of integration of the semiconductor device can be improved.

As described above, the transistor 1172 provided in a lower portion of the semiconductor device by using a semiconductor material is electrically connected to the transistor 1171 provided in an upper portion by using the oxide semiconductor film in one embodiment of the present invention, through a plurality of contact plugs and a plurality of wirings. With the above-described structure in which the transistor including a semiconductor material and being capable of operating at high speed is combined with the transistor including the oxide semiconductor film in one embodiment of the present invention and having significantly low off-state current, a semiconductor device including a logic circuit capable of operating at high speed with low power consumption can be manufactured.

In addition, since data can be held for a long time and data writing does not require high voltage as compared to the case of a flash memory, a semiconductor device including a memory circuit capable of operating at high speed with low power consumption can be manufactured.

Such a semiconductor device is not limited to the above structure and can be changed as desired unless it deviates from the spirit of the present invention. For example, in the above description, two wiring layers are provided between the transistor including a semiconductor material and the transistor including the oxide semiconductor film in one embodiment of the present invention, but one wiring layer or three or more wiring layers may be provided, or without wirings, the two transistors may be directly connected through only a contact plug. In this case, a through-silicon via (TSV) technique can also be used, for example. In addition, in the above description, a material such as copper is embedded in an interlayer insulating film as a wiring, but a wiring having a three-layer structure of a barrier film, a wiring material layer, and a barrier film (the films are stacked in this order), for example, may be obtained by patterning through a photolithography process.

In the case where a copper wiring is formed in a tier between the transistor 1172 including a semiconductor material and the transistor 1171 including the oxide semiconductor film in one embodiment of the present invention, it is particularly necessary to take into consideration the influence of heat treatment performed in the process for manufacturing the transistor 1171 including the oxide semiconductor film in one embodiment of the present invention. In other words, it is necessary to take care that the temperature of heat treatment performed in the process for manufacturing the transistor 1171 including the oxide semiconductor film in one embodiment of the present invention is appropriate to the properties of the wiring material. This is because, in the case where high-temperature heat treatment is performed on a component of the transistor 1171 for example, thermal stress is caused in the copper wiring, leading to a problem such as stress migration.

When a memory having the structure illustrated in FIG. 43 is manufactured and any of the transistors including the oxide semiconductor film described in Embodiment 5 is used as the transistor 1171, charge accumulated in the node 1079 can be prevented from leaking through the transistor 1171 because the off-state current of the transistor is extremely small. Therefore, data can be held for a long period. Further, a voltage necessary for writing data does not need to be high as compared to the case of a flash memory; thus, power consumption can be made lower and operation speed can be made higher.

As described above, according to one embodiment of the present invention, a memory with high degree of integration and low power consumption can be provided.

This embodiment can be combined with any of the other embodiments in this specification as appropriate.

Embodiment 7

As an example of an electrical device, a portable information terminal will be described with reference to FIGS. 44A to 44C.

Figure 44A:
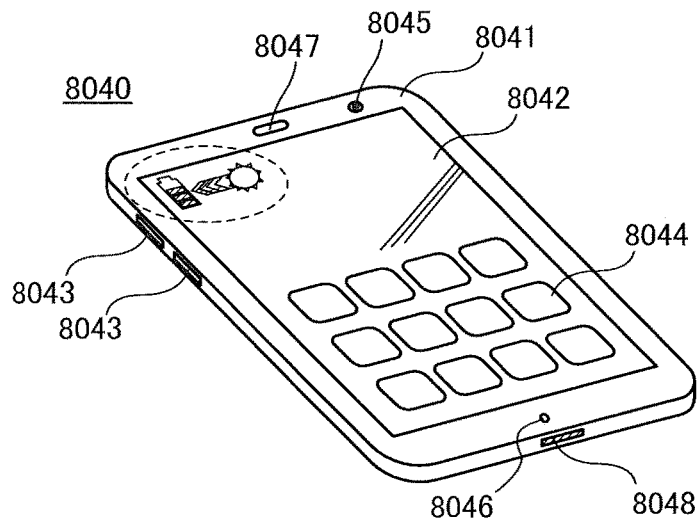
FIGS. 44A to 44C illustrate an electrical appliance.

FIG. 44A is a perspective view illustrating a front surface and a side surface of a portable information terminal 8040. The portable information terminal 8040 is capable of executing a variety of applications such as mobile phone calls, e-mailing, text viewing and editing, music reproduction, Internet communication, and a computer game. In the portable information terminal 8040, a housing 8041 includes a display portion 8042, a camera 8045, a microphone 8046, and a speaker 8047 on its front surface, operation buttons 8043 on its left side, and a connection terminal 8048 on its bottom surface.

A display module or a display panel is used for the display portion 8042. Examples of the display module or the display panel are a light-emitting device in which each pixel includes a light-emitting element typified by an organic light-emitting element (OLED); a liquid crystal display device; an electronic paper performing a display in an electrophoretic mode, an electronic liquid powder (registered trademark) mode, or the like; a digital micromirror device (DMD); a plasma display panel (PDP); a field emission display (FED); a plasma display panel (PDP); a surface conduction electron-emitter display (SED); a light-emitting diode (LED) display; a carbon nanotube display; a nanocrystal display; and a quantum dot display. In the case of using a switching element in a pixel of the display portion 8042, any of the transistors in Embodiments 1 to 3 and Embodiment 5 can be used as the switching element. The transistors in Embodiments 1 to 3 and Embodiment 5 each includes an oxide semiconductor film, and thus a display portion with a high aperture ratio can be obtained. Further, the transistors each including an oxide semiconductor film have low off-state current, which contributes to reduction in power consumption of a portable information terminal.

The portable information terminal 8040 illustrated in FIG. 44A is an example in which the one display portion 8042 is provided in the housing 8041; however, one embodiment of the present invention is not limited to this example. The display portion 8042 may be provided on a rear surface of the portable information terminal 8040. Further, the portable information terminal 8040 may be a foldable portable information terminal in which two or more display portions are provided.

A touch panel with which data can be input by an instruction means such as a finger or a stylus is provided as an input means on the display portion 8042. Thus, icons 8044 displayed on the display portion 8042 can be easily operated by the instruction means. Since the touch panel is provided, a region for a keyboard on the portable information terminal 8040 is not needed and thus the display portion can be provided in a large region. Further, since data can be input with a finger or a stylus, a user-friendly interface can be obtained. Although the touch panel may be of any of various types such as a resistive type, a capacitive type, an infrared ray type, an electromagnetic induction type, and a surface acoustic wave type, the resistive type or the capacitive type is particularly preferable because the display portion 8042 in one embodiment of the present invention can be curved. Furthermore, such a touch panel may be what is called an in-cell touch panel, in which a touch panel is combined with the display module or the display panel.

The touch panel may also function as an image sensor. In this case, for example, an image of a palm print, a fingerprint, or the like is taken with the display portion 8042 touched with the palm or the finger, whereby personal authentication can be performed. Furthermore, with use of backlight or a sensing light source emitting near-infrared light for the display portion 8042, an image of a finger vein, a palm vein, or the like can also be taken.

Further, instead of the touch panel, a keyboard may be provided in the display portion 8042. Furthermore, both the touch panel and the keyboard may be provided.

The operation buttons 8043 can have various functions depending on the intended use. For example, the button

8043 may be used as a home button so that a home screen is displayed on the display portion 8042 by pressing the button 8043. Further, the portable information terminal 8040 may be configured such that main power source thereof is turned off with a press of the button 8043 for a predetermined time. A structure may also be employed in which the portable information terminal 8040 in a sleep mode is brought out of the sleep mode with a press of the button 8043. Besides, the button can be used as a switch for starting a variety of functions depending on the length of time of pressing or by pressing the button and another button at the same time.

Further, the button 8043 may be used as a volume control button or a mute button to have a function of adjusting the volume of the speaker 8047 for outputting sound, for example. The speaker 8047 outputs various kinds of sound, examples of which are sound that is set for predetermined processing, such as startup sound of an operating system (OS), sound from sound files executed in various applications, such as music from music reproduction application software, and an incoming e-mail alert. Although not illustrated, a connector for outputting sound to a device such as headphones, earphones, or a headset may be provided together with or instead of the speaker 8047 for outputting sound.

As described above, the buttons 8043 can have various functions. Although the number of the buttons 8043 is two in the portable information terminal 8040 in FIG. 44A, it is needless to say that the number, arrangement, position, or the like of the buttons 8043 is not limited to this example and can be designed as appropriate.

The microphone 8046 can be used for sound input and recording. Images obtained with use of the camera 8045 can be displayed on the display portion 8042.

In addition to the operation with the touch panel provided on the display portion 8042 or the button 8043, the portable information terminal 8040 can be operated by recognition of user's movement (gesture) (also referred to as gesture input) using the camera 8045, a sensor provided in the portable information terminal 8040, or the like. Alternatively, with use of the microphone 8046, the portable information terminal 8040 can be operated by recognition of user's voice (also referred to as voice input). By introducing a natural user interface (NUI) technique which enables data to be input to an electrical device by natural behavior of a human, the operational performance of the portable information terminal 8040 can be further improved.

The connection terminal 8048 is a terminal for inputting a signal at the time of communication with an external device or inputting electric power at the time of power supply. For example, the connection terminal 8048 can be used for connecting an external memory drive to the portable information terminal 8040. Examples of the external memory drive are storage medium drives such as an external hard disk drive (HDD), a flash memory drive, a digital versatile disc (DVD) drive, a DVD-recordable (DVD-R) drive, a DVD-rewritable (DVD-RW) drive, a compact disc (CD) drive, a compact disc recordable (CD-R) drive, a compact disc rewritable (CD-RW) drive, a magneto-optical (MO) disc drive, a floppy disk drive (FDD), and other nonvolatile solid state drive (SSD) devices. Although the portable information terminal 8040 has the touch panel on the display portion 8042, a keyboard may be provided on the housing 8041 instead of the touch panel or may be externally added.

Although the number of the connection terminal 8048 provided on the bottom surface is one in the portable information terminal 8040 in FIG. 44A, it is needless to say that the number, arrangement, position, or the like of the connection terminals is not limited to this example and can be designed as appropriate.

Figure 44B:
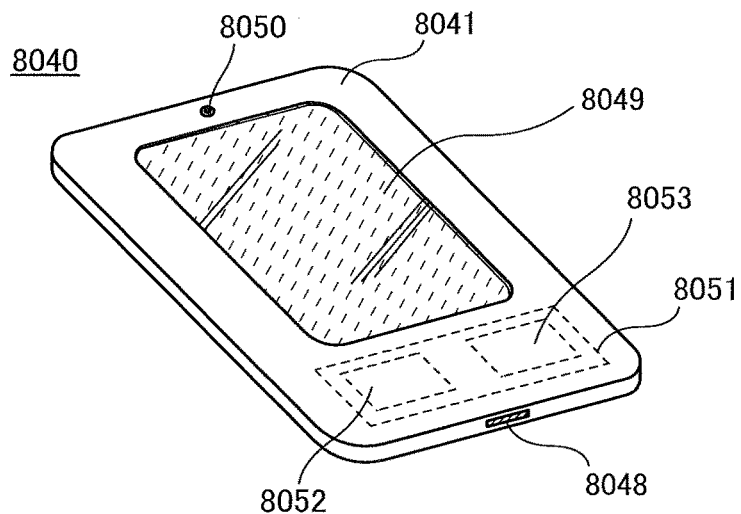

FIG. 44B is a perspective view illustrating the rear surface and the side surface of the portable information terminal 8040. In the portable information terminal 8040, the housing 8041 includes a solar cell 8049 and a camera 8050 on its rear surface; the portable information terminal 8040 further includes a charge and discharge control circuit 8051, a power storage device 8052, a DC-DC converter 8053, and the like. FIG. 44B illustrates an example where the charge and discharge control circuit 8051 includes the power storage device 8052 and the DC-DC converter 8053.

The solar cell 8049 attached on the rear surface of the portable information terminal 8040 can supply power to the display portion, the touch panel, a video signal processor, and the like. Note that the solar cell 8049 can be provided on one or both surfaces of the housing 8041. When the portable information terminal 8040 includes the solar cell 8049, the power storage device 8052 in the portable information terminal 8040 can be charged even in a place where an electric power supply unit is not provided, such as the outdoors.

As the solar cell 8049, it is possible to use any of the following: a silicon-based solar cell including a single layer or a stacked layer of single crystal silicon, polycrystalline silicon, microcrystalline silicon, or amorphous silicon; an InGaAs-based, GaAs-based, CIS-based, $Cu_2ZnSnS_4$-based, or CdTe—CdS-based solar cell; a dye-sensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

Here, an example of a structure and operation of the charge and discharge control circuit 8051 illustrated in FIG. 44B is described with reference to a block diagram in FIG. 44C.

Figure 44C:
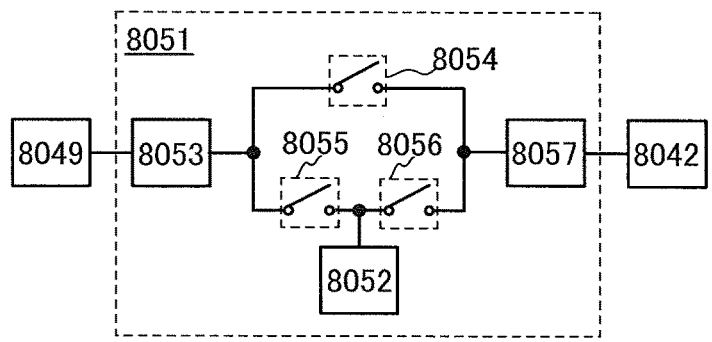

FIG. 44C illustrates the solar cell 8049, the power storage device 8052, the DC-DC converter 8053, a converter 8057, a switch 8054, a switch 8055, a switch 8056, and the display portion 8042. The power storage device 8052, the DC-DC converter 8053, the converter 8057, and the switches 8054 to 8056 correspond to the charge and discharge control circuit 8051 in FIG. 44B.

The voltage of electric power generated by the solar cell 8049 with use of external light is raised or lowered by the DC-DC converter 8053 to be at a level needed for charging the power storage device 8052. When electric power from the solar cell 8049 is used for the operation of the display portion 8042, the switch 8054 is turned on and the voltage of the electric power is raised or lowered by the converter 8057 to a voltage needed for operating the display portion 8042. In addition, when display on the display portion 8042 is not performed, the switch 8054 is turned off and the switch 8055 is turned on so that the power storage device 8052 may be charged.

Although the solar cell 8049 is described as an example of a power generation means, the power generation means is not particularly limited thereto, and the power storage device 8052 may be charged by another power generation means such as a piezoelectric element or a thermoelectric conversion element (Peltier element). The charging method of the power storage device 8052 in the portable information terminal 8040 is not limited thereto, and the connection terminal 8048 may be connected to a power source to perform charge, for example. The power storage device 8052 may be charged by a contactless power transmission module performing charge by transmitting and receiving electric power wirelessly, or any of the above charging methods may be used in combination.

Here, the state of charge (SOC) of the power storage device 8052 is displayed on the upper left corner (in the dashed frame) of the display portion 8042. Thus, the user can check the state of charge of the power storage device 8052 and can accordingly select a power saving mode of the portable information terminal 8040. When the user selects the power saving mode, for example, the button 8043 or the icons 8044 can be operated to switch the components of the portable information terminal 8040, e.g., the display module or the display panel, an arithmetic unit such as CPU, and a memory, to the power saving mode. Specifically, in each of the components, the use frequency of a given function is decreased to stop the use. Further, the portable information terminal 8040 can be configured to be automatically switched to the power saving mode depending on the state of charge. Furthermore, by providing a sensor such as an optical sensor in the portable information terminal 8040, the amount of external light at the time of using the portable information terminal 8040 is sensed to optimize display luminance, which makes it possible to suppress the power consumption of the power storage device 8052.

In addition, when charging with use of the solar cell 8049 or the like is performed, an image or the like showing that the charging is performed with the solar cell may be displayed on the upper left corner (in the dashed frame) of the display portion 8042 as illustrated in FIG. 44A.

It is needless to say that one embodiment of the present invention is not limited to the electrical device illustrated in FIGS. 44A to 44C as long as the semiconductor device of one embodiment of the present invention is included. This embodiment can be combined with any of the other embodiments in this specification as appropriate.

Embodiment 8

A semiconductor device disclosed in this specification can be applied to a variety of electronic devices (including an amusement machine). Examples of electronic devices include the following: display devices such as televisions and monitors, lighting devices, desktop or laptop personal computers, word processors, image reproduction devices which reproduce still images or moving images stored in recording media such as digital versatile discs (DVDs), portable CD players, radio receivers, tape recorders, headphone stereos, stereos, cordless phone handsets, transceivers, cellular phones, car phones, portable game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, air-conditioning systems such as air conditioners, dish washing machines, dish drying machines, clothes dryers, futon dryers, electric refrigerators, electric freezers, electric refrigerator-freezers, freezers for preserving DNA, smoke detectors, radiation counters, medical equipment such as dialyzers. Further examples include industrial equipment such as guide lights, traffic lights, belt conveyors, elevators, escalators, industrial robots, and power storage systems. In addition, moving objects and the like driven by oil engines and electric motors using power from non-aqueous secondary batteries, and the like are also included in the range of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 45A to 45C.

Figure 45A:
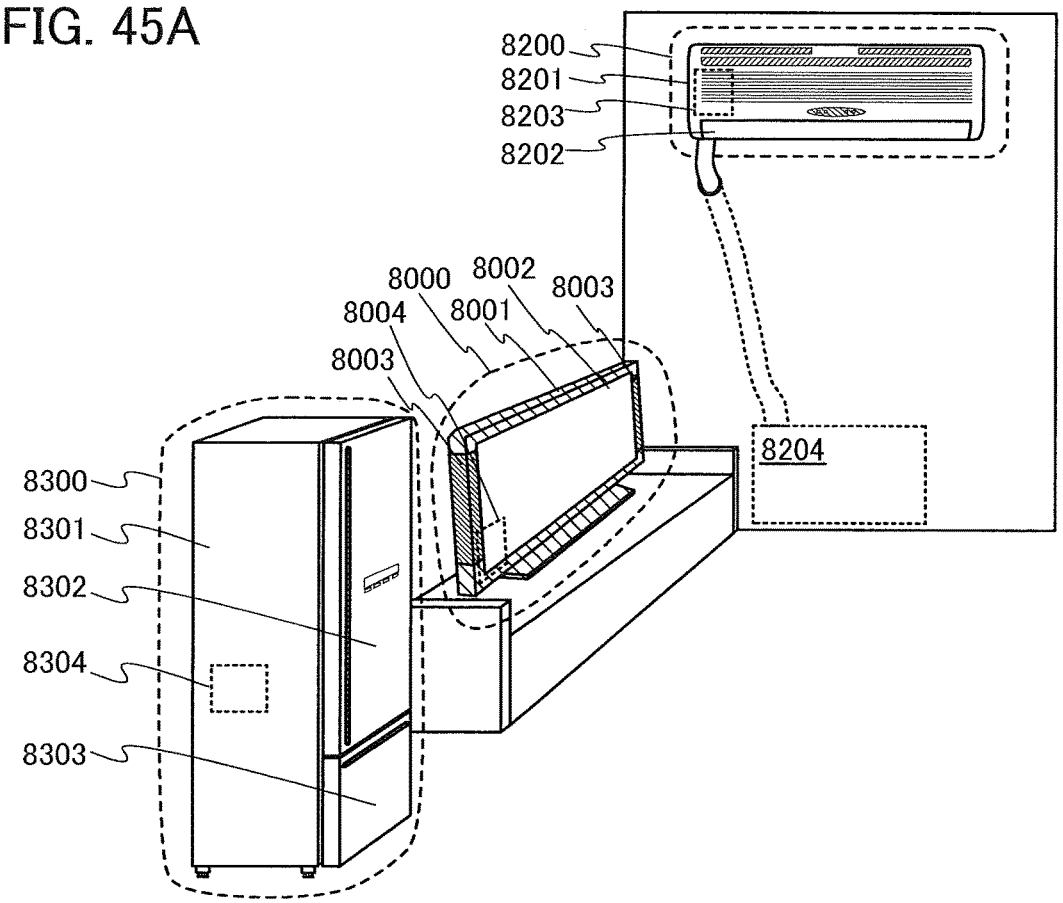
FIGS. 45A to 45C illustrate electrical appliances.
Figure 45B:
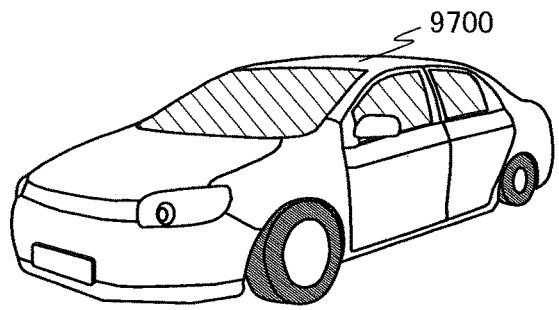
Figure 45C:
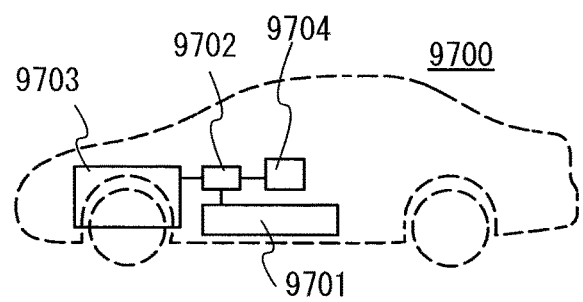

In a television device 8000 in FIG. 45A, a display portion 8002 is incorporated in a housing 8001. The display portion 8002 displays an image and a speaker portion 8003 can output sound.

The display portion 8002 can be manufactured using a display device including any of the transistors described in Embodiments 1 to 3 and Embodiment 5 as a switching element of a pixel, in which case a display portion with a high aperture ratio can be obtained. Further, the transistors each including an oxide semiconductor film have low off-state current, which contributes to reduction in power consumption of a portable information terminal.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. The memory described in Embodiment 5 can be used in the television device 8000.

In FIG. 45A, an air conditioner including an indoor unit 8200 and an outdoor unit 8204 is an example of an electric device using a CPU including the memory of Embodiment 5. Specifically, the indoor unit 8200 includes a housing 8201, a ventilation duct 8202, a CPU 8203, and the like. FIG. 45A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. When the circuit 203 described in Embodiment 4 is used as the CPU in the air conditioner, power saving can be achieved.

In FIG. 45A, an electric refrigerator-freezer 8300 is an example of an electric device which is provided with a CPU including the memory of Embodiment 5. Specifically, the electric refrigerator-freezer 8300 includes a housing 8301, a refrigerator door 8302, a freezer door 8303, a CPU 8304, and the like. The CPU 8304 is provided in the housing 8301 in FIG. 45A. When the CPU including the memory described in Embodiment 5 is used as the CPU 8304 of the electric refrigerator-freezer 8300, power saving can be achieved.

FIG. 45B illustrates an example of an electric vehicle which is an example of an electric device. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. When the circuit 203 described in Embodiment 4 is used in a system for charging and discharging a power storage device of the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in appropriate combinations with any of the other embodiments.

This application is based on Japanese Patent Application serial no. 2012-288947 filed with Japan Patent Office on Dec. 28, 2012, the entire contents of which are hereby incorporated by reference.

What is claimed is:

1. A semiconductor device comprising:
   an oxide semiconductor layer including a channel formation region;
   a source electrode and a drain electrode over and in contact with the oxide semiconductor layer;
   a first insulating layer over the source electrode, the drain electrode and the oxide semiconductor layer;
   a gate electrode over the first insulating layer; and
   a second insulating layer over the gate electrode,
   wherein the gate electrode is able to reduce a concentration of hydrogen in the channel formation region,
   wherein the gate electrode is stacked layers, and one of the stacked layers includes at least one selected from an alloy of titanium and cobalt, an alloy of titanium and manganese, and an alloy of titanium and iron,
   wherein the source electrode and the drain electrode are each stacked layers, and one of the stacked layers is a material layer which is able to reduce the concentration of hydrogen in the channel formation region,
   wherein the concentration of hydrogen in the channel formation region is lower than $5\times10^{17}$ atoms/cm$^3$, and
   wherein part of the oxide semiconductor layer which is in contact with the source electrode or the drain electrode has a higher concentration of hydrogen than the channel formation region.

2. The semiconductor device according to claim 1, wherein the material layer includes at least one selected from an alloy of titanium and cobalt, an alloy of titanium and manganese, and an alloy of titanium and iron.

3. The semiconductor device according to claim 1, wherein the first insulating layer and the second insulating layer each comprise aluminum oxide.

4. The semiconductor device according to claim 1, wherein part of the oxide semiconductor layer which is in contact with the source electrode or the drain electrode includes more oxygen vacancies than the channel formation region.

5. A semiconductor device comprising:
   an oxide semiconductor layer including a channel formation region;
   a first source electrode and a first drain electrode over and in contact with the oxide semiconductor layer;
   a second source electrode and a second drain electrode over and in contact with the first source electrode and the first drain electrode;
   a first insulating layer over the second source electrode, the second drain electrode and the oxide semiconductor layer;
   a gate electrode over the first insulating layer; and
   a second insulating layer over the gate electrode
   wherein the gate electrode comprises a first layer and a second layer over the first layer,
   wherein the first layer of the gate electrode is able to reduce a concentration of hydrogen in the channel formation region,
   wherein the first layer of the gate electrode includes at least one selected from an alloy of titanium and cobalt, an alloy of titanium and manganese, and an alloy of titanium and iron,
   wherein the second source electrode and the second drain electrode each comprise a material layer which is able to reduce the concentration of hydrogen in the channel formation region,
   wherein the second source electrode and the second drain electrode each comprise a portion which is in contact with the oxide semiconductor layer and overlapped with the gate electrode,
   wherein the gate electrode extends across side edges of the oxide semiconductor layer in a channel width direction,
   wherein the concentration of hydrogen in the channel formation region is lower than $5\times10^{17}$ atoms/cm$^3$, and
   wherein part of the oxide semiconductor layer which is in contact with the first source electrode or the first drain electrode has a higher concentration of hydrogen than the channel formation region.

6. The semiconductor device according to claim 5, wherein the material layer includes at least one selected from an alloy of titanium and indium, an alloy of titanium and gallium, an alloy of titanium and zinc, an alloy of titanium and cobalt, an alloy of titanium and manganese, and an alloy of titanium and iron.

7. The semiconductor device according to claim 5,
   wherein the first source electrode and the first drain electrode each include at least one selected from tungsten, titanium, aluminum, copper, molybdenum, chromium, and tantalum, and
   wherein the material layer includes at least one selected from an alloy of titanium and cobalt, an alloy of titanium and manganese, and an alloy of titanium and iron.

8. The semiconductor device according to claim 5, wherein the first insulating layer and the second insulating layer each comprise aluminum oxide.

9. The semiconductor device according to claim 5, wherein a length of the channel formation region is shorter than a distance between the first source electrode and the first drain electrode.

* * * * *